(12) United States Patent
Haban

(10) Patent No.: US 6,779,125 B1
(45) Date of Patent: Aug. 17, 2004

(54) CLOCK GENERATOR CIRCUITRY

(75) Inventor: Scott Haban, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 738 days.

(21) Appl. No.: 09/590,596

(22) Filed: Jun. 9, 2000

(51) Int. Cl.⁷ .................................................. G06F 1/04
(52) U.S. Cl. ........................ 713/500; 713/500; 327/157
(58) Field of Search ........................... 713/500; 327/157

(56) References Cited

U.S. PATENT DOCUMENTS

| | | | | |
|---|---|---|---|---|
| 4,800,341 A | * | 1/1989 | Johnson | 331/2 |
| 4,833,425 A | * | 5/1989 | Culican | 331/1 A |
| 5,034,703 A | * | 7/1991 | Schumacher | 331/2 |
| 5,142,247 A | * | 8/1992 | Lada | 331/14 |
| 5,650,754 A | * | 7/1997 | Joshi et al. | 331/36 C |
| 5,778,237 A | * | 7/1998 | Yamamoto et al. | 713/322 |
| 5,877,656 A | * | 3/1999 | Mann et al. | 331/16 |
| 6,028,463 A | | 2/2000 | Albu et al. | |
| 6,177,964 B1 | * | 1/2001 | Birleson et al. | 348/725 |
| 6,188,258 B1 | * | 2/2001 | Nakatani | 327/157 |
| 6,377,646 B1 | * | 4/2002 | Sha | 375/376 |
| 2002/0030518 A1 | * | 3/2002 | Dauth | 327/156 |
| 2002/0033736 A1 | * | 3/2002 | Heymann | 331/2 |

FOREIGN PATENT DOCUMENTS

| | | | | |
|---|---|---|---|---|
| EP | 0 306 249 A2 | * | 8/1989 | H03L/7/20 |
| EP | 0 708 398 A | | 4/1996 | |
| JP | 08335875 A | * | 12/1996 | H03L/7/08 |
| WO | WO 99 59053 A | | 11/1999 | |

* cited by examiner

Primary Examiner—Thomas Lee
Assistant Examiner—Nitin C. Patel
(74) Attorney, Agent, or Firm—James J. Murphy, Esq.; Winstead, Sechrest & Minick, P.C.

(57) ABSTRACT

Clock generation circuitry 1300 includes an oscillator 1302 for generating a first signal from a crystal 1301 of a selected oscillating frequency. A first frequency multiplier 1304 selectively multiplies the frequency of the first signal by a predetermined factor to obtain a second signal having a frequency of a preselected multiple of a first set of clock signals. A divider 1305 selectively divides the frequency of the second signal by a second factor to obtain a third signal of a selected frequency. A second frequency multiplier 1304 selectively multiplies the frequency of the third signal by a third factor to obtain a fourth signal of a selected frequency, the second and third factors selected to produce a fourth signal having a frequency of a preselected multiple of a second set of

30 Claims, 48 Drawing Sheets

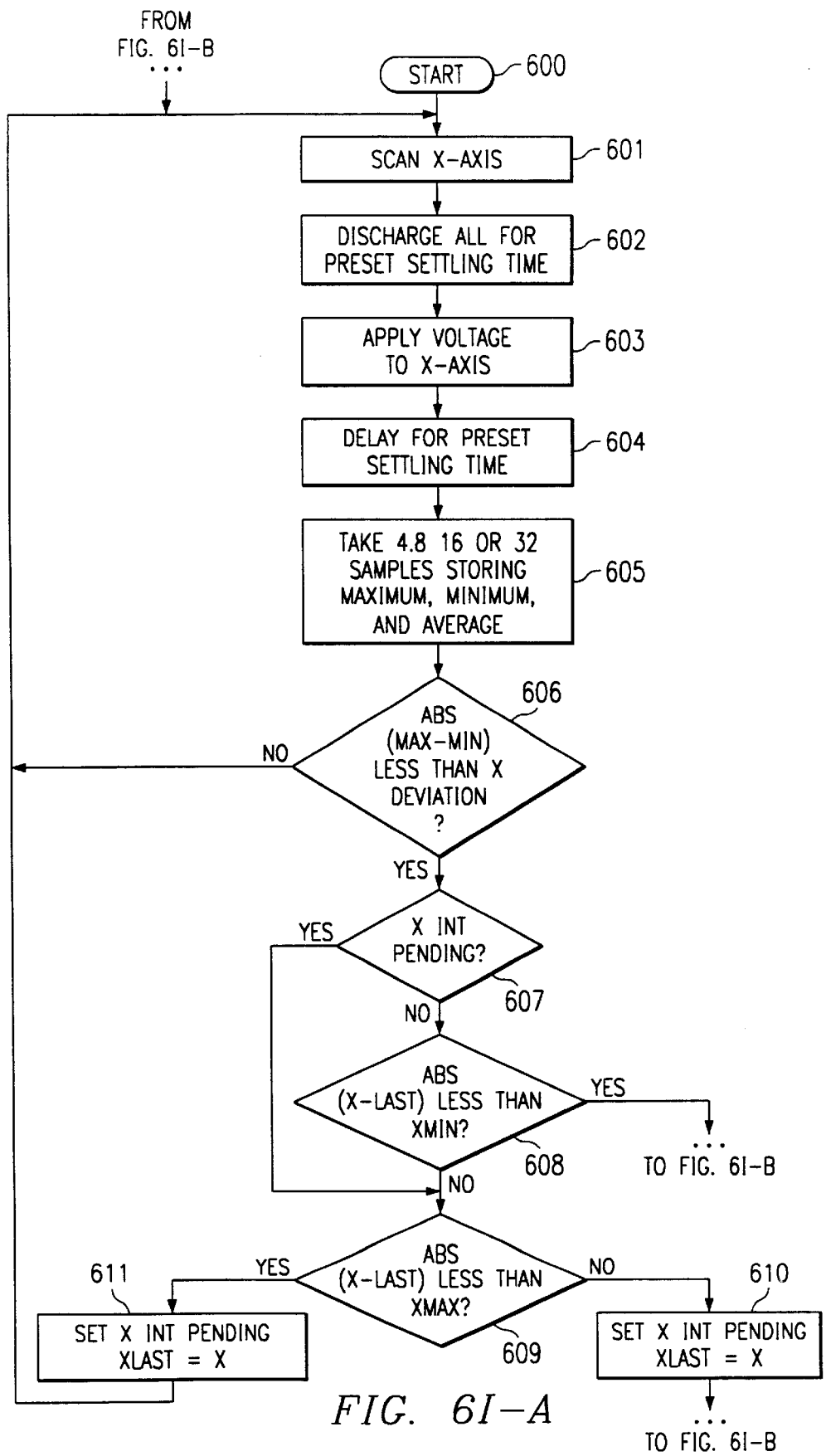
FIG. 61-A

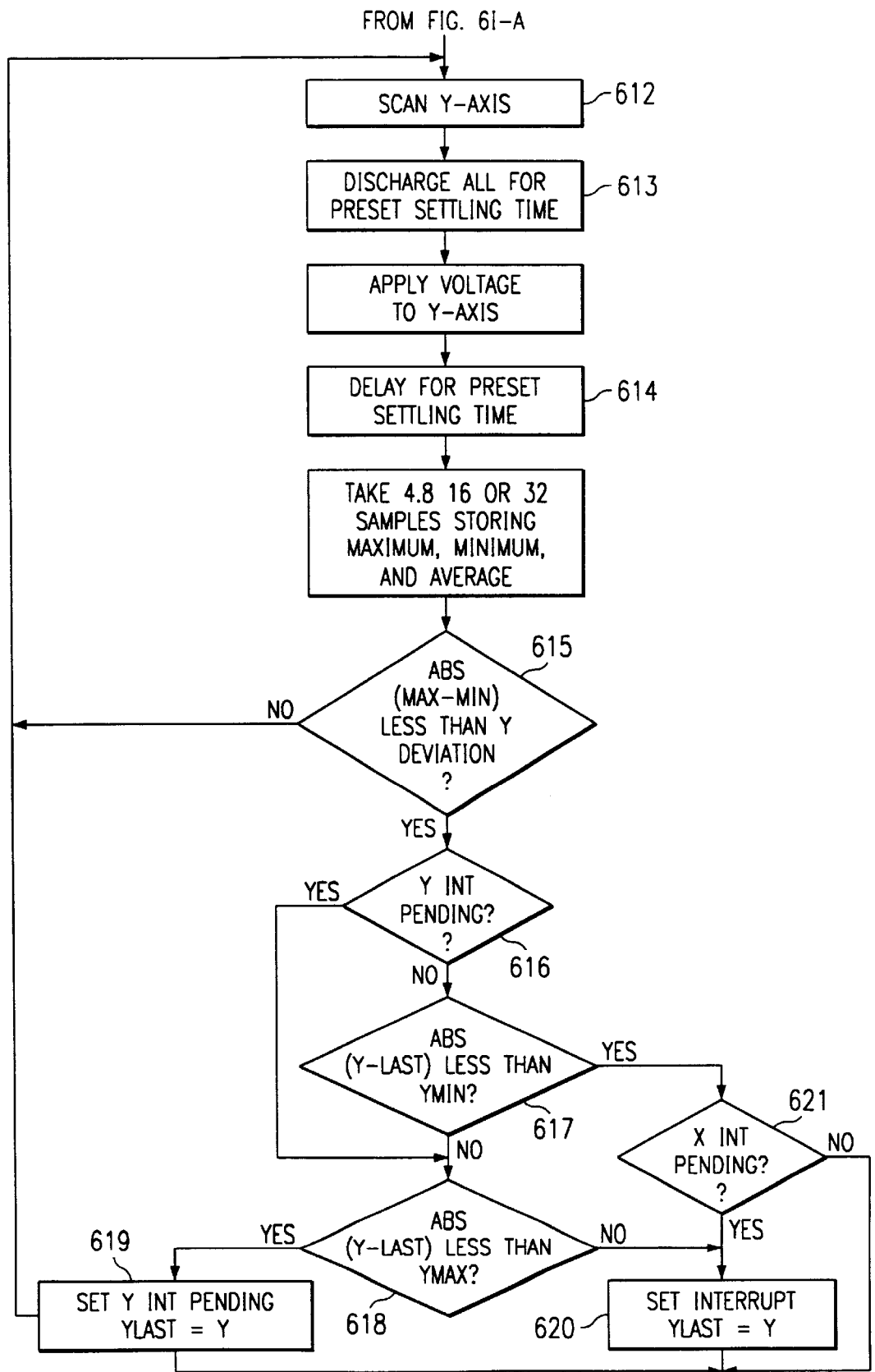
FIG. 61-B

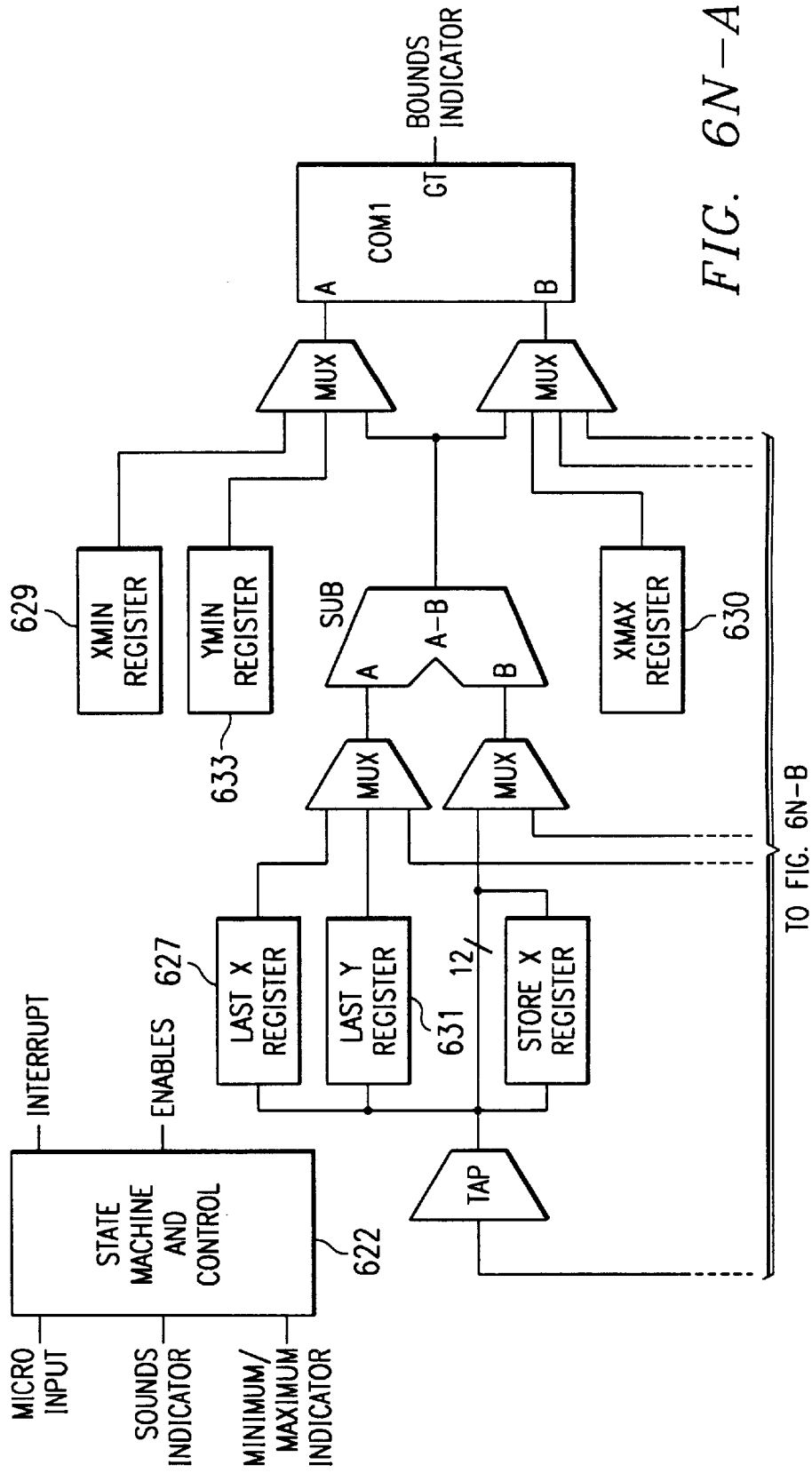

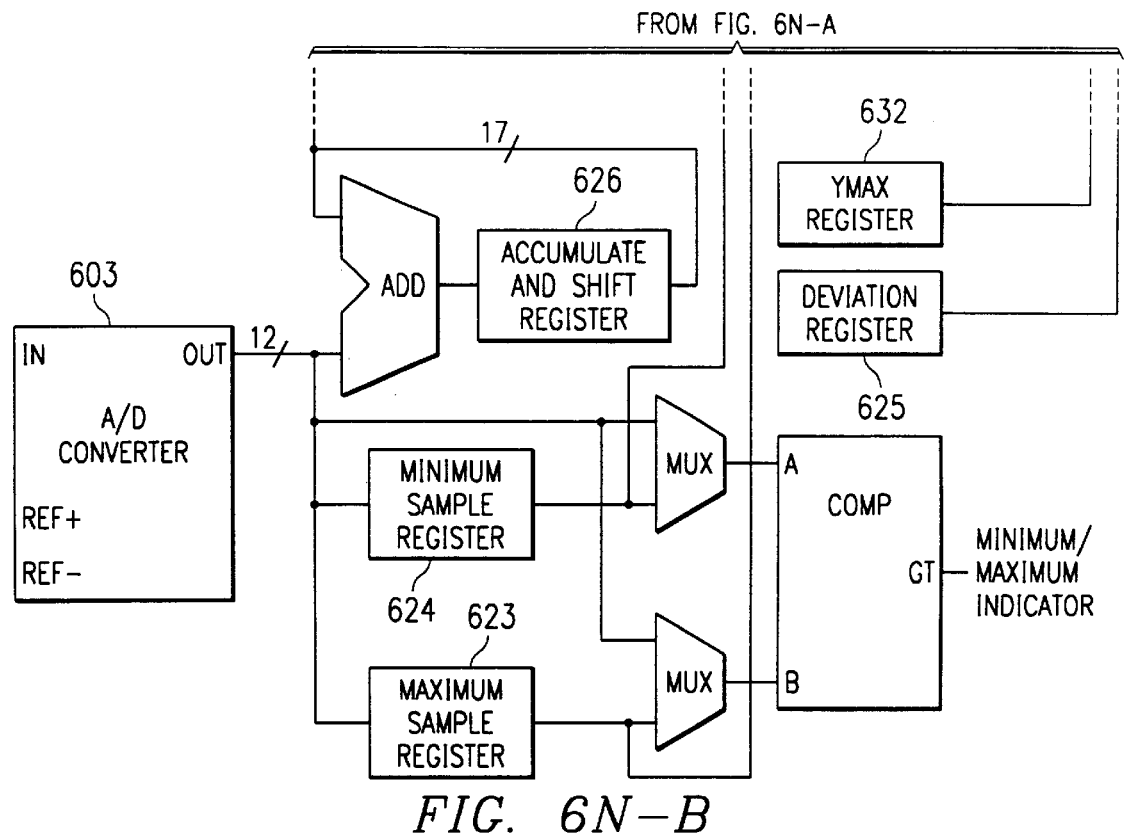
FIG. 6N-B
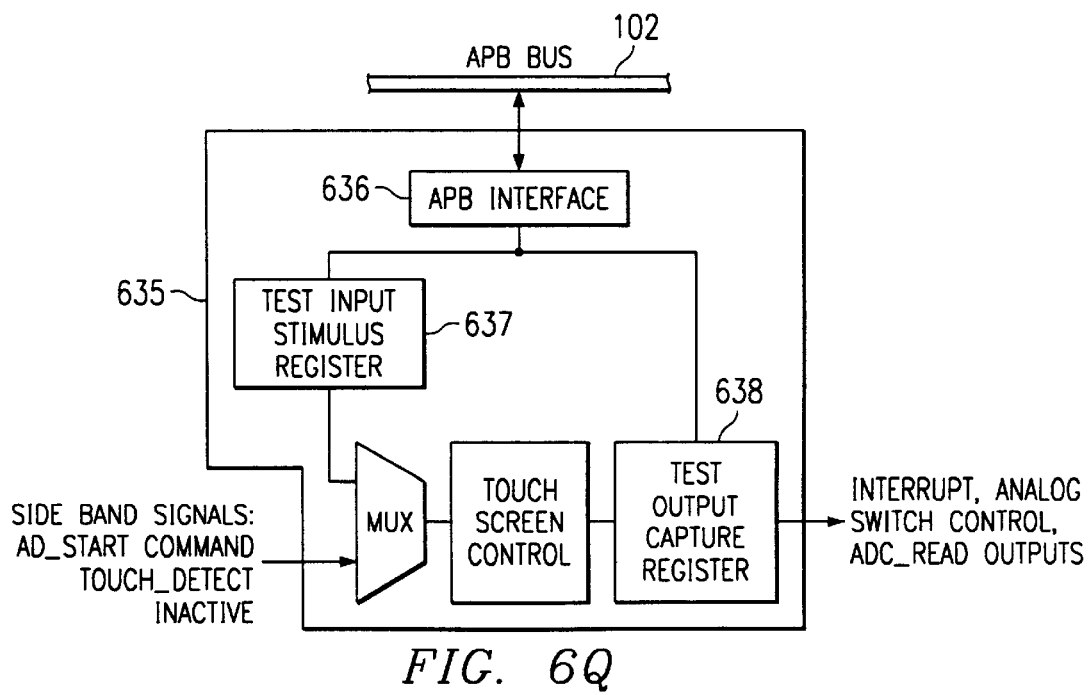
FIG. 6Q

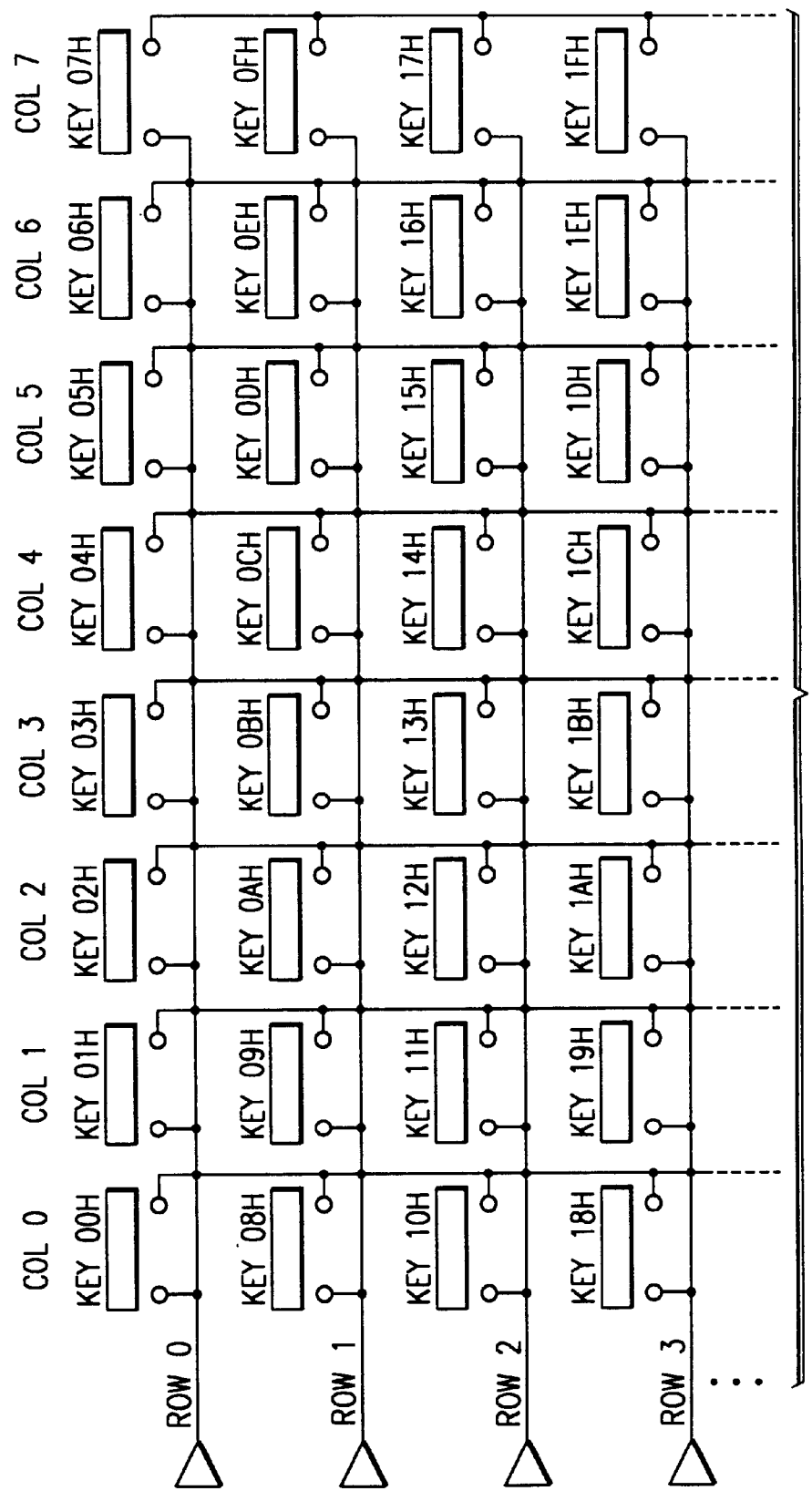
FIG. 9B-A

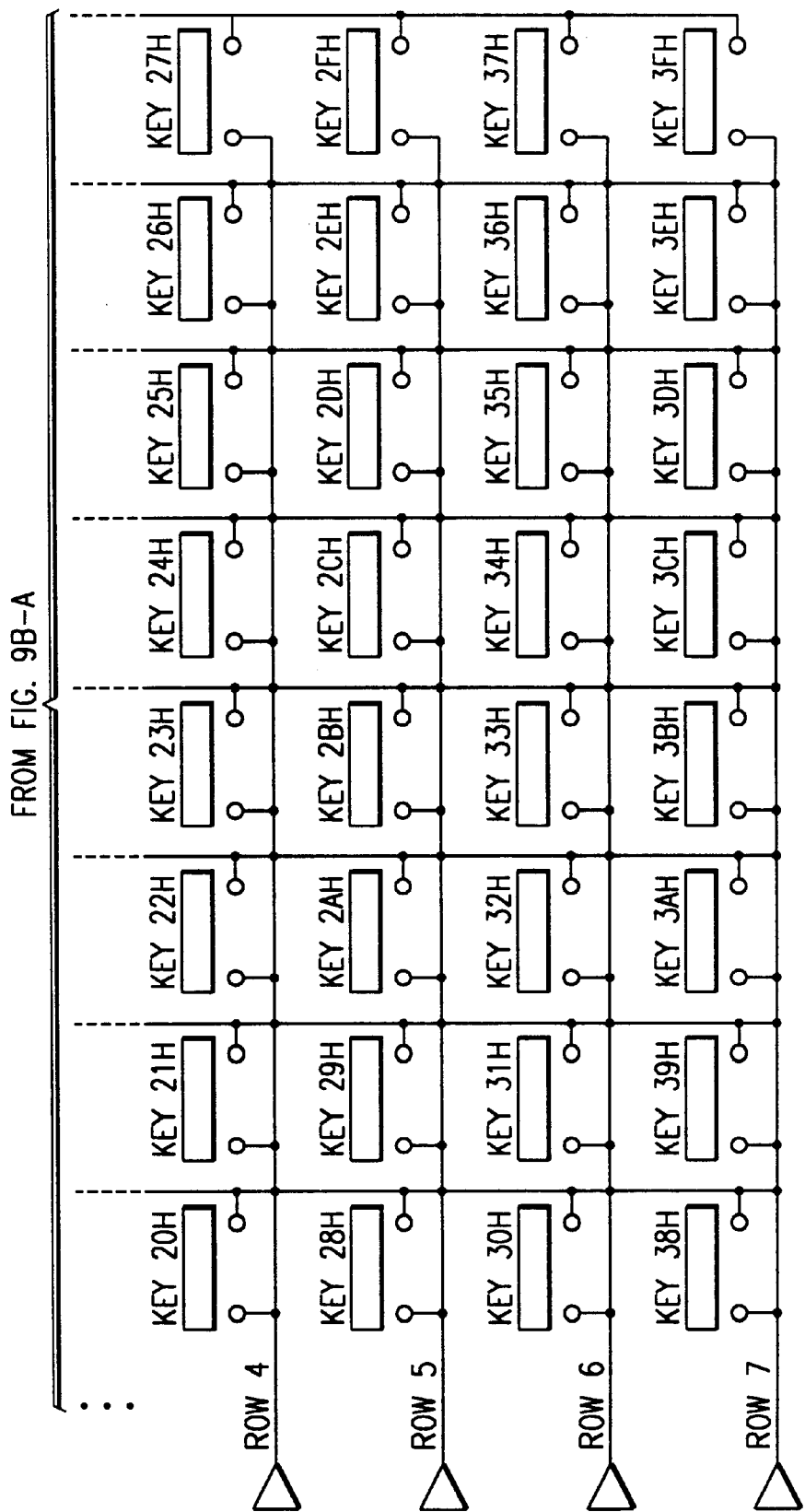
FIG. 9B-B

CLOCK GENERATOR CIRCUITRY

CROSS-REFERENCE TO RELATED APPLICATION

The following co-pending and co-assigned application contains related information and is hereby incorporated by reference:

Ser. No. 09/590,506, entitled "SYSTEM ON A CHIP", filed Jun. 9, 2000; and currently pending;

Ser. No. 09/591,659, entitled "MATH COPROCESSOR", filed Jun. 9, 2000; and currently pending; and Ser. No. 09/591,124, entitled "VOLTAGE LEVEL SHIFTER", filed Jun. 9, 2000; currently pending.

BACKGROUND OF THE INVENTION

1. Field of the Invention

The present invention relates in general to electronic circuits and in particular to clock generator circuitry.

2. Description of the Related Art

Sophisticated design and fabrication techniques are rapidly making practical systems-on-a-chip a reality. In turn, a broad range of personal and commercial hand-held appliances can be constructed which embody a high degree of functionality. These appliances include personal digital assistants, personal digital music players, compact computers, point of sale devices, and Internet access devices, to name only a few of the possibilities.

A number of factors must be addressed when designing a system-on-a-chip. Among other things, the device must be capable of interfacing with a broad range of input/output devices which may be required to support various potential user-defined applications. Moreover, the device must be power efficient while operating at high clock speeds. Additionally, should have a large address space to flexibly support a range of possible memory configurations and sizes.

SUMMARY OF THE INVENTION

In accordance with one embodiment of the principles of the present invention, clock generation circuitry is disclosed which includes an oscillator for generating a first signal from a crystal of a selected oscillating frequency. A first frequency multiplier selectively multiplies the frequency of the first signal by a predetermined factor to obtain a second signal having a frequency of a preselected multiple of a first set of clock signals. A divider selectively divides the frequency of the second signal by a second factor to obtain a third signal of a selected frequency.

A second frequency multiplier selectively multiplies the frequency of the third signal by a third factor to obtain a fourth signal of a selected frequency, the second and third factors selected to produce a fourth signal having a frequency of a preselected multiple of a second set of clock signals.

Among other things, the principles of the present invention allow for the construction and operation of a clock generator which can generate a number of clocks of widely varying frequencies from a single crystal. Moreover, the clock circuitry is easily programmable such that the crystals themselves are readily interchangeable. Clock generators embodying these principles are preferably utilized in integrated circuits, although these same principles may also be advantageously applied to clock generators constructed out of discrete devices.

BRIEF DESCRIPTION OF THE DRAWINGS

For a more complete understanding of the present invention, and the advantages thereof, reference is now made to the following descriptions taken in conjunction with the accompanying drawings, in which:

FIG. 5I illustrates an exemplary state of the receive queues following the reception of four frames;

FIG. 5O illustrates the hardware—software interaction during the EtherNet receive process;

FIG. 6I illustrates operational flow chart describing a preferred method of decoding a touchscreen entry;

FIG. 6N illustrates a preferred procedure for scanning the touchscreen and determining touch location in reference to the resistive scanning block diagram of FIG. 6N;

FIG. 6O illustrates a typical system configuration during low power operation using the 5-wire device as an example.

FIG. 6Q depicts the touch controller TIC harness connections for the preferred embodiment;

FIG. 9B shows an exemplary 8 row and 8 column keyboard for purposes of describing the keyboard scan circuitry;

DESCRIPTION OF THE PREFERRED EMBODIMENTS

Figure 1:
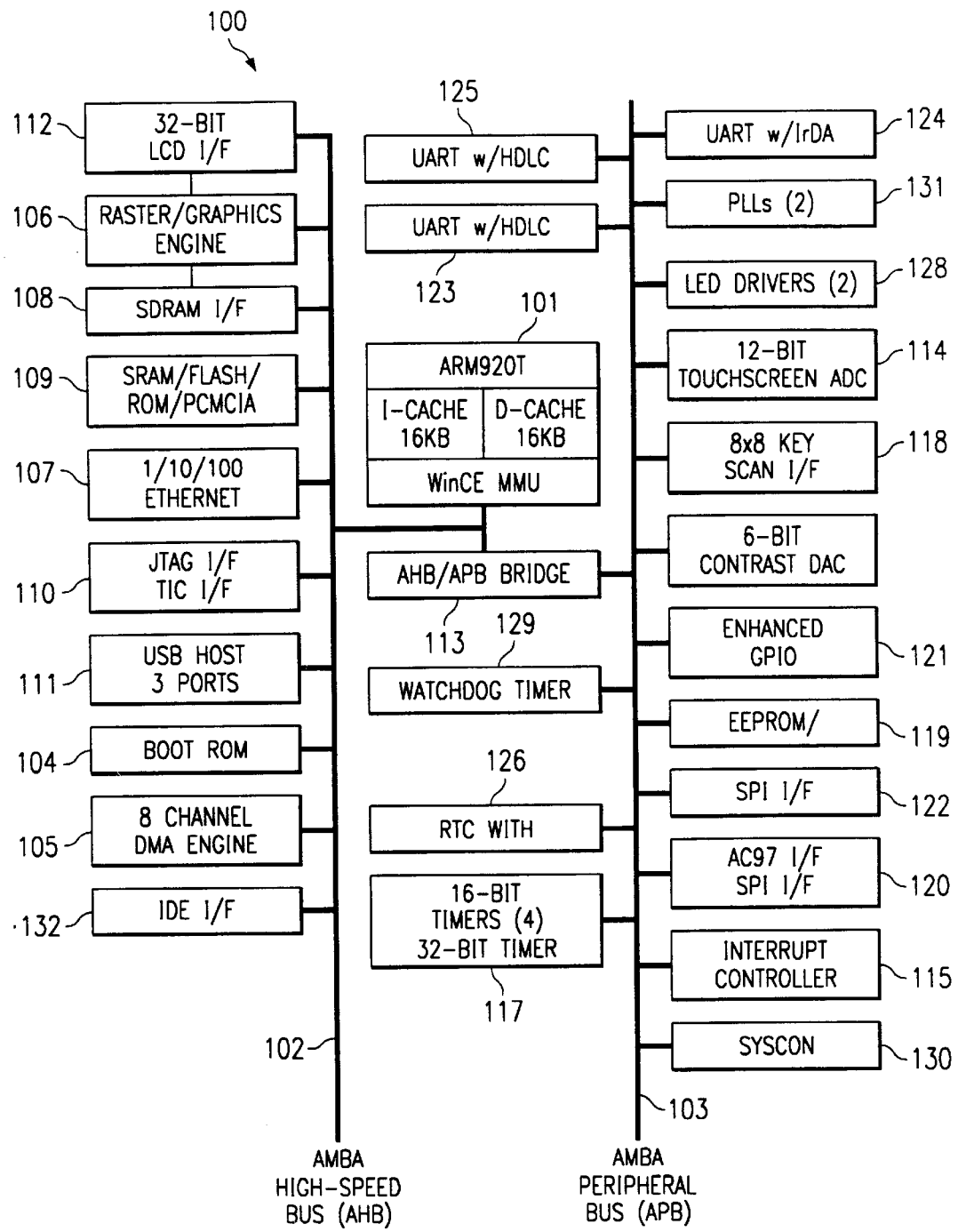
FIG. 1 is a diagram of a microprocessor-based system-on-a-chip embodying the principles of the present invention.

The principles of the present invention and their advantages are best understood by referring to the illustrated embodiment depicted in FIGS. 1–13 of the drawings, in which like numbers designate like parts.

FIG. 1A is a diagram of a microprocessor-based system-on-a-chip 100 embodying the principles of the present invention. System 100 is a general purpose processing device suitable for use in a number of high performance personal and commercial information processing systems requiring small device size and low power consumption. Among other things, system 100 may be embodied in personal portable appliances, such as handheld music players, portable Internet appliances and personal digital assistants, commercial portable appliances such as portable point-of-sale terminals, as well as intelligent peripherals, telecommunications appliances and compact computers.

In the preferred embodiment, system 100 is based on ARM 920T microprocessor core 101 operating in conjunction with a set of on-chip peripheral devices via an AMBA High Speed Bus (AHB or peripheral bus high speed bus) 102 and an AMBA Advanced Peripheral Bus (APB) 103. The peripheral set will be discussed further below. A block diagram of microprocessor core 101 is shown generally in FIG. 2; specific details are set out in the ARM920T data sheet available from ARM, Ltd., Cambridge, United Kingdom, incorporated herein by reference. Additionally, detailed specifications for AHB 102 and APB 103 are also available from ARM, Ltd., such specifications also incorporated herein by reference.

The functional blocks 104–130 described in detail below, as well as microprocessor core 101, are preferably coupled to buses 102 and 103 using tri-state buffering. A conceptual drawing of a preferred tri-state implementation is shown in FIG. 1B. Here, each output (data, address, or control signal) 131 from a given source block (101, 104–130) is coupled to the input of one or more corresponding destination blocks (101, 104–130) by a single conductor 132 through a tri-state buffer 133. One source block is allowed to drive the given bus 102/103 while the outputs of the remaining source blocks are held in a tri-state or high impedance state. Thus, the timing of the activation and deactivations of the source block outputs is critical to avoid collisions.

In the preferred embodiment, the current bus master grants the privilege to a selected source block to drive the bus for a given number of cycles. An idle cycle is inserted at the start of each burst of information to allow for the return of responsive information from the destination (slave) devices from the previous cycle. An idle cycle is also inserted before a new bus master takes control of the bus. During this idle period, addresses and control signals are preferably not driven on the bus, with the exception of the requisite transfer control signals.

The tri-state buffer approach has substantial advantages over other bus interface techniques such as multiplexing and logical gating. Among other things, the state approach requires less logic to implement. Additionally, die area is saved which helps reduce the overall cost of the device.

Figure 2:
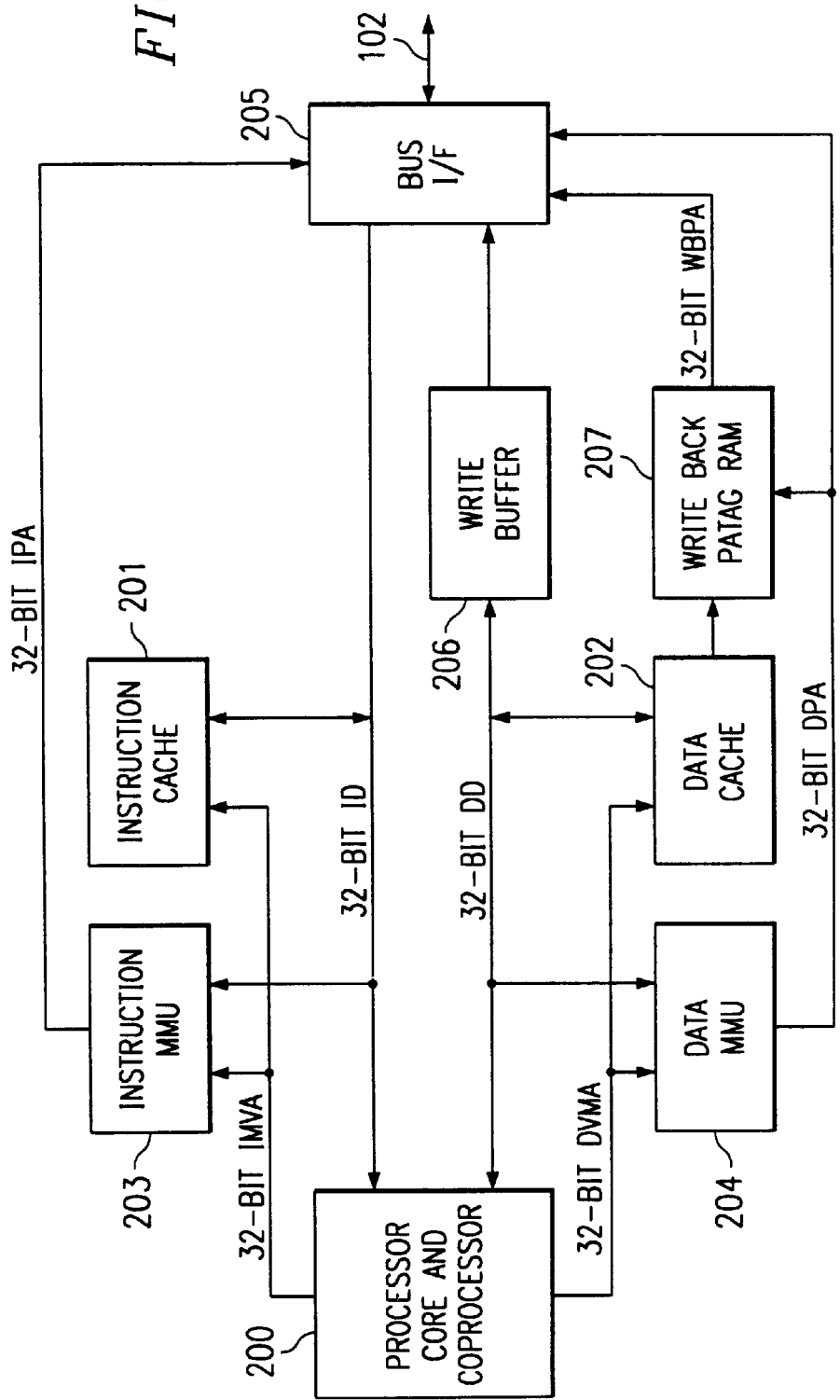
FIG. 2 illustrates a block diagram of a preferred microprocessor core.

As shown in FIG. 2, microprocessor core 101 includes a reduced instruction set computing (RISC) processor and one or more coprocessors shown collectively at block 200. In this embodiment, the available cache comprises both an instruction cache 201 and a data cache 202. Similarly, separate instruction and data MMUs 203 and 204 are used. The instruction modified virtual address (IMVA), instruction physical address (IPA) and instruction data (ID) buses are each 32 bits wide. Similarly, the data modified virtual address (DMVA), data physical address (DPA) and data (DD) buses are 32 bits wide. Physical addresses and data are exchanged to AHB bus 102 through AMBA bus interface 205. A write buffer 206 allows for the parallel exchange of data through interface 205 during processor core operations. Data from data cache 202 can be output through write-back physical address (PTAG) RAM 207.

System boot ROM 104 operates from high speed bus 101 and controls the selection of the external source of program code from which system 100 operates. In the preferred embodiment, boot ROM 101 comprises 16 KBytes of mask-programmed memory. The external source could be for example flash memory. Program code under one boot option is directly executed from external flash memory. Alternatively, a loader program is downloaded through UART1 or the PCMCIA (both discussed below) into SDRAM. This loader program in turn downloads a complete operating image through either the UART1, PCMCIA, USB, or IrDA ports or the EtherNet interface and typically stores that image in flash memory. Additionally, in the preferred embodiment, the boot ROM code does not enable the microprocessor memory management unit (MMU). The loader program therefore operates from physical addresses and handles the tasks of initializing the page tables and starting the MMU and caches.

Figure 3A:
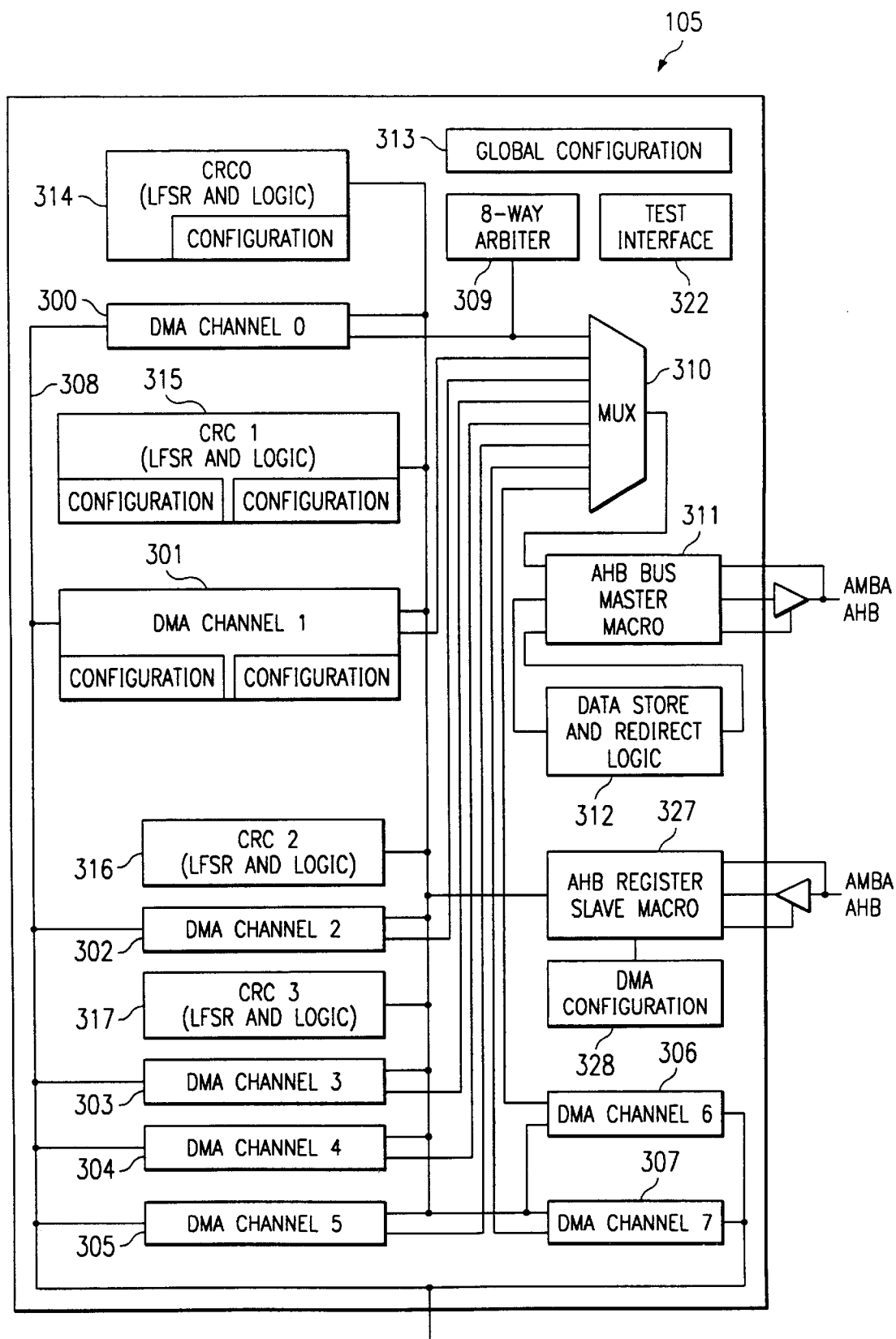
FIG. 3A illustrates a more detailed functional block diagram of the DMA engine.

A multiple-channel Direct Memory Access (DMA) engine 105 also operates off high speed bus 102. A more detailed functional block diagram of DMA engine is shown in FIG. 3A. In the illustrated embodiment, DMA engine 105 comprises 8 processing paths 300–307 corresponding to 8 channels 0–7. Each DMA path way is independently programmable with respect to source and destination addressing. Resource requests are received from the requesting devices, such as the UARTs discussed below via a 16-bit wide Request bus 301. The various resources connected to resource bus 308 are then associated with a given channel by setting bits in corresponding DMA control registers 313. Simultaneous memory access requests are resolved by an 8-way arbiter 309 and multiplexer 310. Additionally, DMA engine 105 includes 4 Linear Feedback Shift registers (LSFRs) 314–317, for performing CRC error correction.

Generally, a DMA operation proceeds as follows In considering any DMA operation in the preferred embodiment, it must be recognized that the AHB has a pipe-lined architecture for both addresses and data and that any DMA channel can generate a internal request to AHB bus master 311 for access to AHB bus 102. When access to the bus is granted, arbiter 309 selects the channel to be serviced by the bus.

The selected channel begins its access at the source location address driven on the bus during the previous bus cycle. If DMA engine 105 was not the bus master for the previous cycle, a bus idle cycle is inserted to avoid address bus contention problems. All channels share the same data storage and redirect logic 312; therefore, during the read cycle, arbiter 309 locks multiplexer 310 to the current channel such that during the next bus cycle that same channel can complete its access with a write cycle. The sequence generally proceeds as follows: When the previous bus cycle is finished, DMA engine 105 is in a ready state. The data read cycle then executes, and data retrieved from memory are stored internally in a temporary storage register (block 312). Depending on the width of the incoming data, the data register stores either a received single 32-bit word, a received 16-bit half word which has been duplicated to create a 32-bit word, or an incoming byte which has been copied four times to create a 32-bit word.

At the same time, a write address is driven onto the bus. Bus master 311 inserts a bus idle cycle when necessary to avoid data contention. Once the write address is being driven on the bus, the arbiter lock on the active channel is released. During the write cycle, a single 32-bit word, two 16-bit half words, or four bytes are written on the bus as a 32-bit word. Address alignment in the case of half words and bytes is performed by the slave device. While the write cycle is being performed the next read address is driven on the bus.

DMA channels 300–307 are configured in register. For each channel, a 32-bit source address pointer and a 32-bit destination address pointer are defined to configure a transfer. The source and base addresses are incremented or decremented based on the state of a set of increment and decrement control bits assigned to each channel (If the increment and decrement bits are set to the same value for a channel, the address remains the same.) The address pointers increment or decrement by a different amount based on the width of the transfer. The configuration registers also control transfer word width in terms of 32-bit words, 16-bit half words, or bytes, as well of the length definition of the given transfer.

DMA transfers can be either synchronized or unsynchronized. Unsynchronized transfers are initiated by software whenever a DMA channel is granted access to AHB 102 by setting an enable bit. Clearing the enable bit halts the unsynchronized transfer. Synchronized transfers are initiated by a DMA request from resource bus 308, such as the serial channel transmit or receive buffers. During a synchronized transfer, when the enable bit is set, a DMA channel will transfers data when the request line is active and it has control of the bus.

DMA engine further includes four 16/32 bit programmable LSFRs 314–317 for calculating CRCs based on common CRC algorithms including CRC-16, Reverse CRC-16, CRC-CCITT (SDLC, X25, XMODEM), and reverse CRC-CCITT. In the illustrated embodiment, LFSRs 314–317 are coupled to DMA channels 0–3 and are correspondingly labeled CRC0–CRC3. The LFSRs 314–317 can be dedicated to their respective DMA channel or used independently by any bus master through the AHB register interface 327 and configuration registers 328. Each CRC calculator may be hardware connected to its respective DMA channels to allow DMA "through" the CRC generator.

Figure 3B:
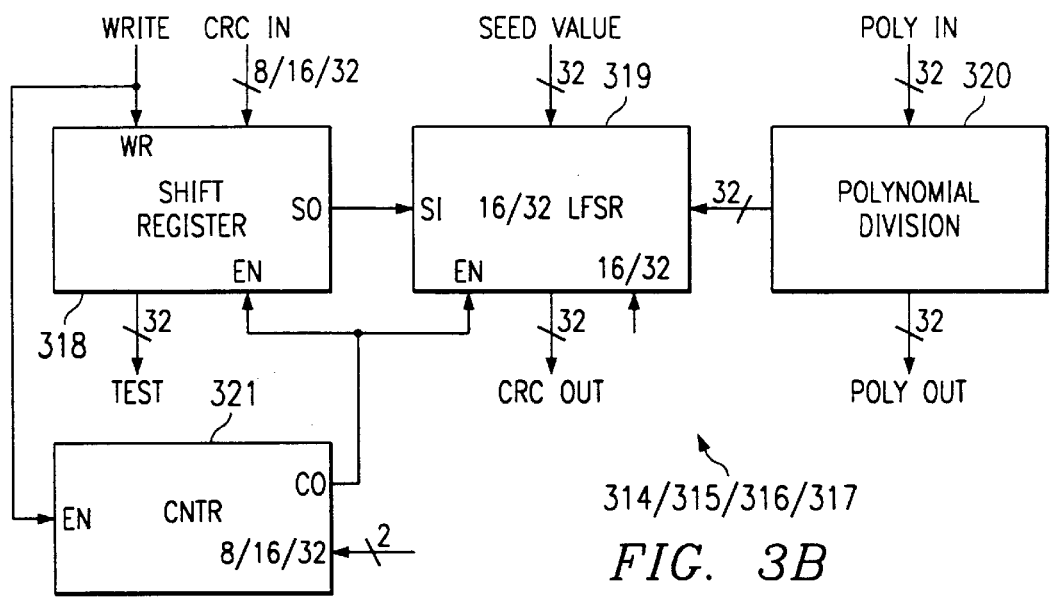
FIG. 3B is a more detailed functional block diagram of a selected LSFR.
Figure 4A:
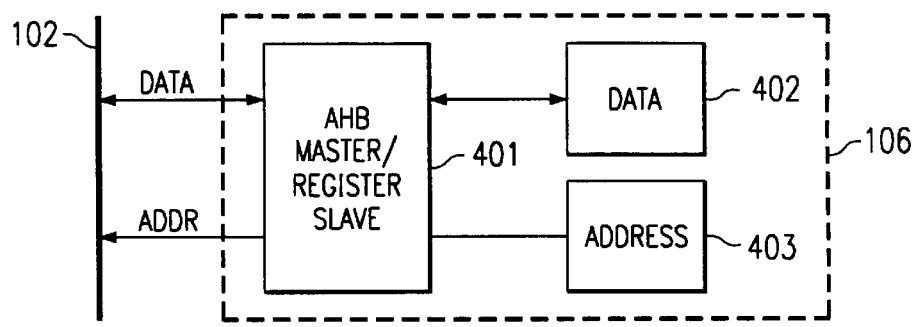
FIG. 4A is a functional block diagram of the graphics portion of the raster/graphics engine.
Figure 4C:
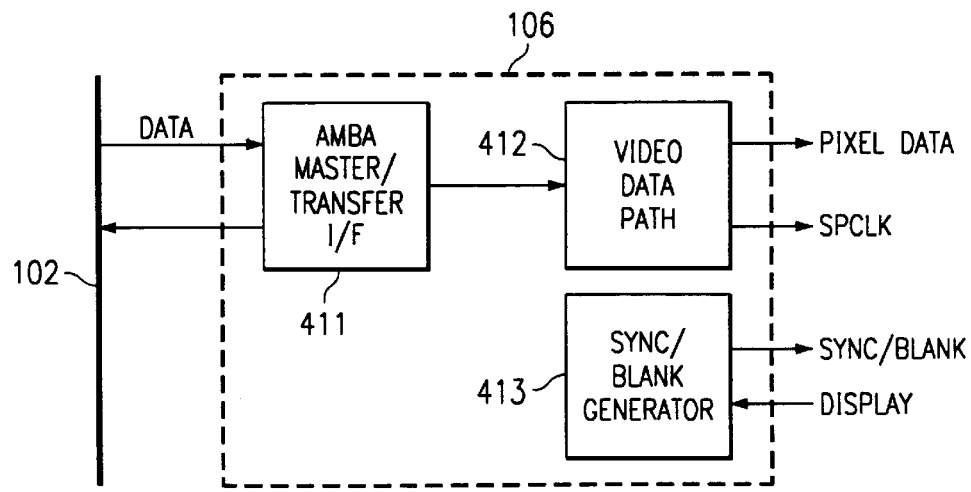
FIG. 4C illustrates in further detail a block diagram depicting the raster engine portion of raster/graphics engine.

FIG. 3B is a more detailed functional block diagram of a selected LSFR 314–317. The LSFR includes an input shift register 318, 16/32 bit LFSR 319, polynomial divisor 320 and counter 321. During programming, the shifting mode for shift register 318 is selected between 8-, 16-, and 32-bit modes and the LSFR size is selected to be either 16 or 32 bits wide. The polynomial used by divisor 320 is selected in accordance with the CRC algorithm being used. The process is initialized by writing a seed value of LSRF 319.

Data in either an 8, 16, or 32-bit format is then input through shift register 318 input CRC IN. In the 32- and 16-bit shift modes, the data stream is normally in a word or half word multiple of bytes. If not, the 32 or 16 bit shift mode is initially used and then the shifting switched to the 8 bit mode for the remaining byte(s). Once the data is written into shift register 318, there is a delay of either 9, 17, or 33 bus clocks before the resulting data are available at the CRC OUT port and/or new data can be written in, for the 8, 16, or 32 bit modes respectively. The CRC process will be discussed in further detail below in conjunction with the description of EtherNet MAC 107.

Under the default priority scheme, channel 0 has highest priority, channel 1 the next highest, and so on until channel 7, which has the lowest priority, assuming that the DMA channels correspond to requests REQ 0–7. This priority scheme may be reprogrammed in register, in which case, more than one channel can have the same priority, with reversion to the default scheme when that level has the current highest priority.

Round robin shifting by arbiter 309 supports rotation of priority level precedence as well as the shifting of precedence within a given priority level when two or more channels have the same priority level. In the case of overall rotation, the priority associated with each priority value changes in a round robin fashion in response to the HCLK, so long as no channels have been granted the bus or if the bus has been granted to a channel but the arbiter has not been locked. Between channels set to the same level, priority changes periodically with the HCLK if no channels have been granted the bus or if the bus has been granted to a channel but the arbiter has not been locked. A combination of the two schemes can be used to optimize performance. Notwithstanding, lowest priority values are still assigned to the most critical channels.

Figure 3C:
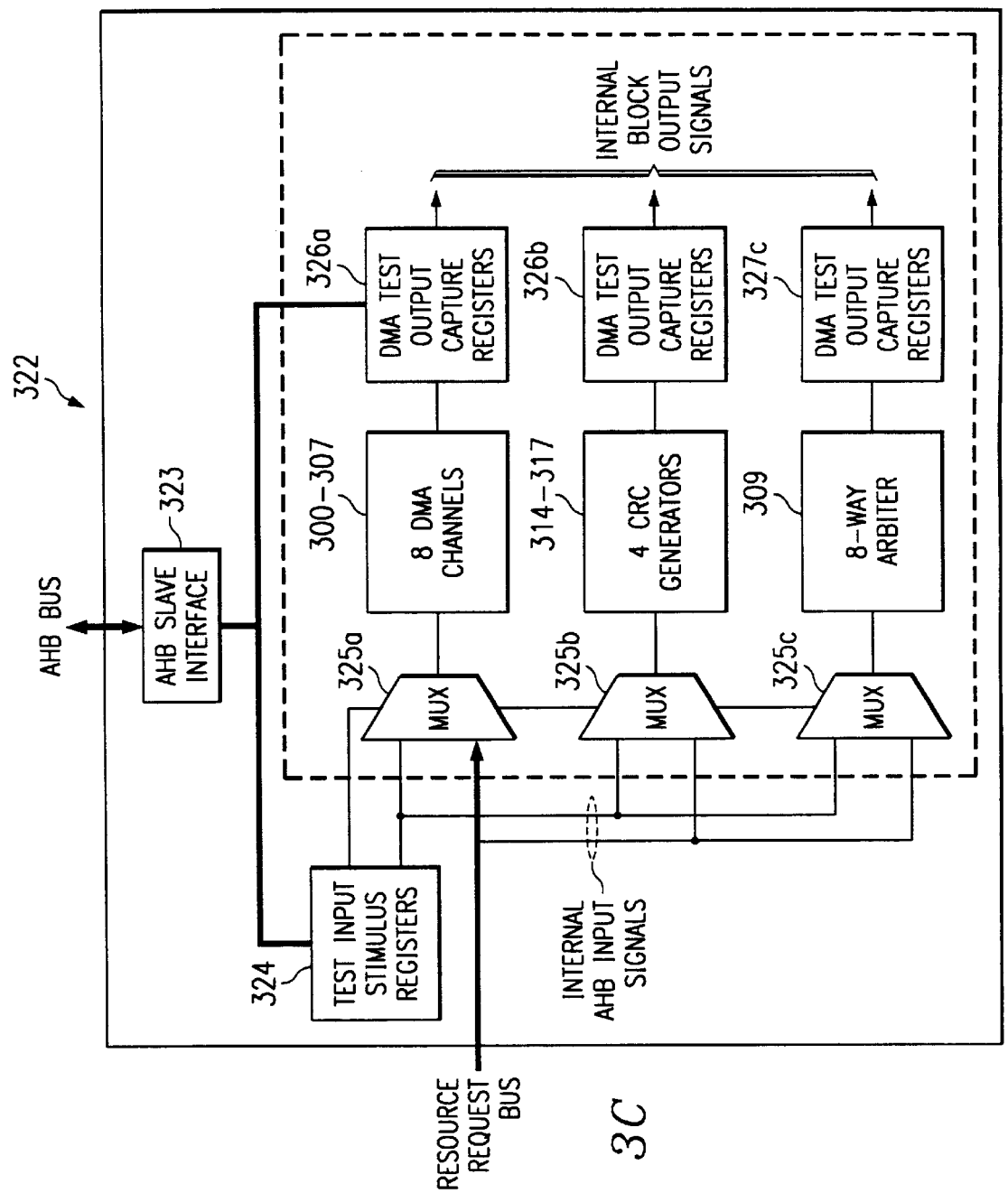
FIG. 3C is a detailed block diagram of the Test Interface Controller (TIC) harness emphasizing the connections to the DMA engine.

FIG. 3C is a detailed block diagram of the Test Interface Controller (TIC) harness as it relates to testing DMA engine. The test interface is generally shown in block 322 in FIG. 3A. Testing is effectuated through AHB interface registers 323 and a corresponding set of multiplexers. The various subblocks, such as DMA channels 300–307, CRC generators 314–317 and arbiter 309 can be tested individually or in parallel. Input signals are written to the text input stimulus registers 324 or fed-back from the output captive registers 326 and passed to the blocks under test through multiplexers 325. The corresponding test outputs are read from the DMA test output capture registers 326.

The graphics engine of raster/graphics engine block 106 generally offloads graphics processing tasks from processor core 101, operating off high speed bus 102 as either the bus master or as a register slave. Among other things, graphics engine performs rectangular block fills, Bressingham line drawing and pixel step line drawing. Data transfers are made by graphics engine 106 through bit-block transfers (BitBLTs similar to the DMA transfers discussed above.) A functional block diagram of graphics engine 106 is provided as FIG. 4A.

As briefly indicated, AHB interface 401 interfaces graphics engine 106 with high speed bus 102 in either the bus master or register slave modes. As the bus master, the graphics engine can access all user accessible areas of the system 100 memory map, including, but not limited to, the available graphics and video memory. This advantageously allows for block storage, such as for fonts or bit-mapped display data, anywhere in the system memory. Pixels are organized according to the Device Independent Bitmap standard format and can be stored as either 1, 4, 8, 16, or 24 bits per pixel.

Data path 402 performs masking operations such as pixel bit plane inversion, pixel bit plane addition, and pixel bit plane subtraction. Transparency logic is provided at the back-end of the graphics data path for background preservation. In the preferred embodiment, mask logic operations are performed first, followed by destination logical combination, and then replacement of destination pixels based on source transparency description. Line pattern circuitry supports both Bressingham and pixel step line draws.

The graphics engine address path 403 includes both X and Y bidirectional incrementation circuitry for effectuating these line draws. For block operations, a set of registers are programmed to define the width of the source block and the destination block width and height. The destination block width is the same as the source block width when unpacked source pixels are being transferred to a destination block of the same size and having the same starting pixel. Additional registers define the memory organization for the source and destination blocks in terms of line length, indicate whether the source data is packed, define the pixel depth in bits per pixel, and the count direction of incrementation.

Figure 4B:
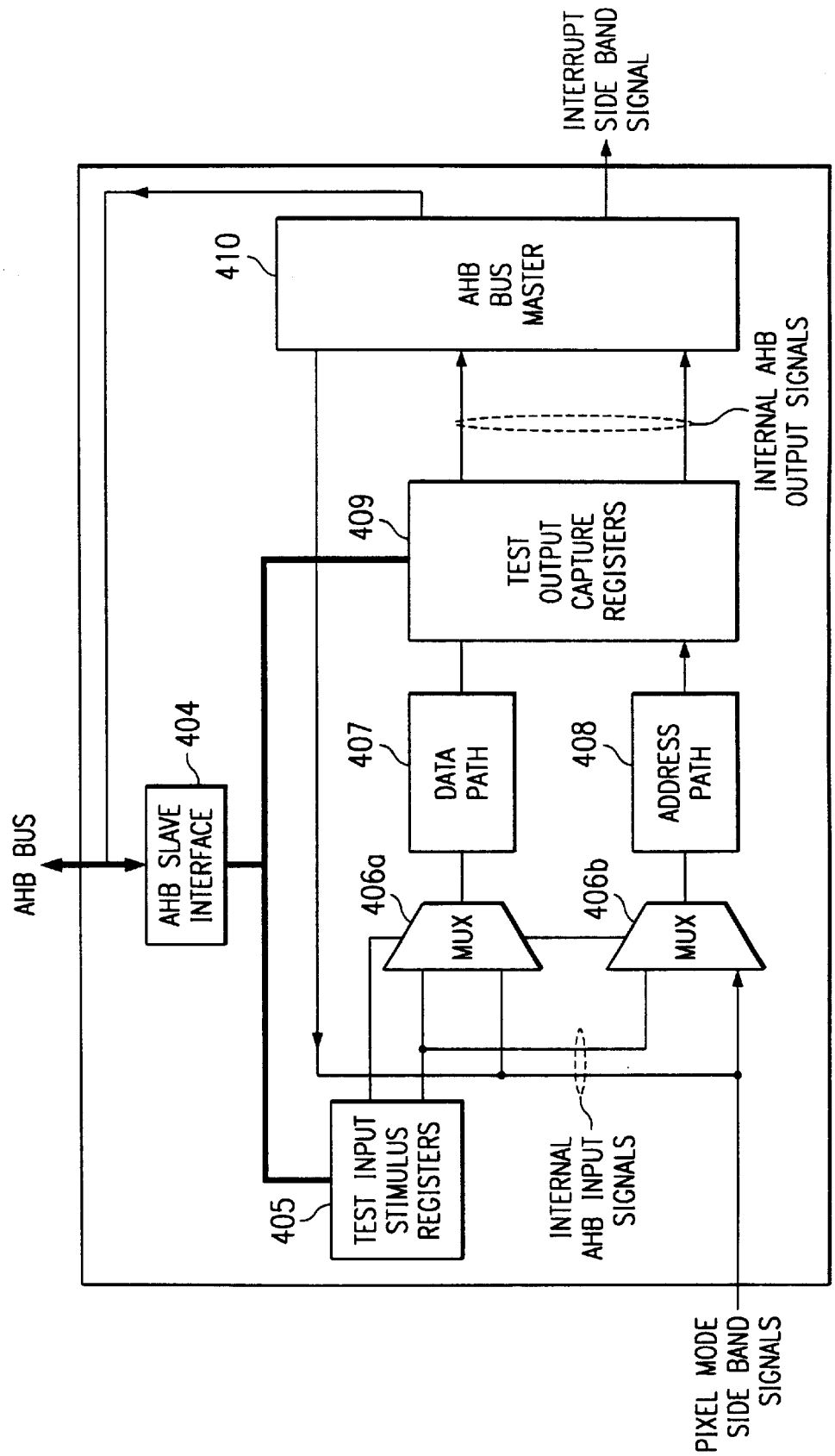
FIG. 4B illustrates the circuitry implicated in the preferred graphics engine test configuration.

The graphics engine can also be tested using the Test Interface Controller (TIC). The circuitry implicated in the preferred graphics test configuration is shown in FIG. 4B. Similar to the DMA test harness, the graphics engine test harness is controlled via an AHB slave interface registers 404. Test vectors are written into test input stimulus registers 405 and then switched by multiplexers 406 to either the graphics engine data path, shown generally by block 407, and/or the graphics engine address path, shown generally by block 408. Multiplexers 406 may also be used to pass pixel mode sideband signals through the graphics path during test. The resulting output data is then held in test output capture registers 409 where then can be fed back through multiplexers 406 or transmitted on high speed bus 102 via bus mastering circuitry 410.

The raster engine portion of raster/graphics engine 106 drives analog CRTs or digital LCDs, including non-interlaced flat panel and dual scanning devices. It can also support an optional interface to an NTSC encoder. The raster engine also preferably processes pixels in the DIB format, although those data do not necessarily have to be in a packed line architecture. Pixels can be in any one of a number of standard 4, 8, 16 or 24 bpp formats.

The raster engine also includes dedicated AMBA video bus master/transfer interface 411 which interfaces the raster engine and high speed bus 102. Moreover, the raster engine connects to the DRAM controller through a dedicated DMA port allowing video images are read directly from memory and loaded into a video FIFO within video data path 412.

The video FIFO generally maintains the video data stream from image memory (video frame buffer) to the video output circuitry without stalling. The video frame buffer can be either in main memory or a dedicated video memory area (which can be designated anywhere in the memory map). Generally, when the FIFO is less than half full, data are read from the video frame buffer until the FIFO is full, at which time the video data fetch halts. Once the FIFO again goes below half full, the process repeats itself, with more data retrieved from the frame buffer.

Video data path 412 additionally includes blink control logic, a grayscale generator, cursor generation logic and a pair of color look-up tables. One look-up table is inserted into the video pipeline while the other is accessible for update via bus 102. Multiplexers select between pixel data from the color look-up tables, the grayscale generator, cursor logic, and the blinking control logic. The output section of video data path 412 preferably includes an YCrCb encoder for interfacing with an NTSC encoder and output shift logic which allows multiple pixels to be shifted out each clock.

The raster engine also embodies hardware cursor generation circuitry which is based on a dedicated cursor AMBA bus master and independent cursor address counters. As a result, the cursor can be stored anywhere in the available memory space associated with high speed bus 102. Cursor size, location and color are register programmable.

The raster engine includes circuitry 413 which generates the vertical and horizontal synchronization and blanking signals, necessary to drive the display, as well as the pixel clock SPCLK. A pulse width modulated brightness control signal is also generated which, when used with an external resistor and capacitor, is used to generate a DC brightness control voltage level.

Figure 4D:
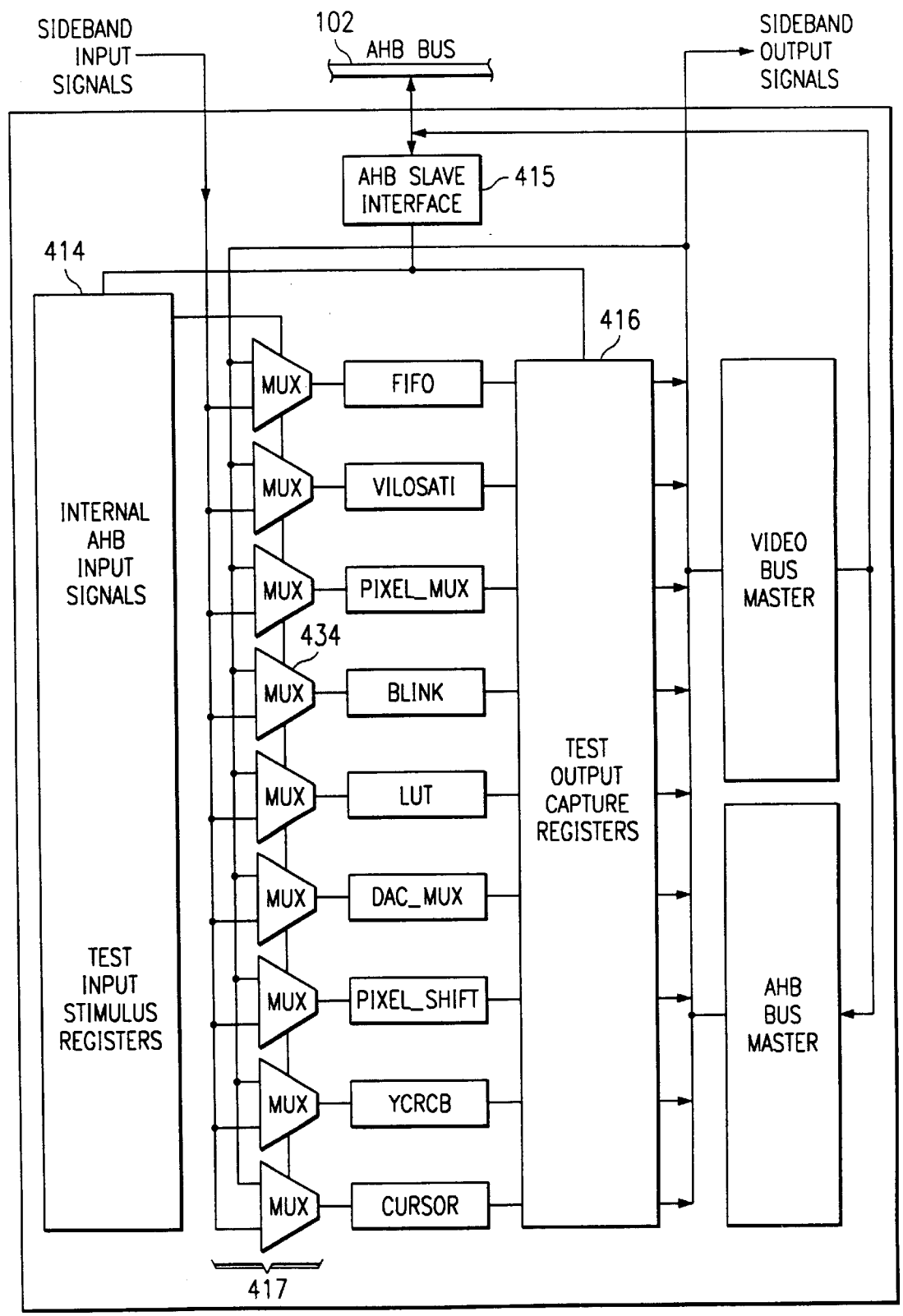
FIG. 4D illustrates a configuration for testing the various primary blocks of the raster engine using the TIC harness.

The various primary blocks of the raster engine can be tested using the TIC harness shown in FIG. 4D. Test input stimulus registers 414 are loaded from AMBA bus 102 via slave register interface 415. Under control of the register contents, multiplexers 417 selectively couple either side band input signals or feedback from the test output capture registers 416 to the selected block or blocks under test.

An EtherNet MAC 107 is also provided on AMBA bus 102 in the preferred embodiment. EtherNet MAC 107 supports communications with external devices in accordance with the EtherNet/ISO/IEC 8802-3 protocol. Under this protocol, a "listen before talk" mechanism is employed since only one device on a single shared medium can transmit at a time. This access method is generally known as Carrier Sense Multiple Access with Collision Detection (CSMA/CD). Each station monitors its receiver for carrier activity. When activity is detected, the medium is busy, hence that station requiring the medium waits until the carrier is no longer detected.

Figures 5A, 5C:
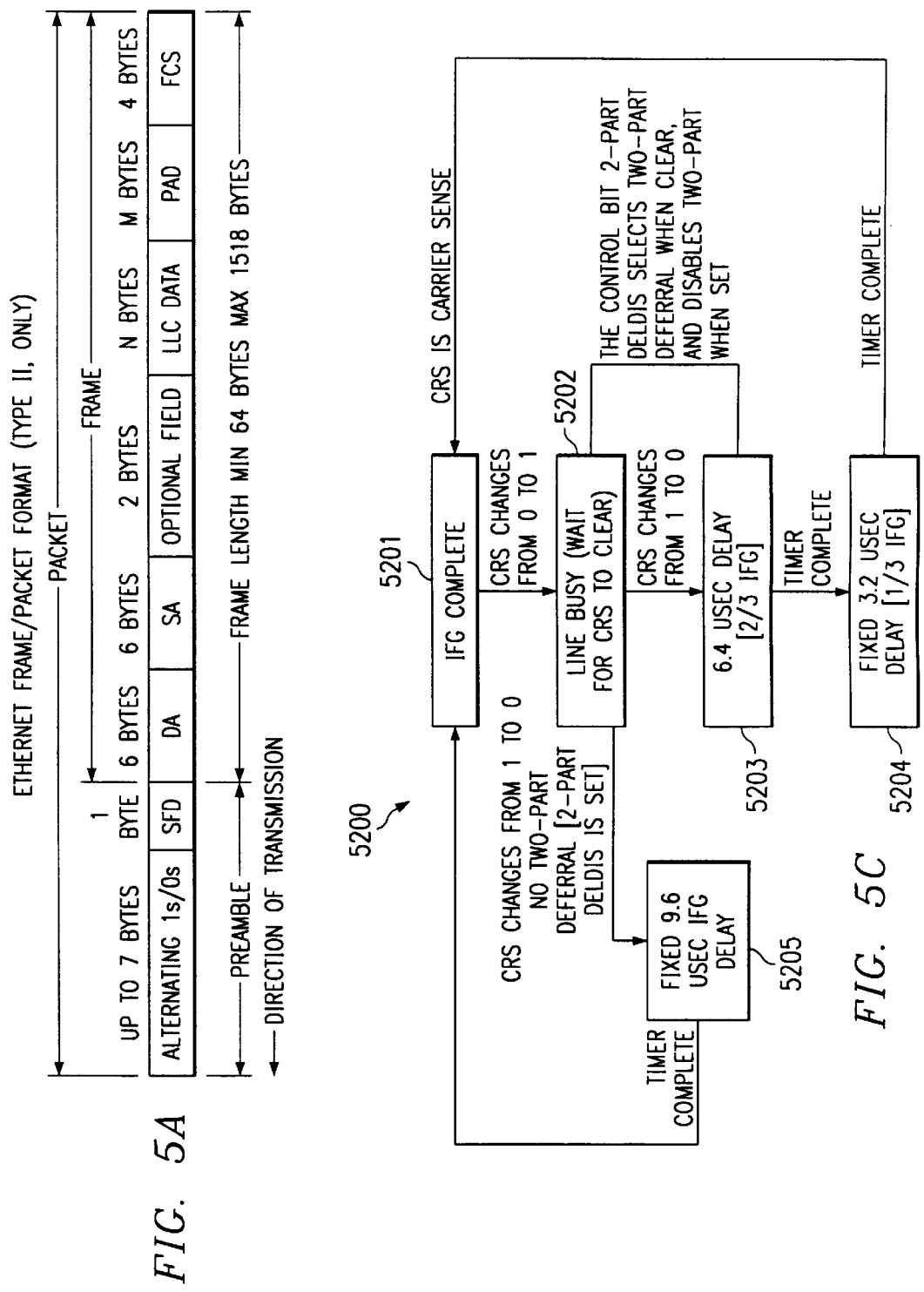
FIG. 5A sets out an exemplary Type II EtherNet frame/packet format for purposes of discussing the EtherNet MAC.
FIG. 5C is a state diagram illustrating a preferred Carrier Deference procedure used in the operation of the EtherNet MAC.

FIG. 5A sets out an exemplary Type II EtherNet frame/packet format upon which the following discussion will be based.

Figure 5B:
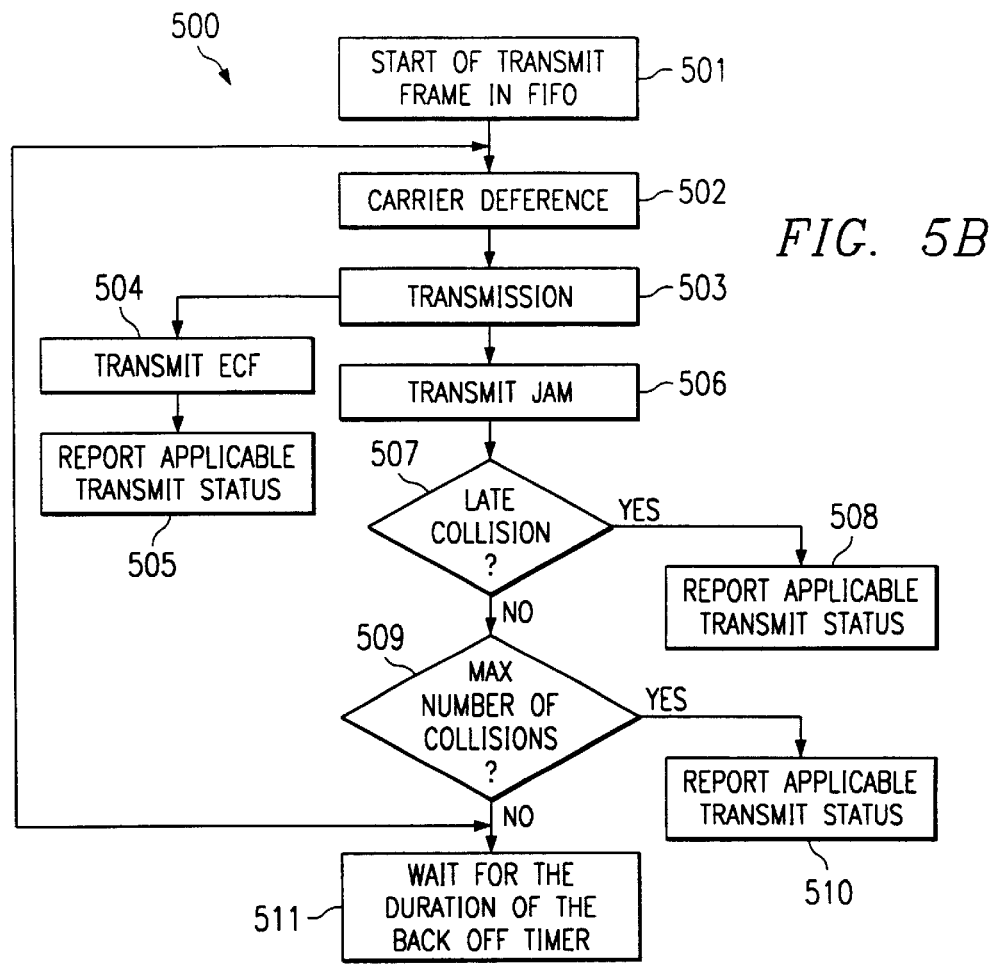
FIG. 5B generally depicts the transmission process through the EtherNet MAC.

The transmission process 500 is shown generally in FIG. 5B, the primary procedures being carrier deference, back-off, packet transmission, transmission of EOF and SQE test.

The transmission of the next frame in the first-in-first-out memory of the transmitting device is initiated Step 501. At Step 502, the carrier deference procedure is run.

A preferred Carrier Deference procedure 5200 is illustrated by the state diagram of FIG. 5C. It should be noted that the carrier deference procedure can be entered from any one of the depicted states, although this procedure can only be exited from the Interframe Gap (IFG) Complete state 5201. In this diagram, "CRS" is the sense of the carrier state, where a logic 0 represents no carrier sensed and a logic 1 represents a carrier present (sensed) state.

Assume for discussion purposes that the procedure is currently in the IFG Complete state at Step 5201. When the line is sensed as busy, the CRS value changes from 0 to 1 and the procedure waits at Step 5202 for the CRS value to clear. Once the line is free and the CRS value clears to zero, either a one part or two part deferral is initiated, as selected by setting a corresponding bit in register.

When a two part deferral is selected, a 6.4 μsec delay corresponding to ⅔ of one full IFG period is initiated at Step 5203. If CRS returns to a logic 1 during this 6.4 μsec delay, (i.e. the line becomes busy) the process returns to the line busy status (Step 5202); otherwise the procedure proceeds to Step 5204 where a second fixed 3.2 μsec delay, corresponding to ⅓ of one IFG period, is inserted. When the 3.2 μsec timer completes at Step 5204, the process loops back to the IFG Complete state 5201.

When a one part deferral is selected, a fixed 9.6 μsec delay corresponding to a full IFG period is inserted at Step 5205. When this delay times out, the procedure returns to Step 5201.

The 2-part deferral has an advantage for AUI connections to either 1 OBASE-2 or 1 OBASE-5. If the deferral process simply allows the IFG timer to complete, then it is possible for a short IFG to be generated. The 2-part deferral prevents short IFGs. The disadvantage of the 2-part deferral is that the 2-part deferrals are generally longer.

After exiting the Carrier Deference procedure at Step 502, the actual transmission of data on to the medium begins at Step 503 (FIG. 5B). The transmission ends with either the transmission of the end of complete frame (ECF) indicator at Step 504, and the consequent transmission of a status report at Step 505, or a collision. There are two kinds of collisions: normal collisions (ones that occur within the first 512 bits of the packet) and late collisions (ones that occur after the first 512 bits). In either collision type, the MAC engine preferably sends a 32-bit jam sequence at Step 506, and stops transmission.

A decision is made at Step 507 as to whether the collision was late. In the event of a late collision, the applicable transmit status is reported at Step 508, and the transmission halted without a re-attempt. In the case of a normal collision, a determination is made at Step 509 as to whether a maximum number of normal collisions have occurred and if so, the transmission is aborted, and applicable transmit status is reported at Step 510. The number of allowable collisions is determined from bits set in register, and typically is either 16 or 1. If the maximum number of collisions has not occurred, the back-off timer is triggered at Step 511, after which the process subsequently looped back to the Carrier Deference procedure (Step 502).

The back off timer value is calculated using either of the ISO/IEC standard or a modified back-off algorithms, as selected by the host. The standard or "truncated binary exponential back off" algorithm is generally in accordance with the formula: $0 <\_r < 2^k$, where r is a random integer representing the number of slot times of wait before another transmission is attempted, wherein a slot time is equivalent to 512 bits (51.2 msec), k=minimum (n,10), and n is the nth retransmission attempt. The modified back-off algorithm increases the delay after each of the first three transmit collisions: $0 <\_r \_2^K$, where k=minimum (n,10), but not less than 3, and n is the nth retransmission attempt. The advantage of the modified algorithm over the standard algorithm is a reduction in the possibility of multiple collisions on any transmission attempt, although the modified algorithm does extend the maximum time needed to acquire access to the transmission medium.

The host may also disable the back off step by setting a bit in register. In this case, the transmitter waits for the IFG before starting transmission. It should again be noted that for a late collision, the transmission is aborted and no back off is implemented.

During transmission, EtherNet MAC appends the Frame Check Sequence (FCS) to the packet, as shown in FIG. 5A. When enabled, a standard 32-bit FCS is used and a standard CRC computation is performed to generate error flags and associated interrupts, as required. For reference, the standard polynomial for the CRC is:

$$G(x)=x^{32}+x^{26}+x^{26}+x^{22}+x^{16}+x^{12}+x^{11}+x^{10}+x+x^8+x^7+x^5+x^4+x^2+x+1.$$

EtherNet MAC 107 performs two forms of destination address filtering, namely, perfect filtering where the address is checked for an exact match and hashing where the address is checked for inclusion in a group. In addition, in the Promiscuous mode when enabled in register, all destination addresses are accepted.

In the preferred embodiment, four programmable perfect address filters are provided, as well as an "all ones filter" for broadcast frames. A register is used to control whether a particular filter is used, with the four filters sharing the same address space. Preferably, the first filter is used to filter normal EtherNet addresses, as well as for detecting remote wake up frames and, optionally, pause (flow control) frames. In turn, the second filter is typically used for the recognition of pause frames, and may also be programmed to correspond to the multicast addresses of MAC control frames. The third and fourth filters preferably provide extra optional address match capabilities, for example, as extra individual address or multicast address filters.

Figure 5D:
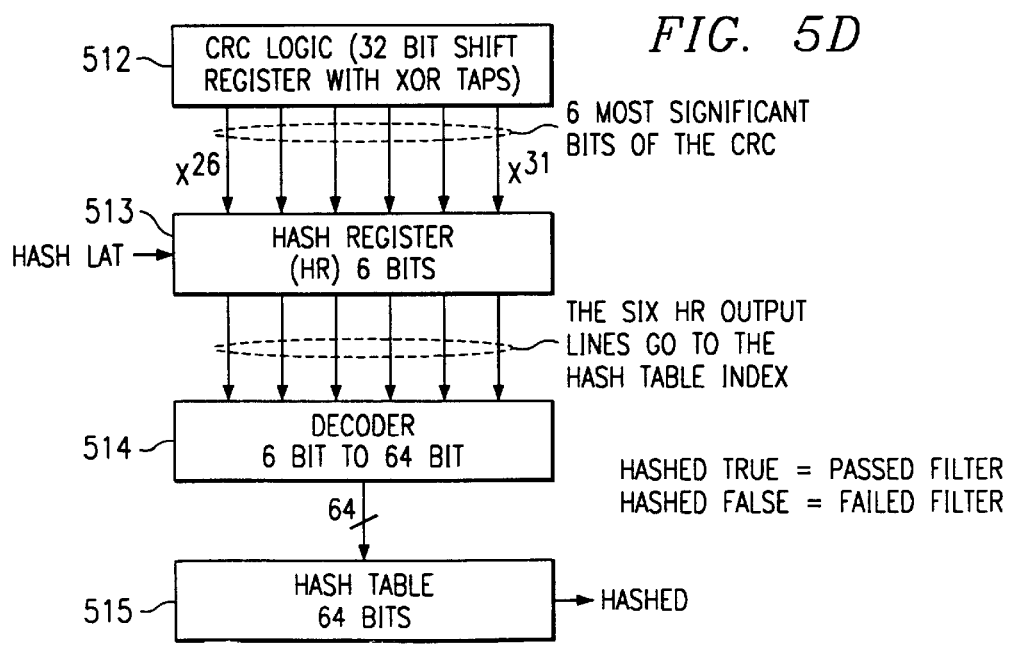
FIG. 5D depicts a schematic block diagram of the hash filter used in the EtherNet MAC.

A schematic block diagram of the hash filter is depicted in FIG. 5D. Generally, the hash filter is a 64-bit Logical (Multicast) Address Filter which performs Destination Address (DA) filtering hashed by CRC logic. CRC logic 512 initiates a CRC computation starting at the first bit of the current frame (i.e., the first bit of the DA, where the DA is a packet, such as shown in FIG. 5A, without the preamble). CRC Logic 512 includes a 32-bit shift register with specific Exclusive-OR feedback taps. After the entire DA has been shifted into CRC logic 512, the 6 most significant bits of the contents of CRC logic 512 are latched into 6-bit hash register (HR) 513. The contents of hash register 513 are passed through a 6-bit to 64-bit decoder 514. Each of the 64 bits from the decoder are presented to a hash table 515 one at a time. The output of the hash table determines whether the DA has passed the hash filter; when true, the DA has passed hash filtering and when false, the DA has failed the hash filter.

Whenever the hashed filter is passed on received good frames, the output of the hash register 513 is presented as the Hash Table Index. A received good frame is determined to be one without CRC error, and which is correct in length (64<length<1518). By setting a register bit, any received multicast frame passing the hash filter is accepted. A multicast frame is one which has IA[0]=1. If a second register bit is set, then a frame with any individual address frame AND passing the hash filter is accepted. An individual address frame is one which has IA[0]=0. For a frame to pass IAHashA it must have IA[0]=0 and pass the hash.

EtherNet MAC 107 provides special support for flow control by the transmission and reception of pause frames. A pause frame is a control frame that defines an amount of time for a transmitter to stop sending frames. Sending pause frames thereby reduces the amount of data sent by a remote station. The MAC can detect receive pause frames, and automatically stop its transmitter, for the appropriate period of time. To be interpreted as a pause frame: (1) the Destination Address must be accepted by one of the first two perfect address filters; (2) a Type field must match that programmed in a Flow Control Format register; (3) the next two bytes of the frame (MAC Control Opcode) must equal zero; and (4) the frame is of legal length with a good CRC. If accepted as a pause frame, the pause time field will be transferred to a Flow Control Timer register. The pause frame may be optionally passed on to the Host CPU or discarded.

When receive congestion is detected, an EtherNet MAC 107 driver may transmit a pause frame to the remote station, to create time for the local receiver to free resources. As there may be many frames queued in the transmitter, and there is a chance that the local transmitter is itself being paused, an alternative method is provided to allow a pause frame to be transmitted. In particular, by setting the Send Pause bit in a Transmit Control register, a pause frame will be transmitted at the earliest opportunity. This will occur either immediately following the completion of the current transmit frame. If the local transmitter is paused, the pause frame will still be sent, and a pause timer will still be decremented during the frame transmission. To comply with the standard, pause frames should be sent on full duplex links. The MAC does not enforce this, it is left to the driver. If a pause frame is sent on a half duplex link, it will be subject to the normal half duplex collisions rule and retry attempts.

EtherNet MAC 107 includes a receive descriptor processor which manages receive data frames. In particular, the host passes descriptors to the receive descriptor processor through a circular receive descriptor queue in a contiguous space in host memory. EtherNet MAC 107 returns status information through a circular receive status queue in host memory. The two independent queues support burst transfers, which reduce bus usage and latency. The location and characteristics (e.g. length) of these queues are set up in register.

Figure 5E:
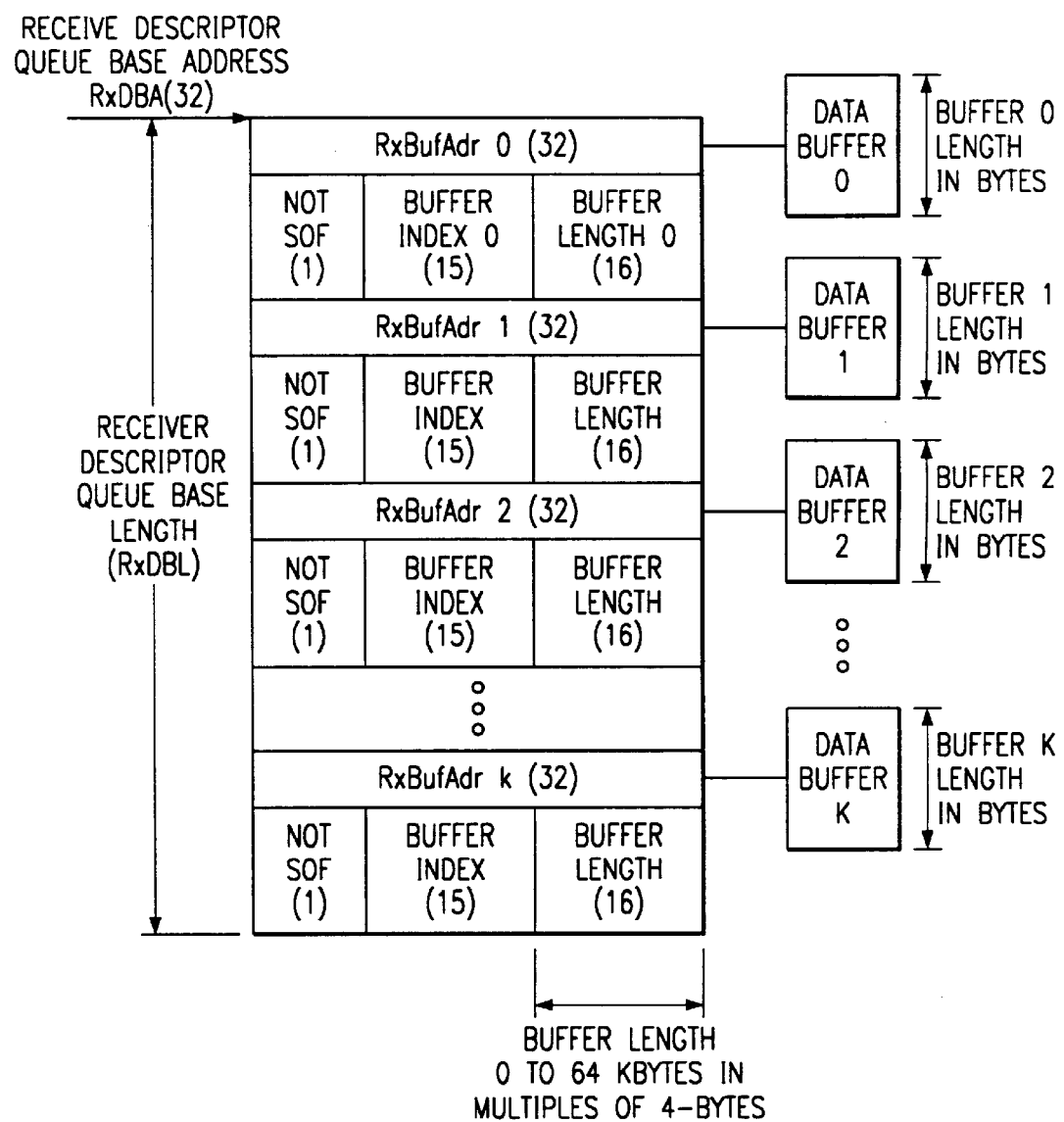
FIG. 5E depicts preferred receive descriptor format and frame fragment chaining.

Each receive descriptor is composed of two double words defining one data buffer entry. The first double word contains the data buffer address and fields defining the buffer length, the buffer index and a Not Start of Frame bit (set by the host when a new frame is not being started, for example, when frame fragments are being chained). Control of the use of the descriptors is handled using the Receive Descriptor Enqueue register (RxDEQ), where "enqueue" refers to the action of adding descriptors to the end of an existing queue. To enqueue receive descriptors, the CPU writes a number of available descriptors to the RXDEQ register, and that number is automatically added to the existing number of available queue entries. When the MAC reads descriptors into its on local storage (internal buffer), the number read is subtracted from the total. The CPU can read the total number of unread valid descriptors left in the queue from the RxDEQ. A preferred receive descriptor format and frame fragment chaining are illustrated in FIG. 5E.

EtherNet MAC 107 uses the Receive Status Queue to send status messages to the host. Typically, receive status entries are written to the queue by EtherNet MAC 107 at the end of a header, end of a buffer or the end of a frame. More generally, the status messages are preferably written after the completion of the given data transfer. Receive status messages are also formed from two double words. The first double word includes fields indicating receive error status, end of buffer and/or end of frame indicators, address matching, and a hash table index, among other things. The second double word includes fields for a receive frame process bit, a buffer index corresponding to the status entry, and a frame length identifier.

The Receive Status Enqueue register is used by the CPU to pass free status locations to the EtherNet MAC. To simplify this process the CPU writes the number of additional free status locations available to this enqueue register. The MAC adds the additional count to the count of previously available entries to determine the total number of available receive status entries. When the MAC writes status messages to the queue it subtracts the number written from this total.

Figure 5F:
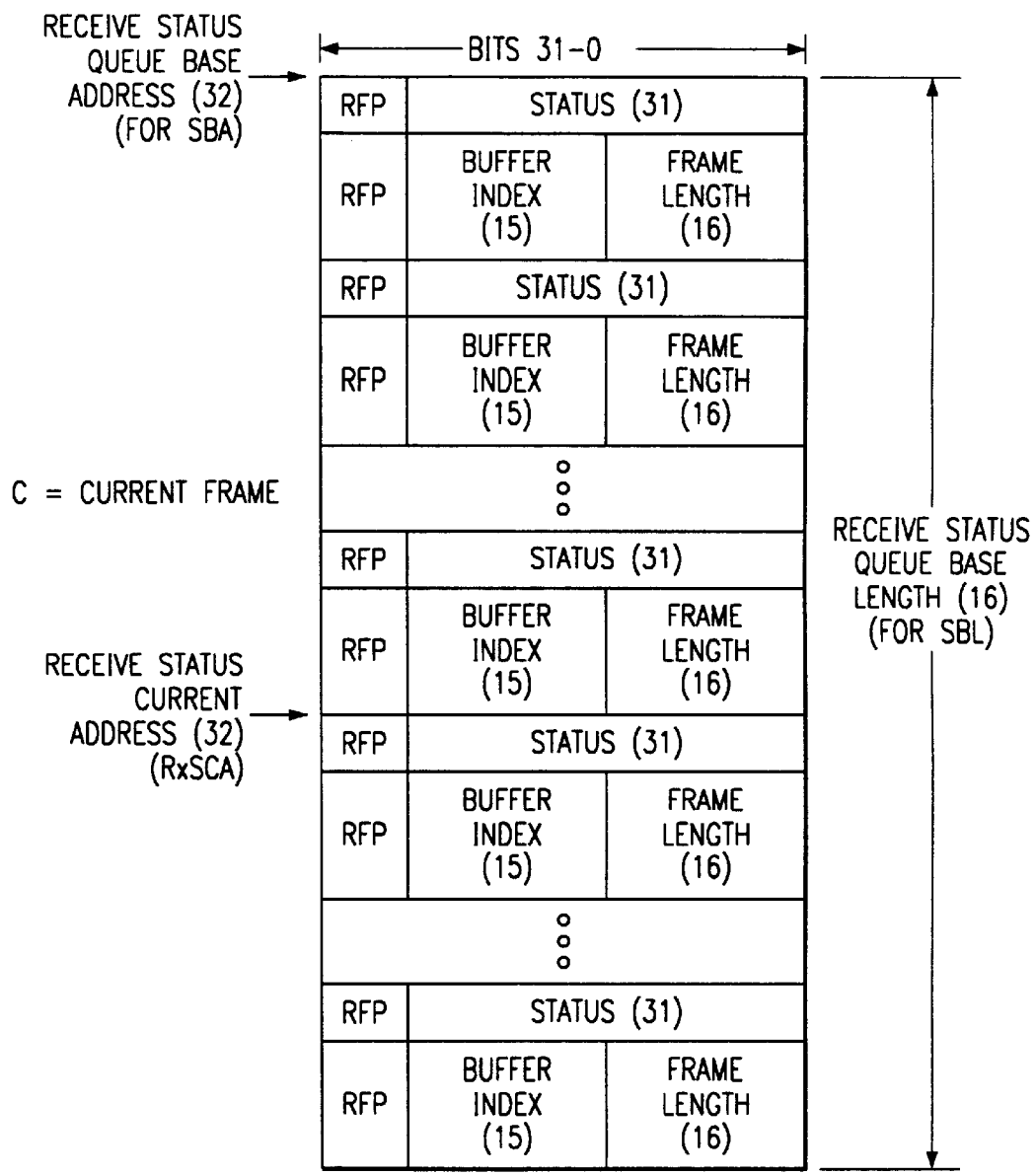
FIG. 5F depicts a preferred formatting for the receive status queue.

A preferred formatting for the receive status queue is shown in FIG. 5F.

Figure 5G:
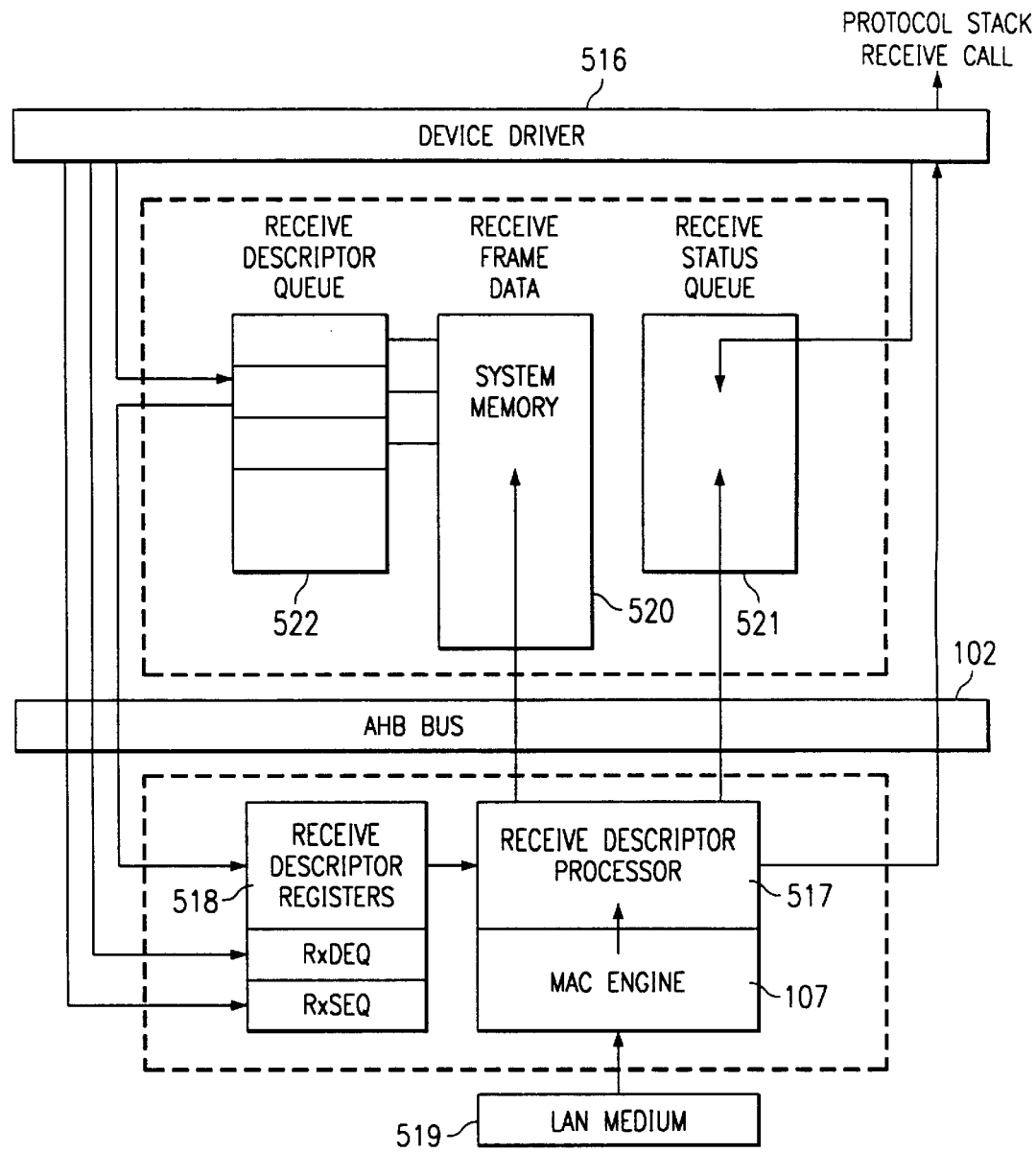
FIG. 5G illustrates the receive data flow through the EtherNet.

The receive data flow through EtherNet MAC 107 is illustrated with reference to FIG. 5G, and the following table:

TABLE 1

| | |
|---|---|
| 1. | Host Driver 516 initializes a given number of receive descriptors in receive descriptor queue 522 |
| 2. | Driver 516 sets the register field RxDeq with the additional number of receive descriptors. |
| 3. | On-chip Descriptor Processor 517 fetches descriptors into internal FIFO. |
| 4 | The address of the next receive data buffer is loaded into the Receive Buffer Current Address register of Receive Descriptor Processor 517 from Receive Descriptor Registers 518. |
| 5. | A frame is received from the LAN medium 519. |
| 6. | MAC Engine 107 passes the frame data to the Receive Data FIFO of processor 517. |

TABLE 1-continued

7. The Receive Descriptor Processor stores the frame data into system memory 520 (Steps 5, 6, and 7 can overlap).
8. End of frame status is written to the Receive Status Queue 521; RxSeq decremented.
9. Driver 516 interrupted if interrupt conditions met.
10. Received frame passed to the protocol stack.
11. Driver 516 clears the Receive Frame Processed bit in Status Queue 521.
12. Driver 516 writes number of entries processed in the status queue, freeing them for future use by the MAC 10.
13. After the driver 516 gets the used receive buffers back from the stack, the driver may repeat step 2.

Receive errors are categorized as hard errors and soft errors. A soft error indicates that a frame was not successfully received; this type of error must be addressed by the host driver. Soft errors include: CRC errors, receiver overrun, frames too long, or frames too short. Hard errors are reliability induced errors and include AHB bus access errors, parity errors (when enabled), system errors, and master or target aborts. Hard errors stop receive DMA activity, and require host intervention for recovery.

Figure 5H:
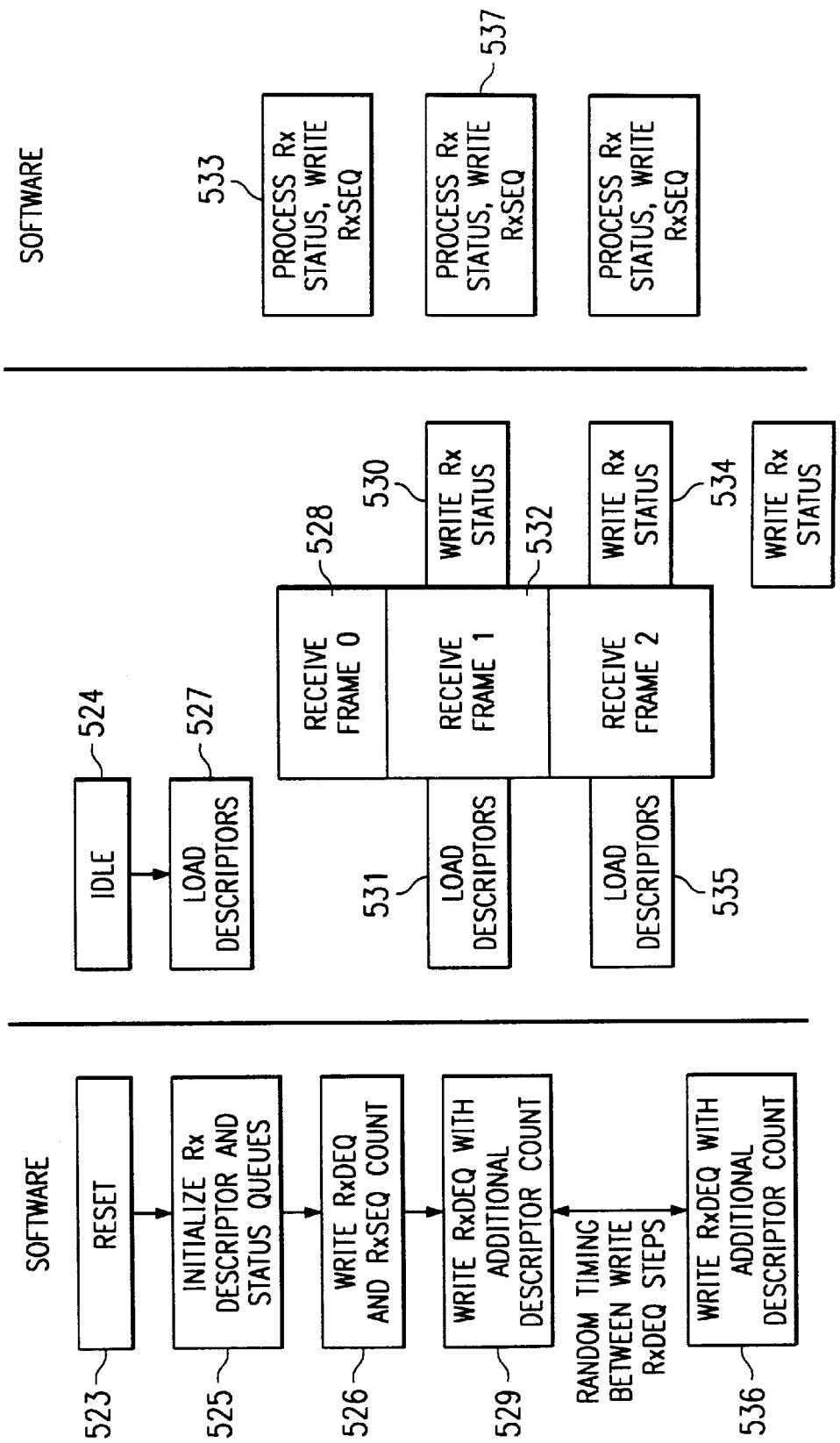
FIG. 5H illustrates the hardware—software interaction during the EtherNet receive process.
Figure 51:
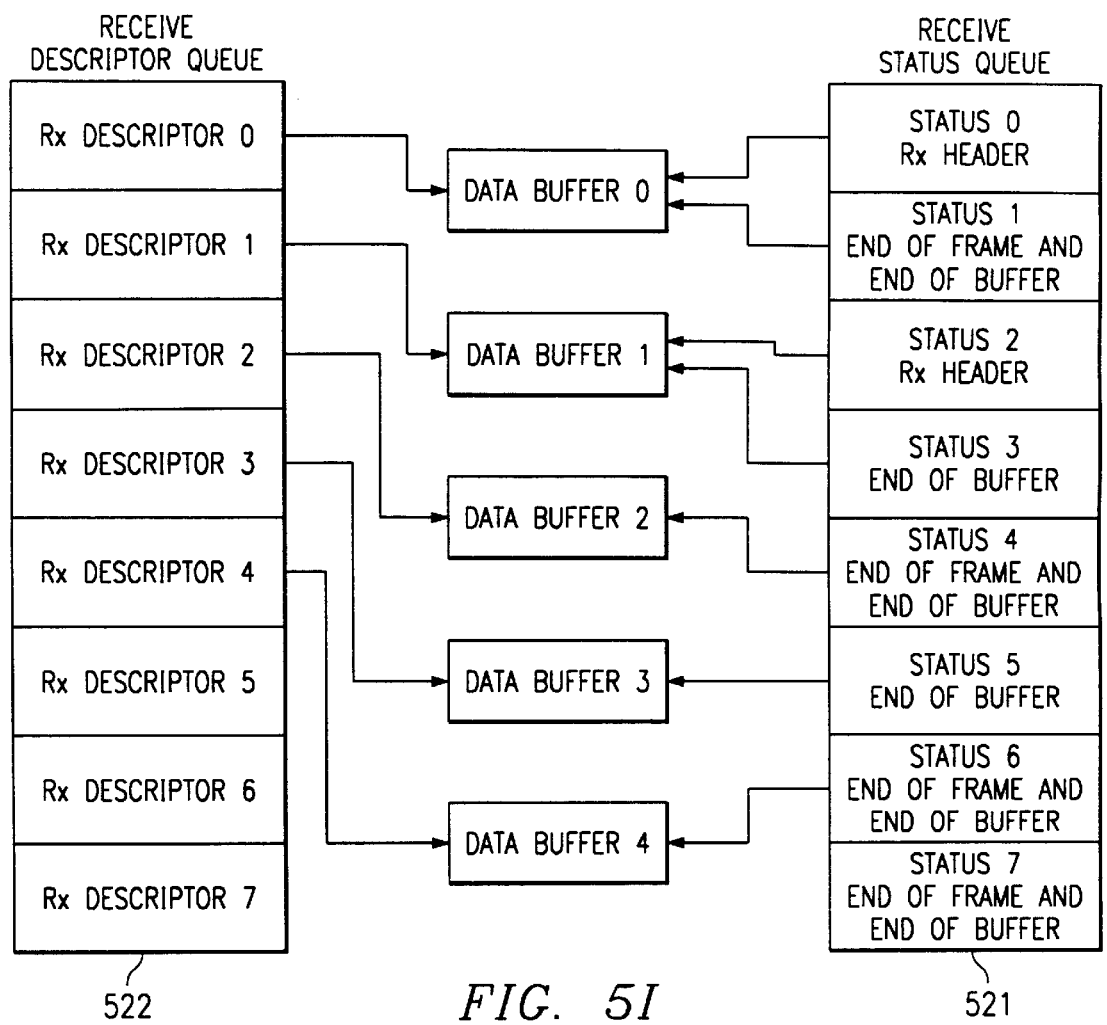

FIG. 5H illustrates the hardware—software interaction during the receive process. Initially the software resets at Step 523 and the hardware is in an idle mode at Step 524. The receive descriptor and status queues are initialized by software at Step 525 and additional descriptors and status entries are added to the corresponding queues at Step 526. At Step 527, the descriptors are loaded by the hardware and the first frame is received at Step 528.

Additional descriptors are written into the queue at Step 529. At the end of the first frame, a corresponding entry in the transmit status queue is written to (Step 530). At Step 531, additional descriptors are loaded by the hardware while another frame of data is received at Step 532. At Step 533, the next status entry in the receive status queue is processed by the host and additionally entries made available by the host.

This process generally continues in a similar manner, with the hardware updating the status queue at Step 534 and loading new descriptors at Step 535. The software adds additional descriptors to the descriptor queue at Step 536, processes status entries from the status queue and then frees entries at Step 537.

An exemplary state of the receive queues following the reception of four frames is shown in FIG. 5I. The first frame uses Data buffer 0 only and has two status entries associated with it. The first status entry (status 0) is for the reception of a receive header and the second (status 1) for the end of frame/buffer, with both status entries pointing to the beginning of data buffer 0. The second frame occupies two buffers (data buffers 1 and 2), and is associated with three status entries (2, 3, and 4). Status 2 entry is for the receive header, status 3 entry for the end of buffer 1 indicator (e.g. frame size larger than buffer size), and status 4 entry for the end of frame/buffer indicator. The next two frames both occupy one data buffer each and require one status entry each. (This could be the case for short frames which do not exceed the header size or the buffer size.) The result is that the status queue may be used at a different rate than the descriptor queue, based on the type of traffic and the options selected.

Figure 5J:
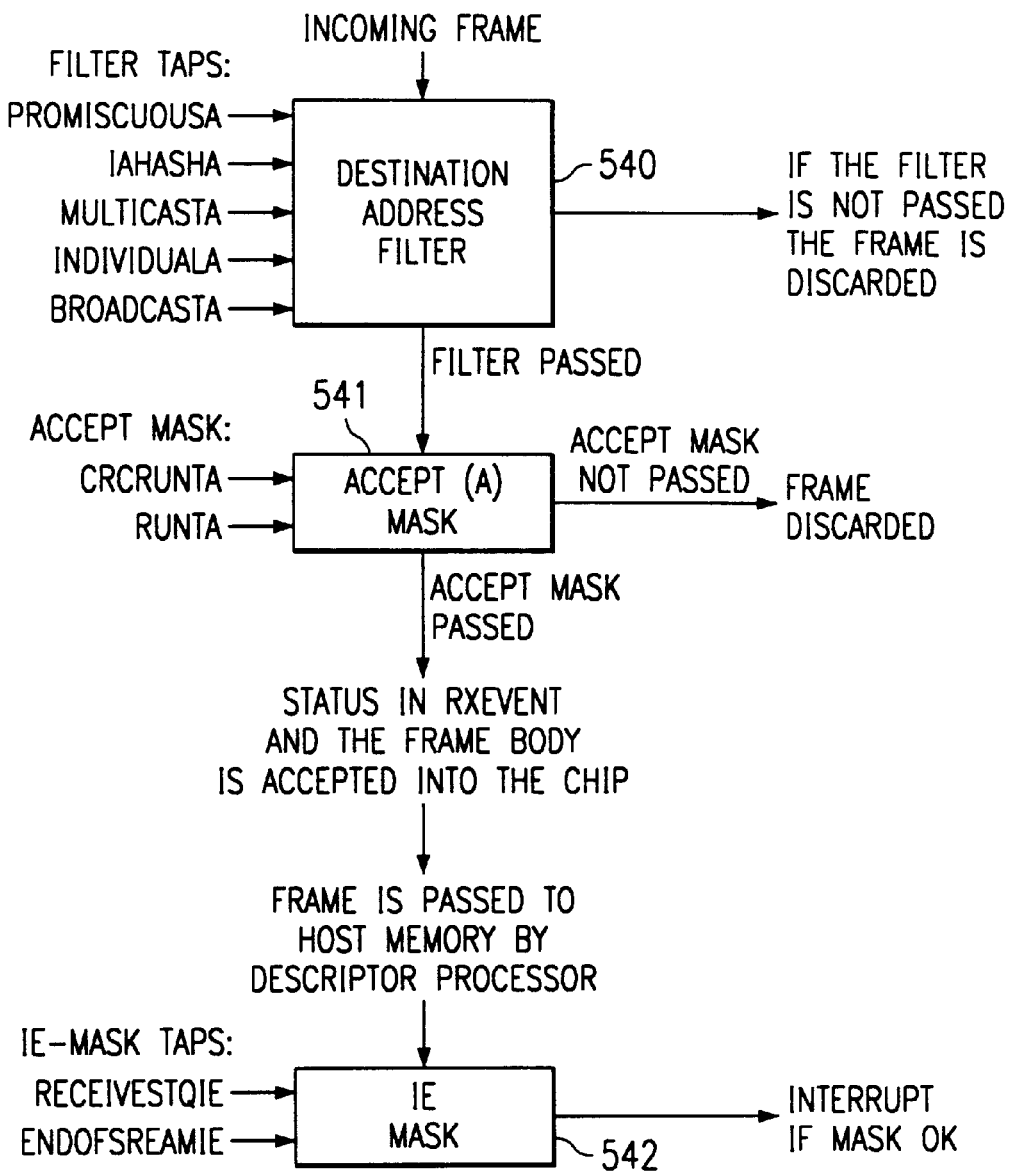
FIG. 5J depicts a preferred receive frame pre-processing procedure.

A receive frame pre-processing procedure is shown generally in FIG. 5J. First the frame is either passed on to the next level or discarded according to the destination address (DA) filter 540. An accept mask 541 is then applied. A frame is accepted when the frame data are brought into and through the chip. Frames not passing the accept mask are discarded. An interrupt (IE) mask 542 makes the decision on causing an interrupt.

Transmit descriptors are passed from the CPU to the MAC via a circular transmit descriptor queue. The location and size of the queue are set at initialization by the host by writing to register. Enqueueing descriptors is the process of adding descriptors to an existing queue and is achieved by writing an additional number of descriptors to the Transmit Descriptor Enqueue register. The written value will be added to the previous value to keep a running total, as descriptors are read by the MAC the total is decremented. The running total is available by reading the enqueue register. It should be noted that one frame may be described by more than one descriptor, with the final descriptor containing the EOF bit, and that not all the descriptors for a frame need to be supplied at once.

Figure 5K:
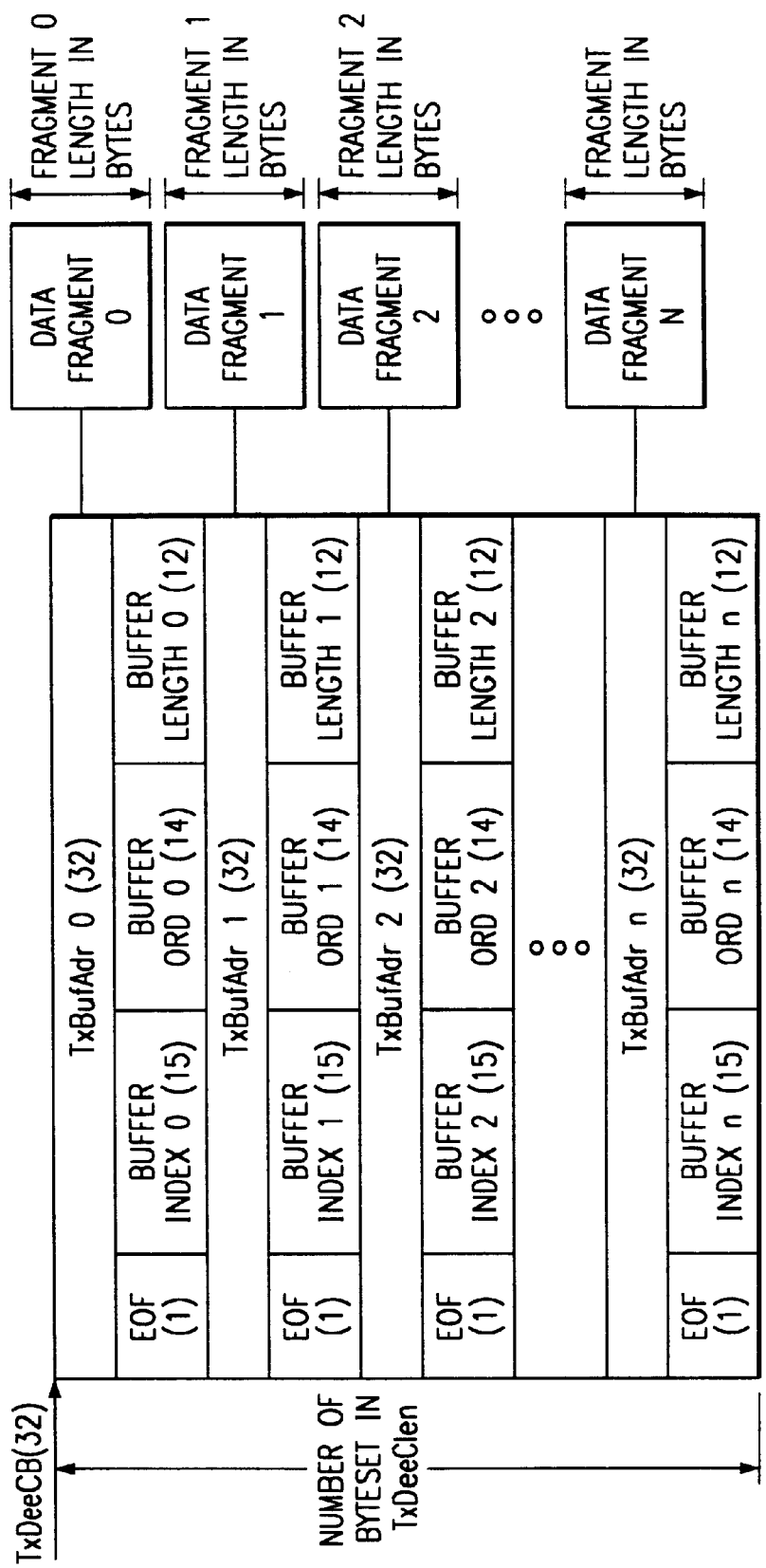
FIG. 5K depicts preferred transmit descriptor format and exemplary data fragments.

A preferred transmit descriptor format and exemplary data fragments are shown in FIG. 5K. Transmit descriptors preferably consist of two double words. The first double word contains the transmit buffer address pointer. The second double word includes the end of frame bit and the transmit buffer index for tracking the transmit buffer with the host. The second word also includes an abort frame bit for terminating a frame with a bad CRC, and a buffer length field representing the byte count in the transmit buffer.

Figure 5L:
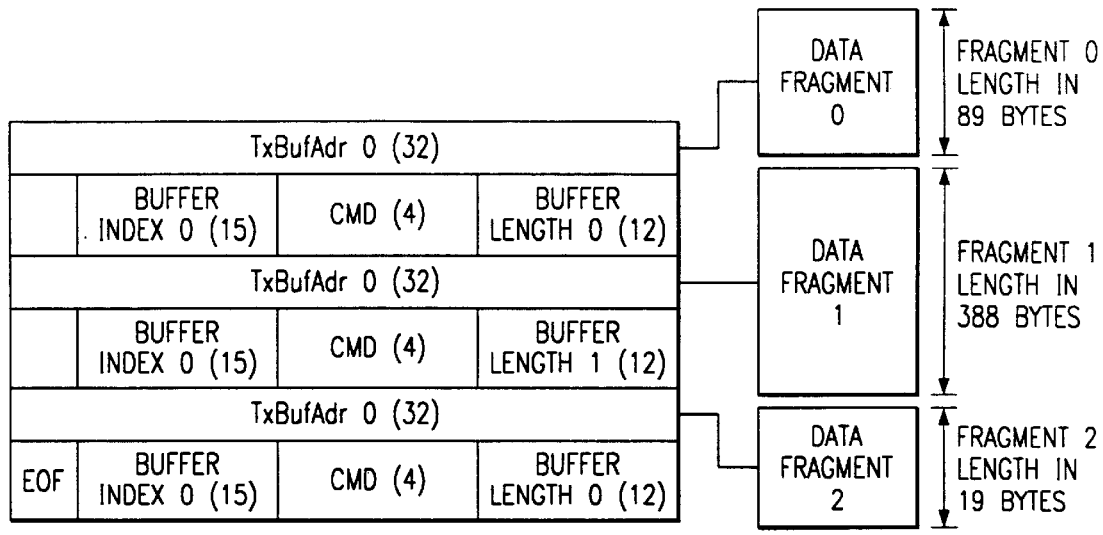
FIG. 5L illustrates an exemplary specific case of an EtherNet transmission where one frame is transmitted from three fragments.

FIG. 5L illustrates a specific case where one frame is transmitted from three fragments. After hardware has acquired the medium and transmitted the preamble, fragments 0, 1, 2 are transmitted in order for a total of 446 bytes (39+388+19). Since the CRC bit in the first frame fragment is clear, the hardware appends the 4 byte CRC making the total frame length 430 bytes. Finally, the end-of-frame indicator is sent according to normal EtherNet procedures.

Figure 5M:
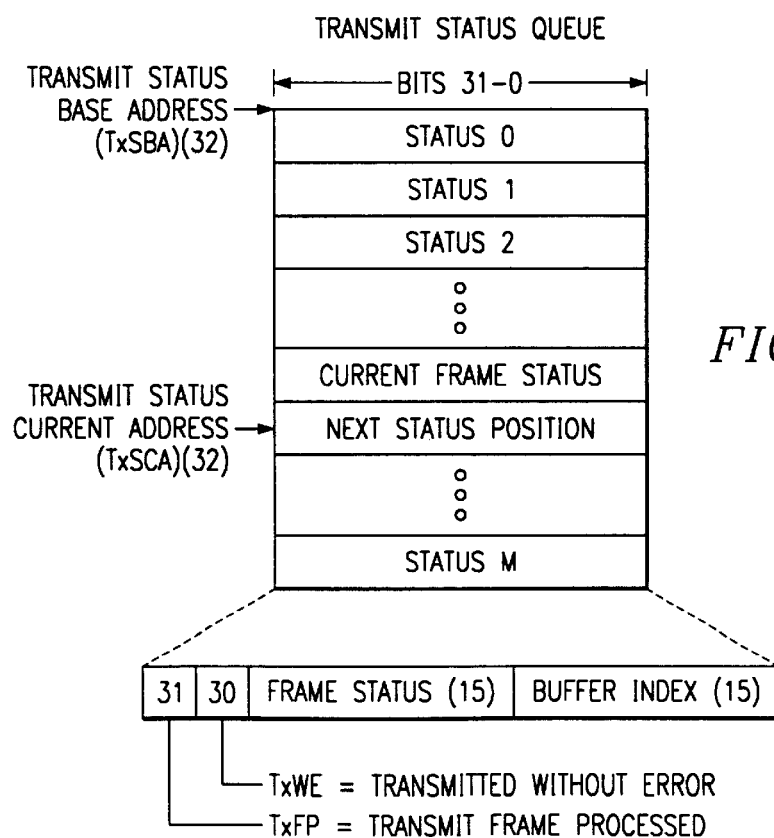
FIG. 5M illustrates the EtherNet transmit status queue format.

A Transmit status queue is used to pass transmit status messages from EtherNet MAC 107 to the host. Preferably, the status queue is also a circular queue in contiguous memory space. The location and size of the queue are set at initialization by the host by writing location and size data in register. The transmit status queue format is shown in FIG. 5M. Generally, one transmit status entry is posted per transmit frame, regardless of the number of transmit descriptors used for that frame. A preferred entry includes a transmit frame processed bit, transmit without error bit, frame abort and loss of CRS bit, out-of-window bit, under-run and excessive collision bits, a field representing the number of collisions, and the transmit buffer index.

Figure 5N:
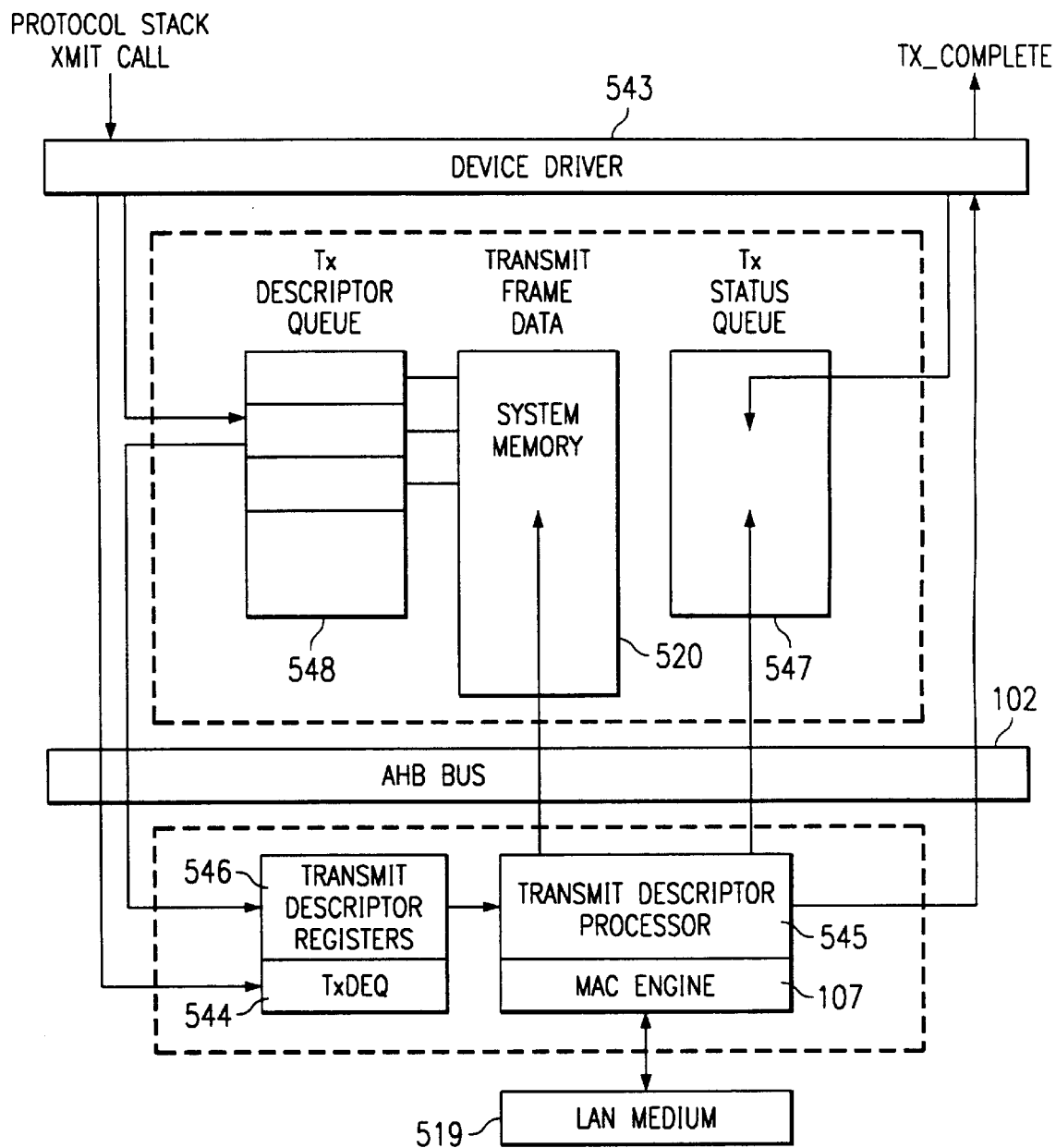
FIG. 5N illustrates the general EtherNet transmit flow.
Figure 50:
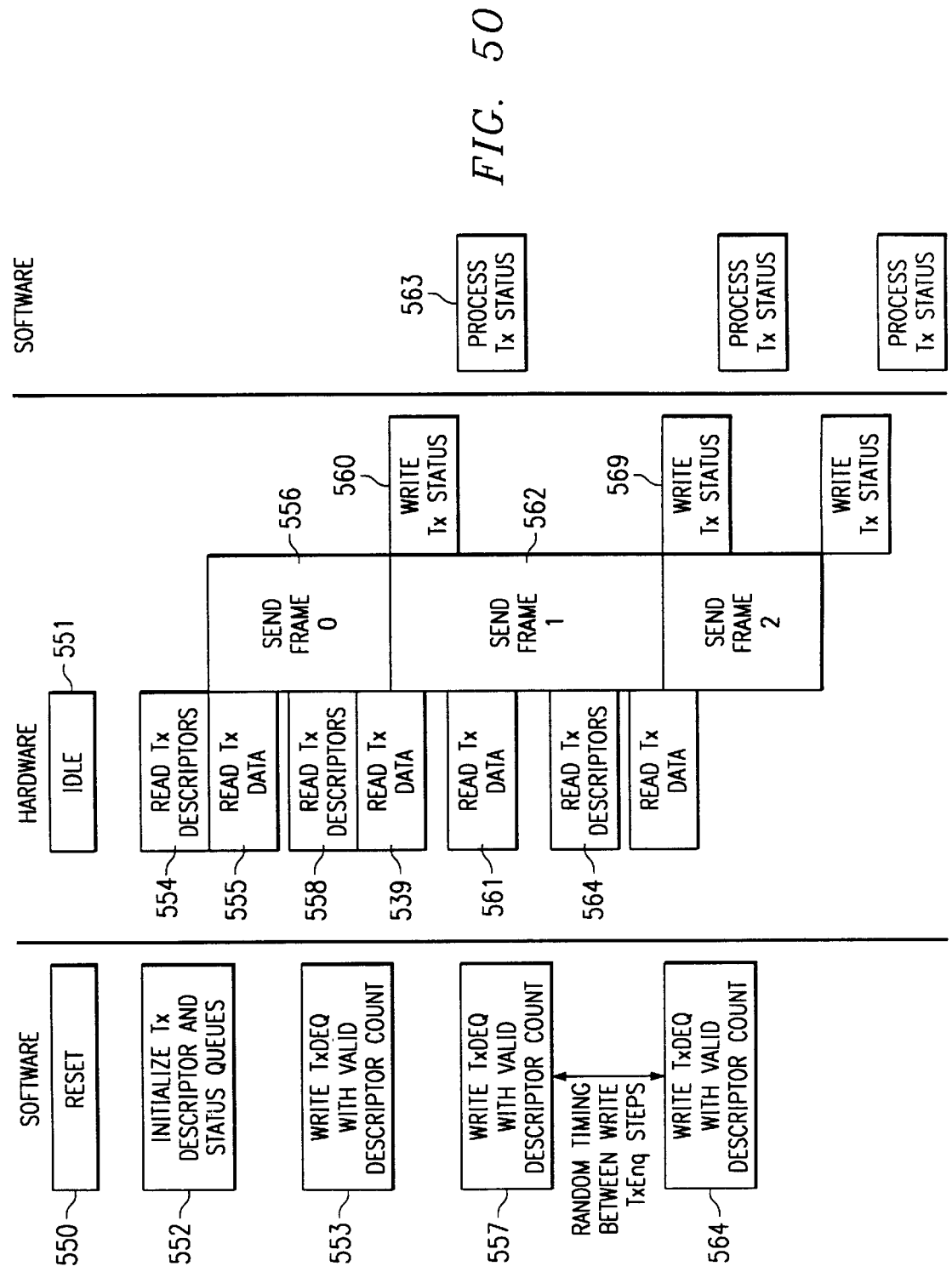

The general transit flow is shown in FIG. 5N and the following table:

TABLE 2

1. The Host Protocol stack initiates a transmit frame.
2. The Host Driver 543 parses protocol stack buffer into Transmit Descriptor Queue
3. Driver 543 writes number of additional entries to the Transmit Descriptor Enqueue (TxDEQ) register 544.
4. On-chip Transmit Descriptor Processor 545 fetches descriptor information from registers 546.
5. On-chip Descriptor Processor 545 initiates data move.
6. A frame of data fetched from system memory 520 into the transmit FIFO within processor 545.
7. Frame transmitted onto LAN medium.519 (Steps 6 and 7 can overlap).
8. End of frame status written to status queue 547
9. Driver 543 interrupted if interrupt conditions met.
10. Driver 543 processes the transmit status.
11. Driver 543 informs the protocol stack that transmit is complete.

Transmit error conditions are categorized as hard and soft errors. A soft error indicates that the frame was not successfully transmitted and requires a graceful recovery by the host driver. Soft errors include: excessive collisions, SQE error (if connected to a MAU). Hard errors are typically related to reliability problems, such as AHB errors, parity errors (if enabled), system errors, master and target aborts.

Hard errors cause the descriptor processor to halt operation, allowing the host a chance to determine the cause of error and reinitialize and restart the bus master operations. Most soft errors do not cause the frame processing operations to halt and the descriptor processor simply flags the error and continues on to the next frame. The exception is on a transmit underrun, where bit Underrun Halt, gives the option of continuing on to the next frame or halting transmit frame processing. By halting the transmit frame processing the CPU has the ability to reset the transmit descriptor processor registers to point to the start of the failed frame and reinitialize. This will cause EtherNet MAC 107 to reattempt transmitting the failed frame next thereby allowing the order of frame transmission to be maintained.

FIG. 5O illustrates the hardware—software interaction during the transmit process. Initially the software resets at Step 550 and the hardware is in an idle mode at Step 551. The transmit descriptor and status queues are initialized by software at Step 552 and the transmit descriptor count is written to register at Step 553. At Step 554, the descriptors are read by hardware followed by a read out of data from the system at Step 555. The first frame is then sent at Step 556.

The transmit descriptor count is updated in register at Step 557. During the transmission of the first frame, additional transmit descriptors are read from the queue at Step 558, followed by a read of data from system memory at Step 559. At the end of the first frame, a corresponding entry in the transmit status is written to the transmit status queue (Step 560). At Step 561, additional data are read by the hardware while another frame of data is transmitted at Step 562. At Step 563, the next status entry in the transmit status queue is processed and additionally entries made available by the host.

This process generally continues in a similar manner, with the hardware reading descriptors from queue at Step 564 and new data Step 565. The software adds additional descriptors to the descriptor queue at Step 566, processes status entries from the status queue, and then frees entries at Step 567. Status entries are written out at Step 568 into the status queues.

With regards to EtherNet MAC 107, interrupts can be associated with on-chip status or with off-chip status, off-chip status being status that has been transferred to either the transmit or receive status queues. The status for any outstanding interrupt events is available via two different register addresses (Interrupt Status Preserve and Interrupt Status Clear).

Reading the Interrupt Status Preserve field has no affect on the bits set in the register; they may be explicitly cleared by writing a one back to any of the bit positions. This allows the CPU to process interrupt events across multiple routines, only clearing the bits for which it has processed the corresponding events.

The Interrupt Status Clear will remove the status for all outstanding events, when it is read. This provides a quick mechanism for the CPU to accept all the outstanding events in one read, and not incur the additional 10 cycles typically required in specifically clearing the events.

SDRAM interface 108, operating off AHB 102, is preferably based on an ARM PL090 SDRAM controller and a set of associated configuration registers. In the illustrated embodiment, SDRAM interface 108 shares address bus, data bus and DQMn signals with the SRAM controller and PCMCIA interface, arbitrated by external bus interface circuitry under a fixed priority scheme (SDRAM, SRM, PCMCIA and TIC in order from highest to lowest). Preferably, all SDRAM accesses are performed using quad bursts.

The SRAM interface (block 109) is preferably based on an ARM PL090 Static Memory Controller. Additionally, the SRAM interface supports programmable base addresses and 8 external chip selects and associated mask registers. A mix of 32-bit, 16-bit and 8-bit devices are supported.

Block 109 additionally includes a slave-only V2.1 compliant PCMCIA PCCard Interface operating off high speed bus 102. The PCCard Interface shares external data and address buses with the Static Memory Interface, Dynamic Memory Interface and the Test Interface Controller. Arbitration between these blocks and the external resources is accomplished through an External Bus Interface (EBI) unit. Once granted access to the external buses, the PCCard Interface controls the buses until the current data transfer is complete.

In the preferred embodiment, the PCCard Interface includes a controller based on an ARM Static Memory Controller which controls PCCard accesses to the system memory, I/O and attribute address spaces. Dynamic bus sizing is used wherein the transfer data width matches the target data I/O width. Moreover, in this embodiment, multiple card accesses are performed to complete the requested bus transfer for either read or write card operations. For example, during a word write to an 8-bit PCCard, the PCCard Interface performs 4 card writes. Alternatively, half-word writes to an 8-bit card are performed using double card writes, word writes to a 16-bit card using double card writes, and so on.

The PCCard Interface is configured by the system initialization code through a corresponding set of registers. Three of these registers are used to control access to the memory, I/O and attribute address spaces. Another register is used to control card detection and interrupts and a fifth controls general interface operation. In the default state, these registers are set to the timing requirements compatible with the slowest PCCard and the fastest bus speed. Additionally, the wait states for both read and write operations are programmable from between 1 and 31 AHB 102 clock (HCLK) cycles (the duration of the read and write pulses is the number of wait states plus 3 AHB clock cycles).

In the preferred embodiment, external address buffers and data bus transceivers are used to make the PCMCIA PcCard specification. Additionally, in the preferred embodiment, an external switch module is used to control the PCCard power supplies. Generally, the PCCard Interface, under firmware control, determines whether or not a PCCard is present. If a card is inserted, an interrupt is issued to the processor and firmware interrogates the PCCard interface to determine the appropriate switching of the PCCard power supplies.

An interrupt is also generated when a change of state occurs at the PCCard detect pins and at chip reset. Specifically, if a card is not present at chip reset, an interrupt is generated while if a card is present, no interrupt is generated.

The PCCard interface preferably communicates to an associated PCCard slot using tri-state buffers.

JTAG/TIC interface 110 supports testing in compliance with IEEE Std. 1149.1-1990, Standard Test Port and Boundary Scan Architecture. The Test Interface Controller supports on-chip testing of the various blocks on high speed bus 102. In the preferred embodiment, testing through interface 110 is in accordance with the specification of ARM920T processor 101. In particular, the JTAG part of the interface takes advantage of the ARM Multi_ICE in-circuit emulator while the TIC portion of the interface utilizes an ARM Test Interface Controller, which is a bus master on AMBA bus 102 and allows an off-chip testing device access to the AMBA peripherals.

USB Controller 111 is preferably configured for three root hub ports and includes an integrated transceiver. This embodiment complies with the Open Host Controller Interface Specification for USB, Revision 1.0.

LCD DAC interface 112 provides an analog DC voltage for driving LCD contrast controls, preferably generated from a resistor ladder. The DAC preferably is a 64-step digital to analog converter.

Bridge 113 interfaces high speed bus 102 with the relatively slower AMBA Peripheral Bus (APB) 103. Bridge 113 is a slave on high speed bus 102 and the only master on peripheral bus 103, driving addresses, data and control signals during peripheral accesses. While bridge 113 itself contains no registers, it does decode register selects for all peripherals on peripheral bus 103. The preferred system memory map is as follows.

TABLE 3

| Start | End | Size | Usage |
| --- | --- | --- | --- |
| 0000_0000 | 0000_3FFF: | 16 K | Internal ROM Memory (Remap Low) |
| 0000_4000 | 1FFF_FFFF: | 255.984 Meg | External DRAM Memory (Remap Low) |
| 0000_0000 | 1FFF_FFFF: | 256 Meg | External DRAM Memory (Remap High) |
| 2000_0000 | 7FFF_FFFF: | 1.5 G | External SRAM/Flash/ROM Memory |
| 8000_0000 | 87FF_FFFF: | 128 Meg | Memory mapped AHB control registers |
| 8800_0000 | 8FFF_FFFF: | 128 Meg | Memory mapped APB control registers |
| 9000_0000 | 9FFF_FFFF: | 256 Meg | Reserved |
| A000_0000 | A3FF_FFFF: | 64 Meg | PCMCIA Memory Space |
| A400_0000 | A7FF_FFFF: | 64 Meg | PCMCIA I/O Space |
| A800_0000 | ABFF_FFFF: | 64 Meg | PCMCIA Attribute space |
| AC00_0000 | AFFF_FFFF: | 64 Meg | Reserved |
| B000_0000 | FFFF_FFFF: | 1.25 G | External SRAM/Flash/ROM memory |

Analog touch screen interface 114 performs hardware scanning for 4-, 5-, 7-, and 8-wire analog resistive touch screens. Exemplary schematic diagrams of 4-, 5-, 7- and 8-wire touchscreens are shown in FIGS. 6A–6D respectively. In each case, when a point on the touch screen is depressed, front and backside conductive layers touch and a resistive contact is made. In the 4- and 8-wire versions, the contact point is identified by first driving a voltage on the X layer through busbars 601b and 601d from the X+ and X− terminals and measuring the voltage at the Y+ and/or Y− terminals, and then by measuring a voltage driven on the Y-plane Y+ and Y− terminals at the X+ and/or X− terminals. The results of the two measurements are compared to predetermined calibration voltages, to determine position. The 8-wire version includes SX and SY lines provide feedback to the associated analog to digital to analog converter for use as a measurement reference.

In the 5- and 7- wire embodiments, a constant voltage is applied at terminals V+ and V− and the Z+/− terminals are used for switching the X and Y axes. The signal at the Wiper terminal is sampled to read the position data. The 7-wire touchscreen includes reference feedback lines to the associated analog to digital converter.

Figure 6A:
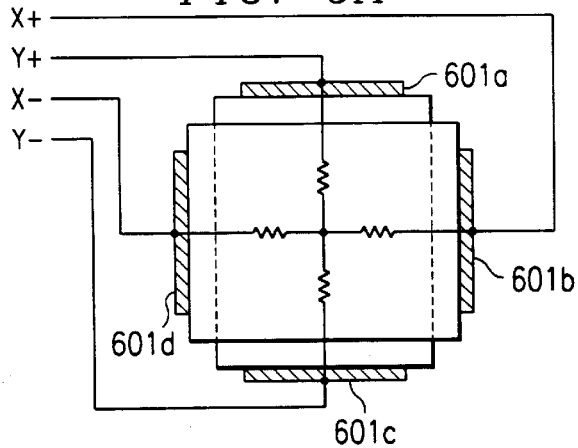
FIGS. 6A–6D depict exemplary schematic diagrams of 4-, 5-, 7- and 8-wire touchscreen input/output devices.
Figure 6B:
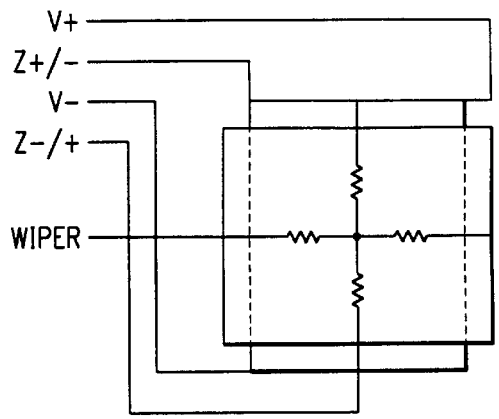
Figure 6C:
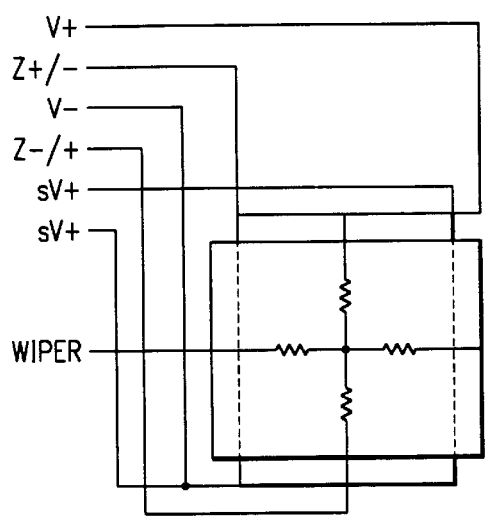
Figure 6D:
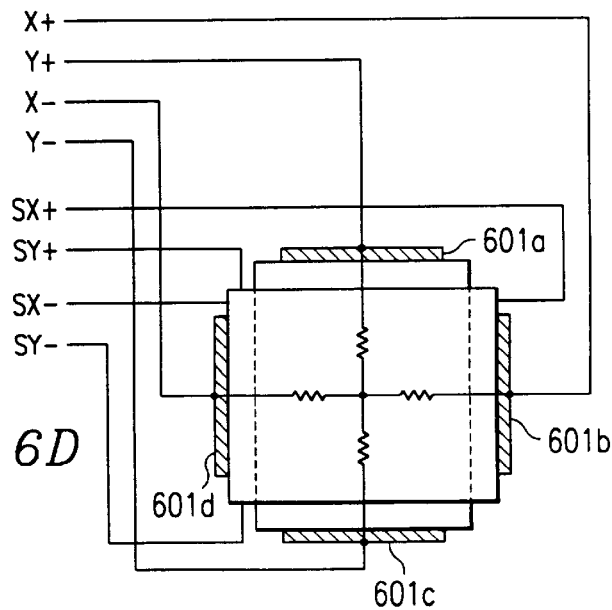
Figure 6E:
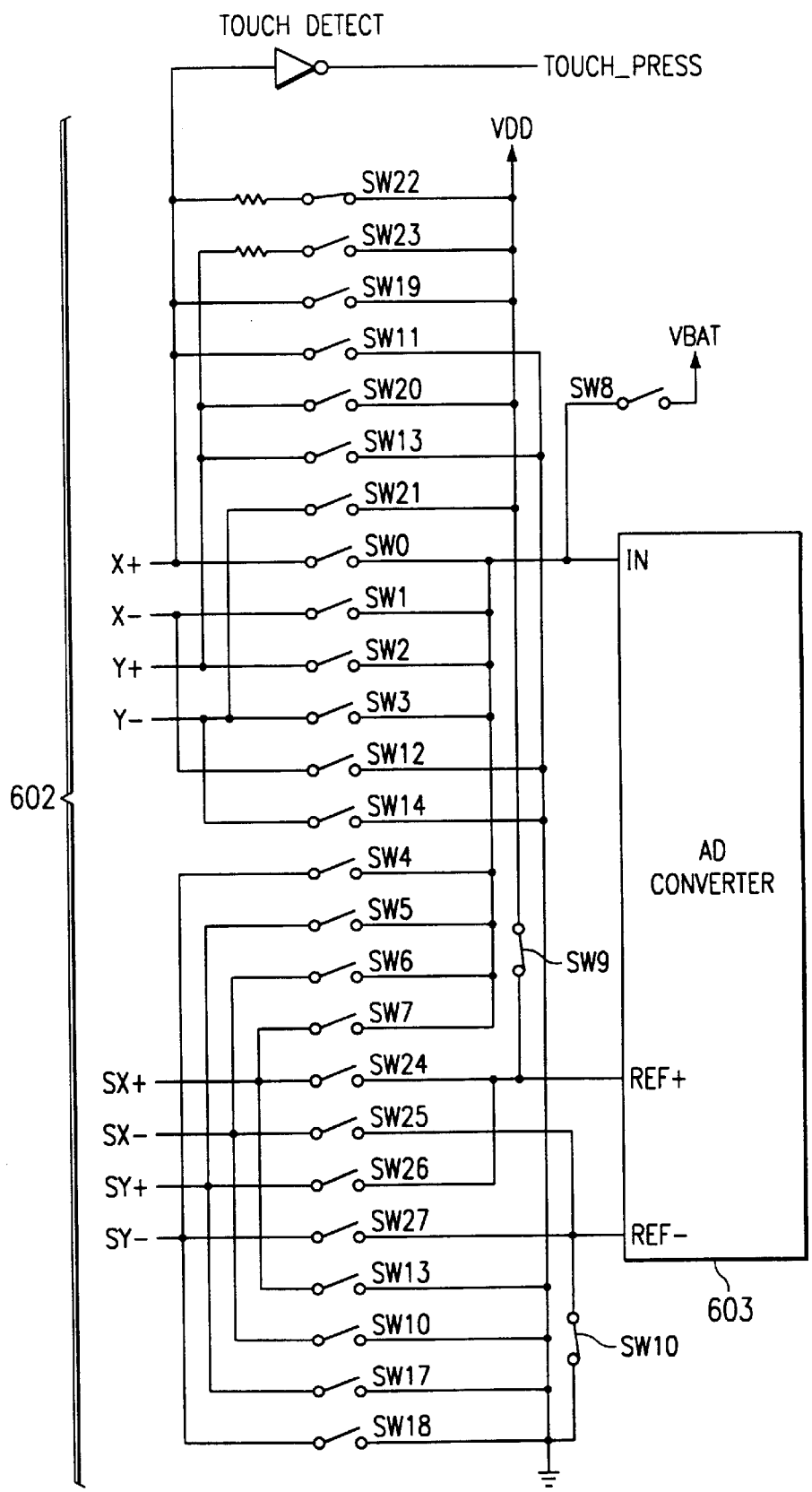
FIGS. 6E–6F are electrical schematic diagrams showing the typical circuit connections to the system touchscreen interface for an 8-wire touchscreen embodiment.
Figure 6F:
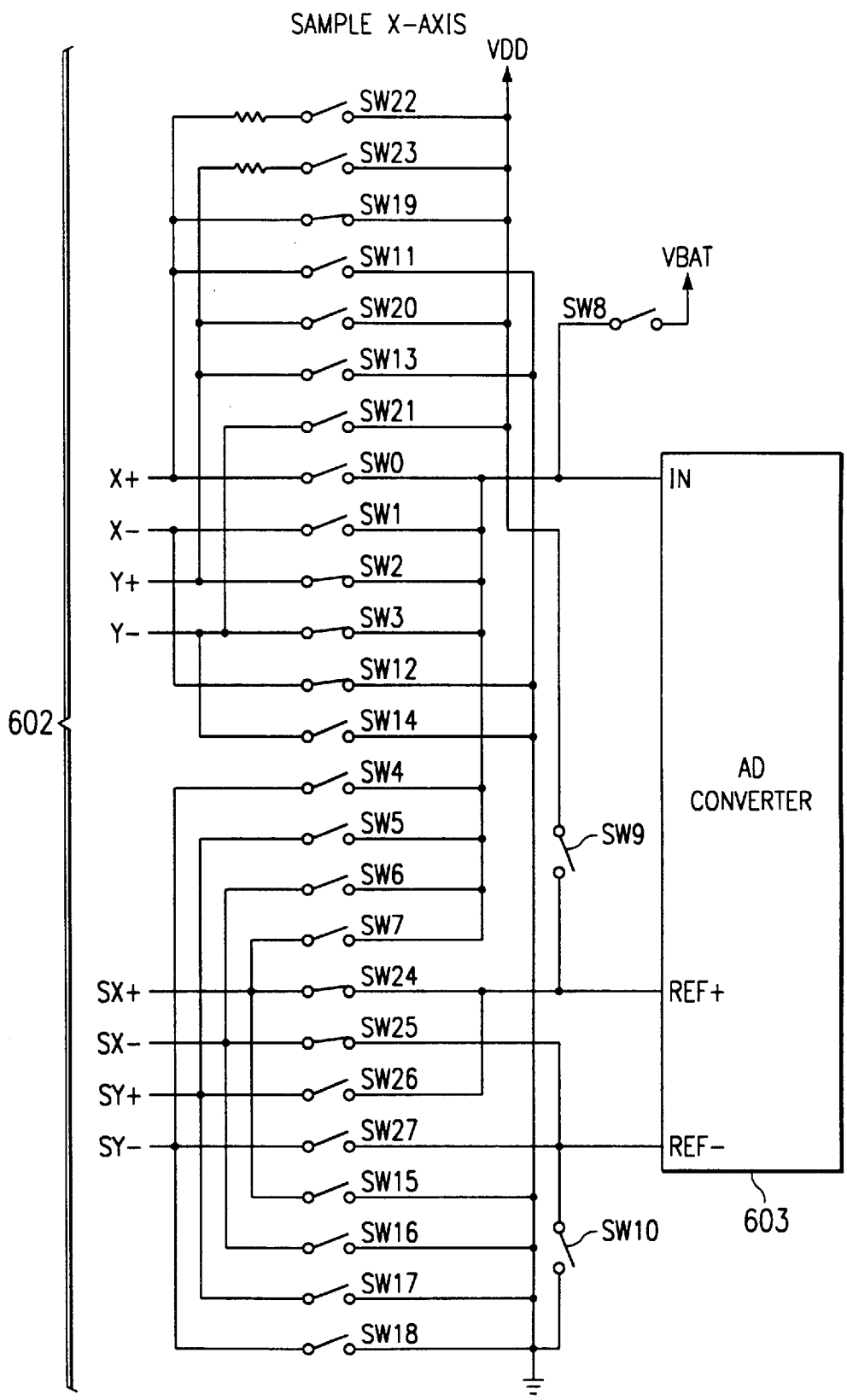
Figure 6G:
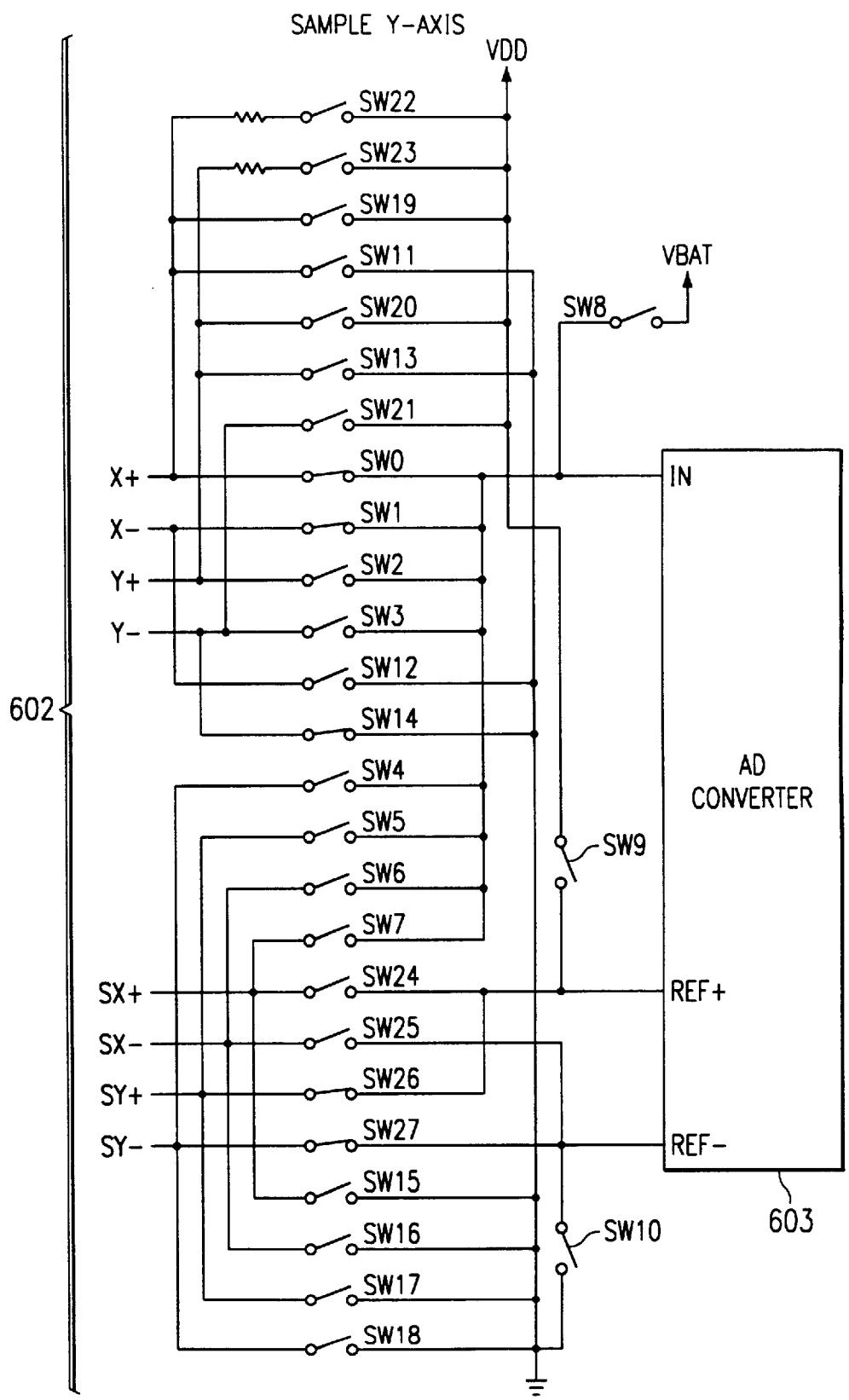
FIG. 6G illustrates the configuration in which a voltage is being driven across the Y-axis and the X-terminals and sampled against a feedback signal.
Figure 6H:
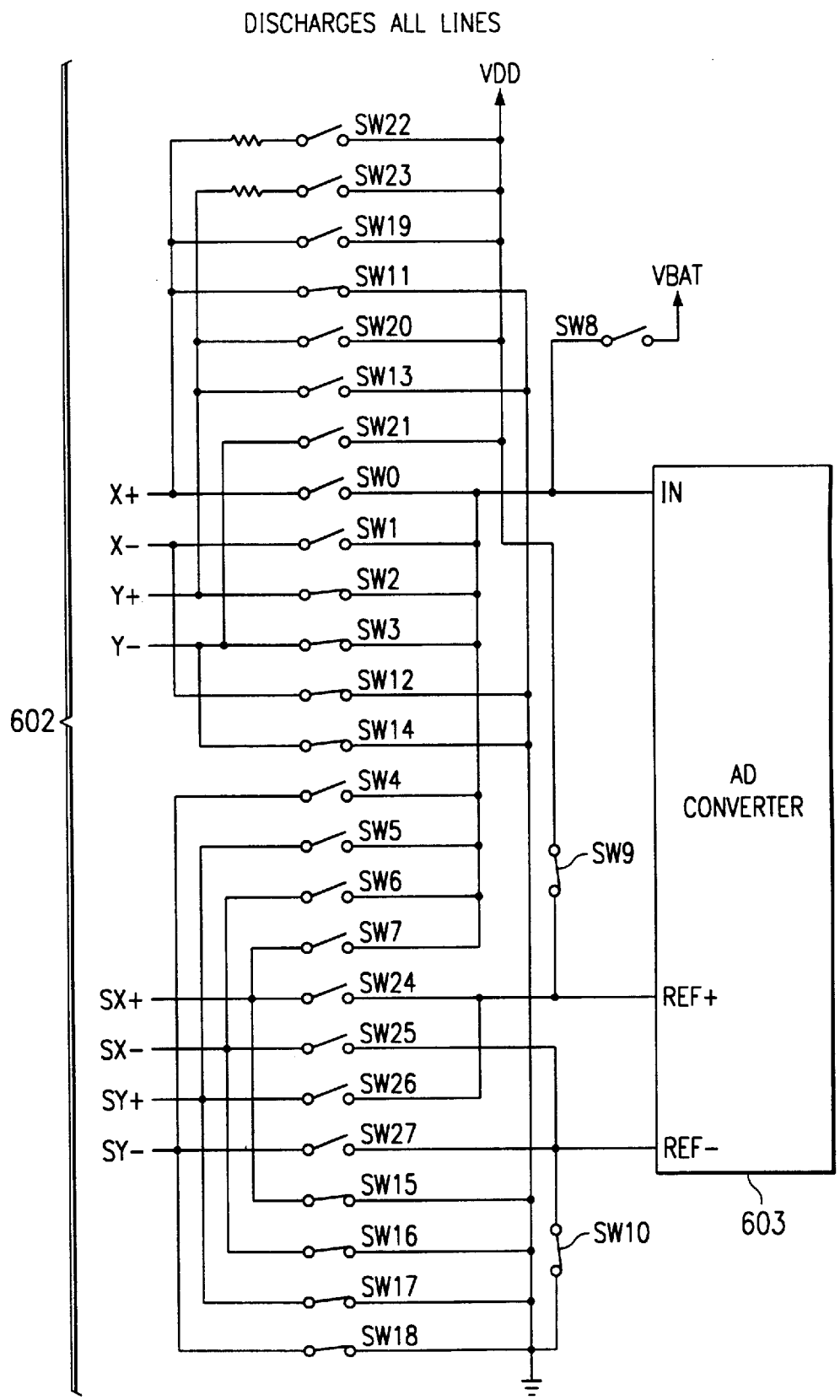
FIG. 6H illustrates the system configuration in which all input lines to A/D converter are being discharged to ground.

FIGS. 6E–6F are electrical schematic diagrams showing the typical circuit connections for an 8-wire touchscreen. A set of 28 switches (SW0-SW27) sample the voltages at the touchscreen terminals to the inputs of analog to digital converter 603. (The switch positions in actuality set bits in register, but for simplicity of discussion, circuit operation will be described in terms of the state of the switches). In FIG. 6E, the circuitry is in the process of detecting a touch on the screen. In FIG. 6F, a voltage is being driven across the screen X-axis and the Y-terminals are being sampled referenced against the voltage on the SX feedback lines. Correspondingly, in FIG. 6G a voltage is being driven across the Y-axis and the X-terminals are being sampled referenced against the voltage on the SY feedback lines. FIG. 6H illustrates the configuration in which all input lines to A/D converter 603 are being discharged to ground. These states will be further described in conjunction with the operational flow chart of FIG. 6I.

The circuitry for the 4-wire touchscreen is similar to that for the 8-wire device described above, except the A/D reference voltage is internal. Additionally, the SX and SY inputs and associated switches are not used in the 4-wire case.

One preferred procedure 600 for scanning the touchscreen and determining touch location is illustrated in reference to the flow chart of FIG. 6I and the resistive scanning block diagram of FIG. 6N. At initialization, the registers are loaded and the controlling state machine 622 starts. At Step 601, the X-axis is scanned to detect a touch (for example, see FIG. 6E). The relative X and Y axis are defined in software. This is followed by the discharge of all A/D input lines at Step 602 (for example, using the configuration of FIG. 6H). At Step 603, a voltage is applied to the X-axis. For the exemplary 8-wire touchscreen, Vdd is asserted at the V+ terminal, ground at V− and the SX+ and SX− terminals set to the A/D reference voltage. A delay is inserted at Step 604 for settling.

At Step 605, 4, 8, 16 or 32 samples are taken, depending on the state of the configuration registers. Each sample is compared with maximum and minimums set in registers 623 and 624 to determine the range of sample values (the stored maximum and minimum are adjusted was values fall between them during the comparison). Then, at Step 606, the difference between maximum and minimum values is taken and compared against a maximum deviation value set in duration register 625. If the maximum deviation is exceeded, the results are discarded and the procedure returns to Step 601 (thereby removing bad sampling points). Otherwise a running value held in an accumulator/shift register 626 is divided by the number of samples taken to calculate and average calculated.

If the X interrupt flag is not sent at Step 607, then at Step 608 then the difference between the average value (new X) and the last valid X new value in register 627 is taken and compared against a stored minimum value in register 629. If it is below this minimum value, then the lines are discharged and the Y-scan starts. Otherwise, a comparison is made against a maximum value in register 630 at Step 609. If the calculated value is above the stored maximum value, then it is assumed that the touch movement was too far and therefore the key press was invalid. In this case the X new interrupt pending flag is set at Step 611, such that Step 608 is skipped in subsequent scans, and the last valid X new value is taken as the X position value. Processing then returns to Step 601 for new samples.

On the other hand, if the difference between the average value (new X) and last X value are below the stored maximum, then the X interrupt flag is set and the average value is taken as the X value at Step 610 and line discharge begins.

The Y position is then identified through the execution of Steps 613–620, which are essentially the same as those discussed above with regards to the X position determination, the only difference being that data are now taken with respects to the Y axis. Additional registers 631–633 in FIG. 6N support the Y-scan operations. For brevity, the details of these steps will not be repeated.

At Step 621 and determination is made as to whether the X interrupt is pending, and when both the X and Y interrupt flags are set, the current stored X and Y values are taken as the position data and an interrupt to the host is generated.

Figure 6J:
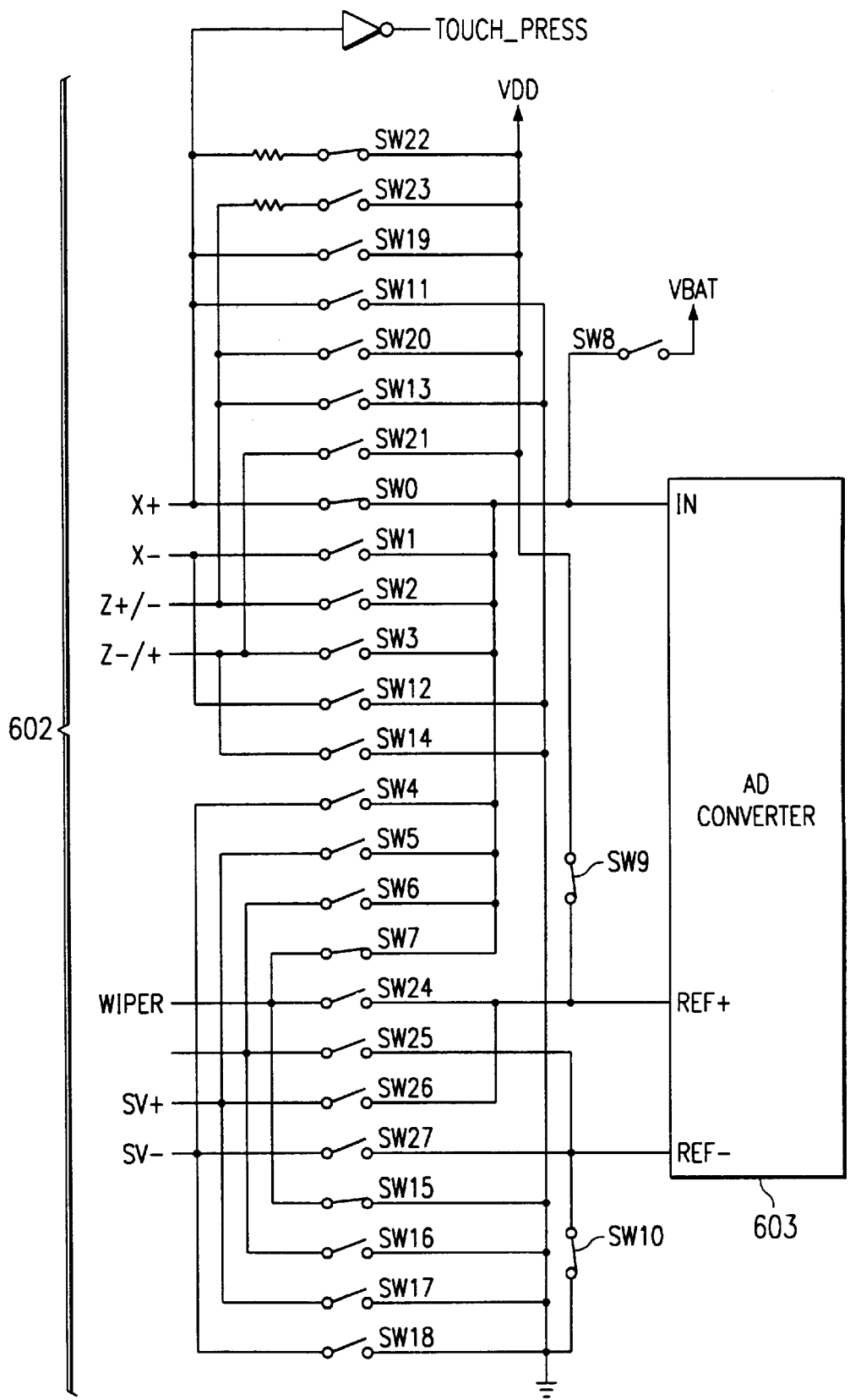
FIG. 6J illustrates the touch detection configuration for a 7-wire touchscreen embodiment.
Figure 6K:
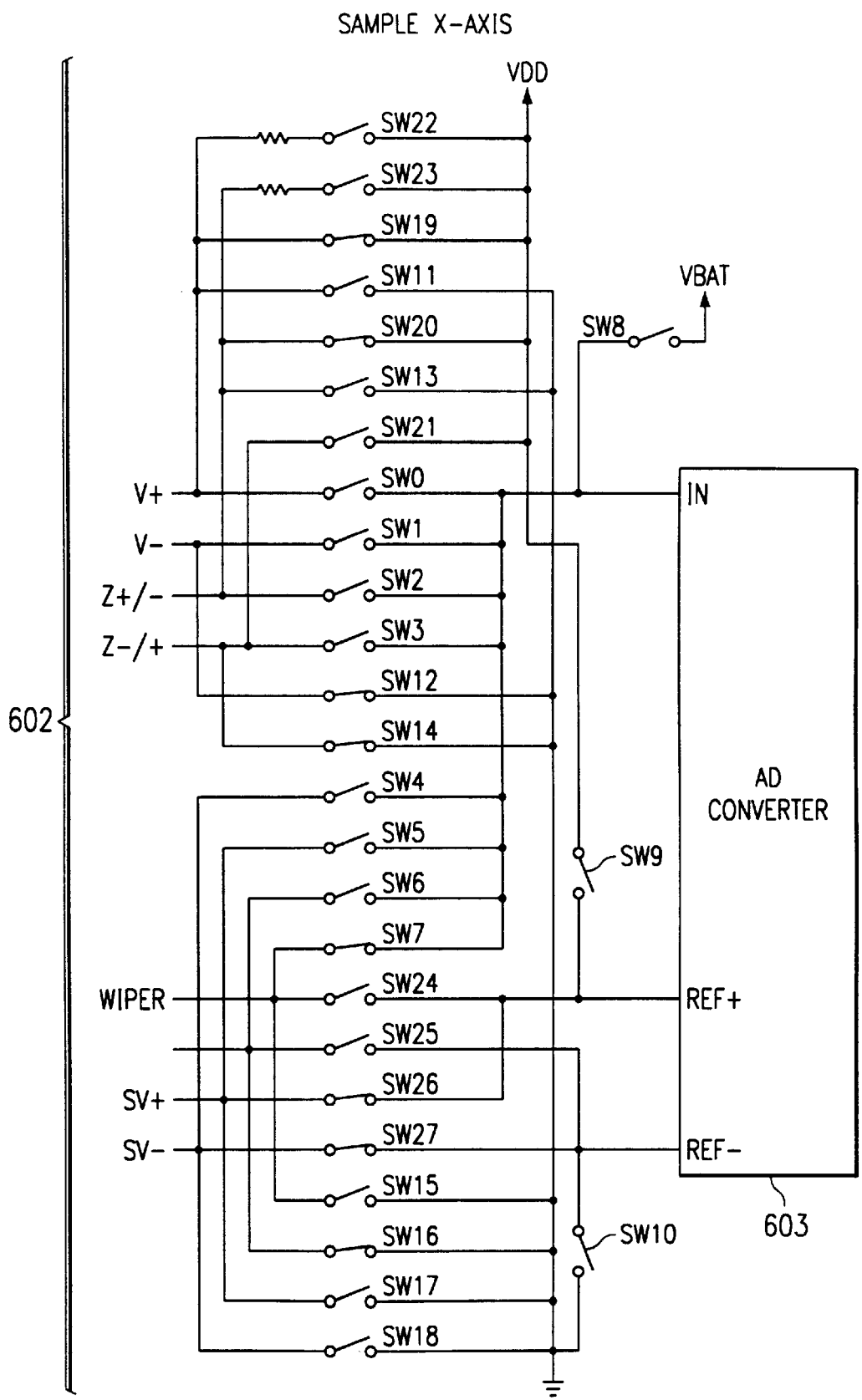
FIGS. 6K–6M respectively show exemplary configurations during Y-axis scan, X-axis scan, and line discharge for the 7-wire touchscreen embodiment.
Figure 6L:
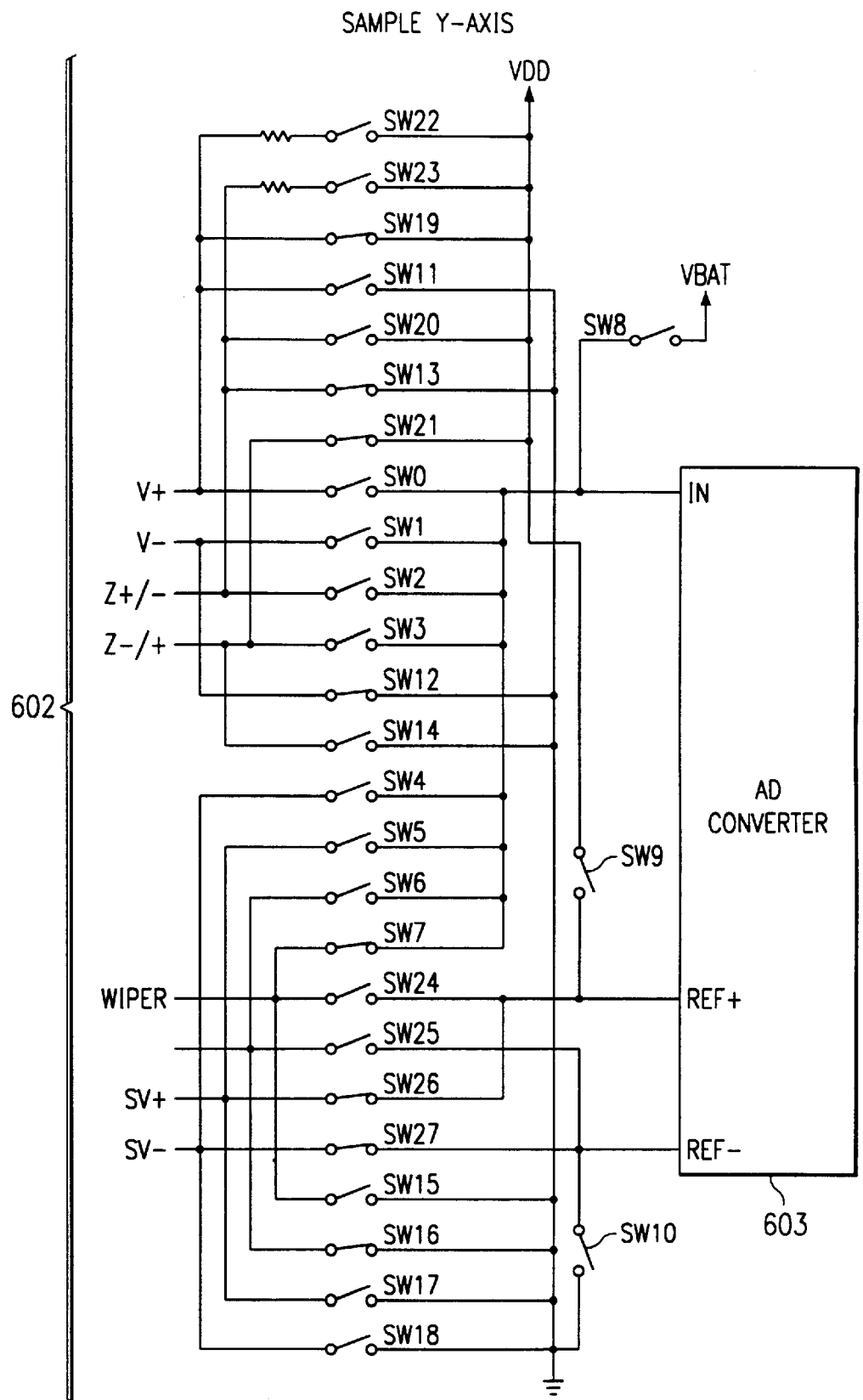
Figure 6M:
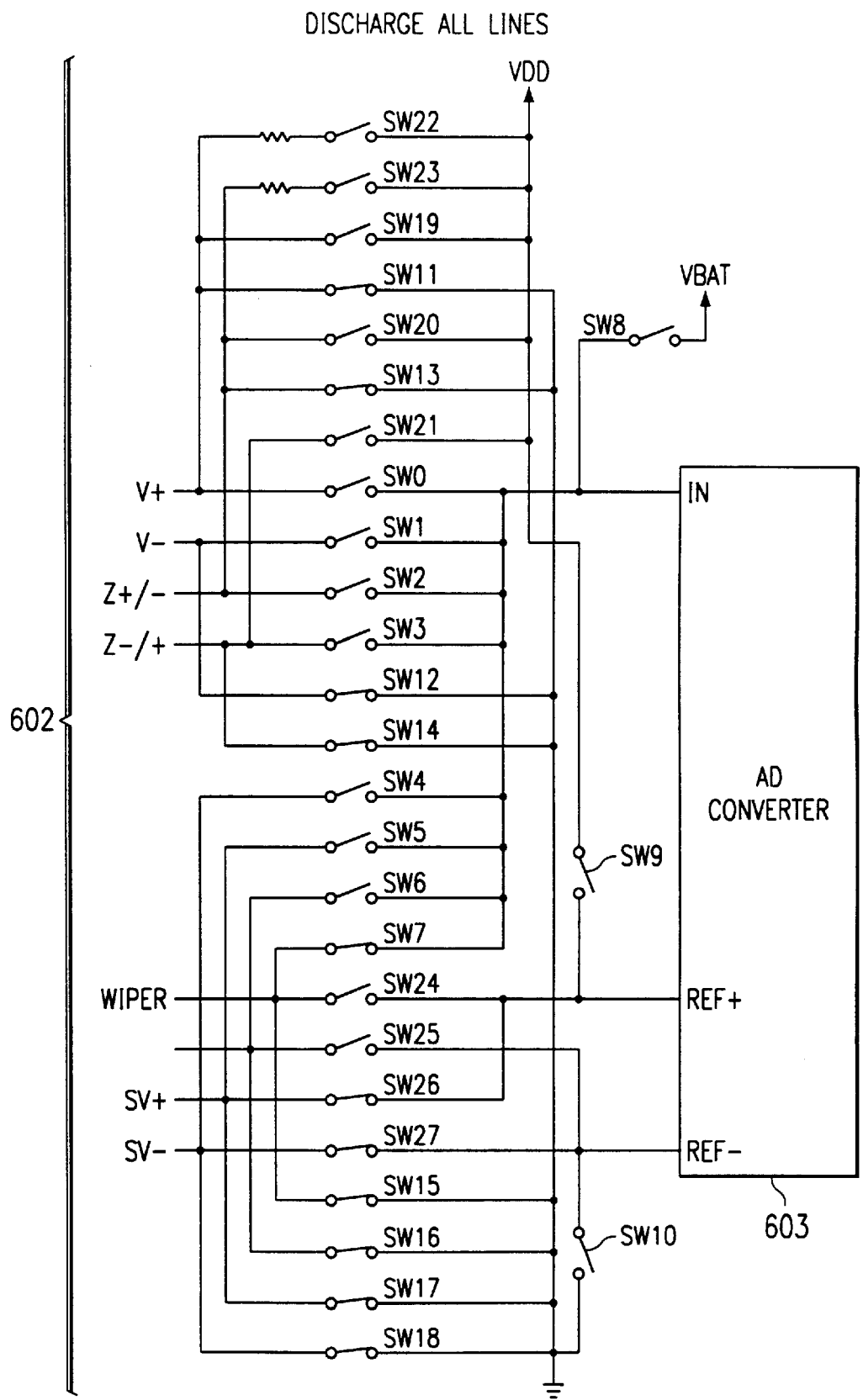
Figure 60:
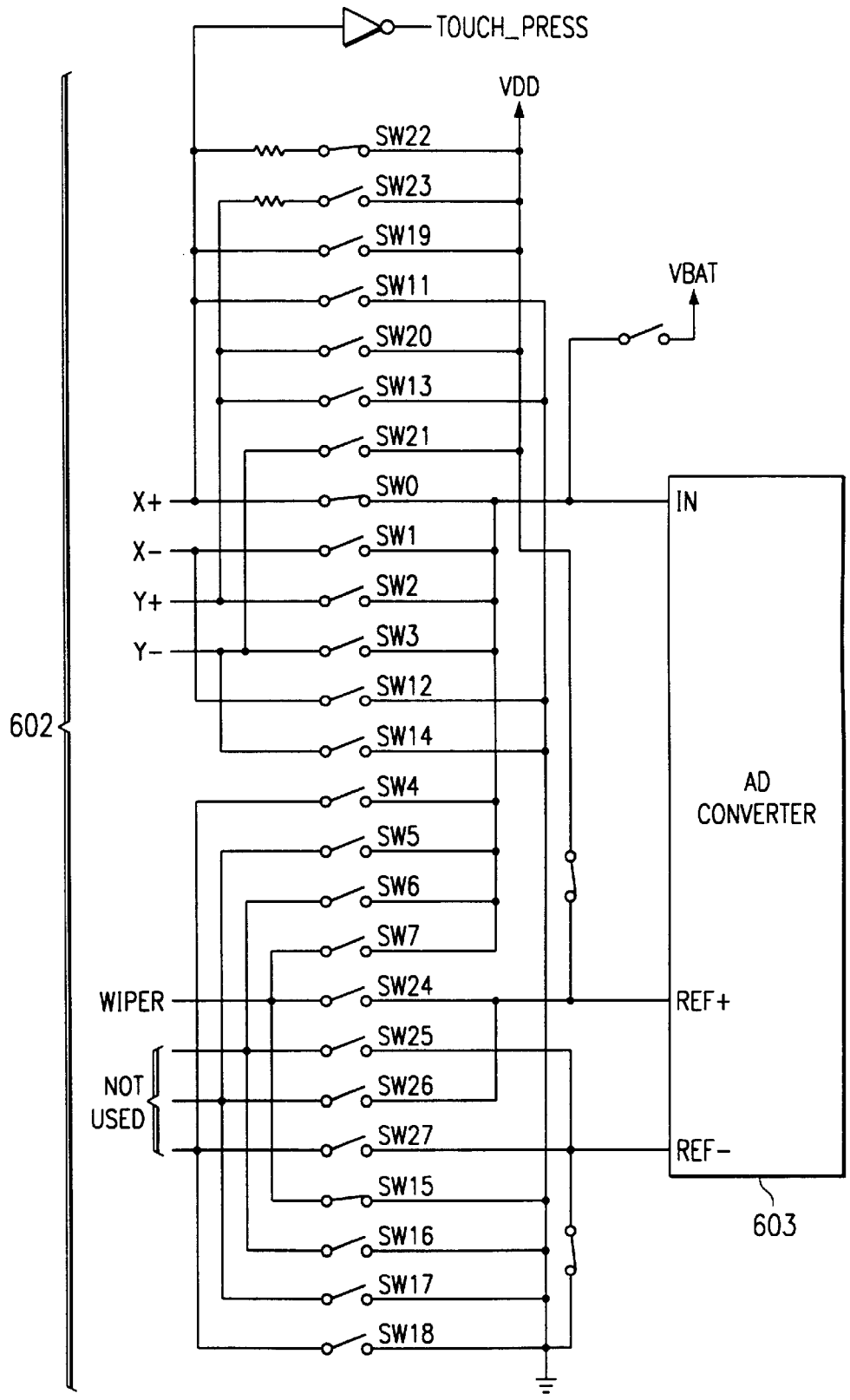

The interface to a 7-wire touchscreen device is shown in FIGS. 6J–6M. The 5-wire version is similar except the A/D reference is generated internal to the A/D converter. In both embodiments, the V+ and V− are the static lines and the Z+/− and Z−/+ lines are used to switch between the X and Y axes. The A/D reference voltages are applied at sV+ and sV−. The touch detection configuration is shown in FIG. 6J, while FIGS. 6K–6M respectively show exemplary configurations during Y axis scan, X axis scan, and line discharge.

The touchscreen scanning circuitry advantageously can be disabled during lower power operation. In this case, the Touch Press signal is gated to the interrupt logic when the touch screen controller is disabled. A typical configuration for this is shown in FIG. 6O, using the 5-wire device as an example.

Figure 6P:
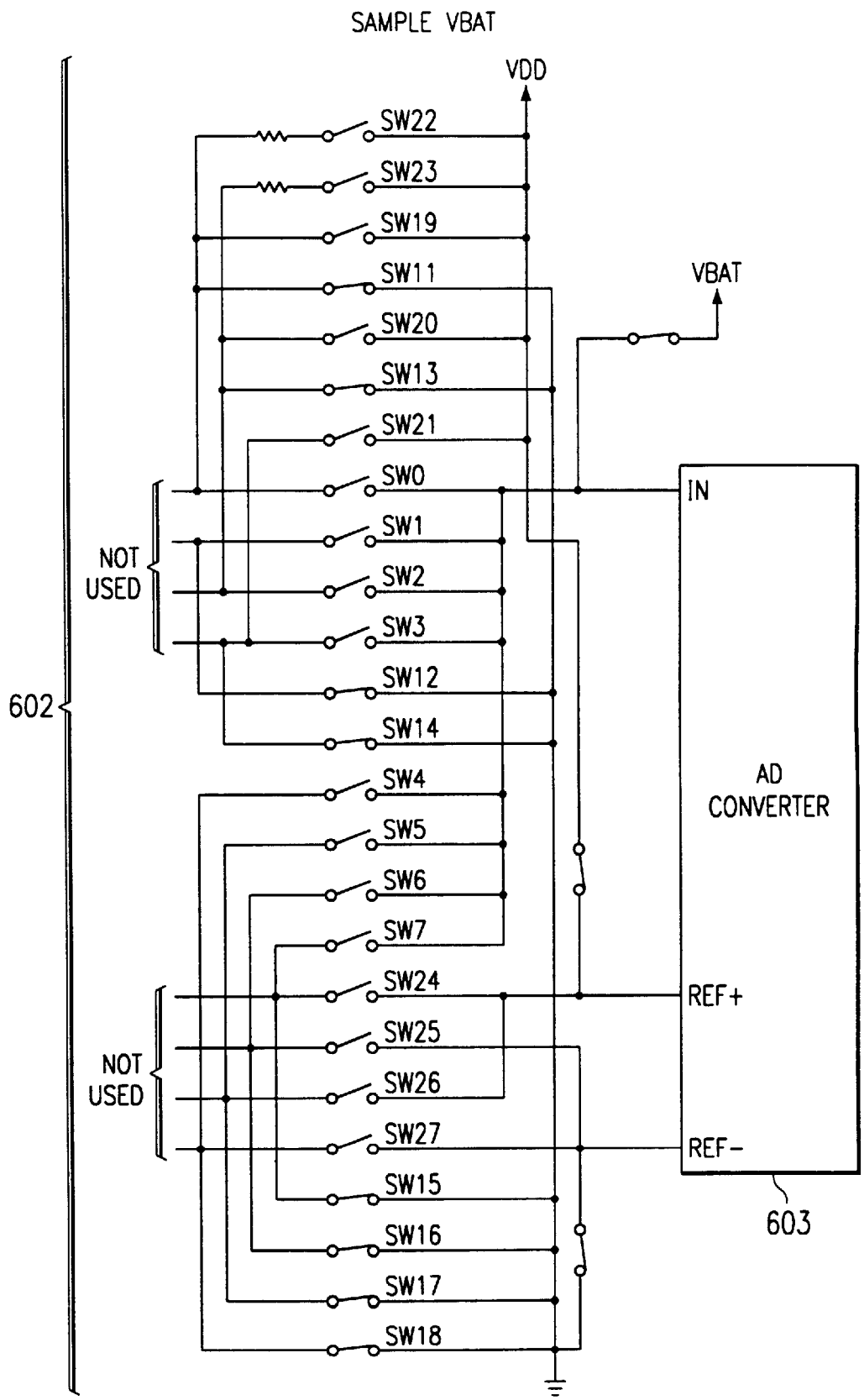
FIG. 6P illustrates an exemplary system configuration for determining battery voltage.

Analog switches 602 can additionally be used to measure the chip battery voltage and similar inputs. An exemplary configuration for determining battery voltage is shown in FIG. 6P.

The touch controller TIC harness 635 for the preferred embodiment is shown in FIG. 6Q. The test harness interfaces with high speed bus 102 through APB register interface 636. In the test mode, test input stimulus registers 637 control the input of sideband signals for analog to digital sample data, as well as powered-down touch detection and the inactive state. Interrupts, the analog switch control signals and the outputs of the A/D converter are read through the output capture register 638.

A compatible interrupt controller 115 also operates off of peripheral bus 103 and can handle up to 64 interrupts. Interrupts are defined in software to generate either interrupt requests (IRQs) or fast interrupt requests (FIQs) to processor core 101. Additionally, a thirty-two level hardware priority scheme is provided for assisting IRQ vectoring along with two levels for FIQ vectoring. Additional features include the ability to change the polarity of the active state of input interrupts, as well as the ability to selectively trigger interrupts off either rising or falling edges or voltage levels.

A brief identification of the interrupt registers follow for reference. Initially, it should be noted that all interrupt share the same input and are then independently masked and mapped as IRQs or FIQs. Preferably, these registers are accessed using fixed offsets from a selected base address, determined by a decoder in bus bridge 113.

The Interrupt Raw Status Registers identify active interrupts, prior to masking, and the Interrupt Status Registers identify the active interrupts after masking. The Interrupt Enable/Enable Set Registers are used to selectively enable interrupts and when read, return the mask values for the various interrupt sources. The Interrupt Enable Clear Registers are used to clear bits in the Interrupt Enable Registers. The Programmed IRQ Interrupt register sets or clears programmed interrupts.

The following Table summarizes the available interrupts in the preferred embodiment:

TABLE 4

| Interrupt | Name | Type | Source | Description |
| --- | --- | --- | --- | --- |
| Bit 0 | Unused | Level Only | GND | User defined |
| Bit 1 | PROGINT | Level Only | Internal | Software Programmed Interrupt |
| Bit 2 | COMMRX | Level Only | ARM core | Processor debug Serial Port RX Interrupt |
| Bit 3 | COMMTX | Level Only | ARM core | Processor debug serial Port TX Interrupt |
| Bit 4 | INT_CT[0] | Level Only | TIMERS | Timer 1 Interrupt |
| Bit 5 | INT_CT[1] | Level Only | TIMERS | Timer 2 Interrupt |
| Bits 6–8 | INT_CT [4:2] | Level Only | TIMERS | Timers 5-3 Interrupts |
| Bit 9 | INT_RTC | Level Only | RTC | Real Time Clock Interrupt |
| Bit 10 | UARTRXINT1 | Level Only | UART1 | UART1 Receive Buffer Interrupt |
| Bit 11 | UARTTXINT1 | Level Only | UART1 | UART1 Transmit Buffer Interrupt |
| Bit 12 | UARTRXINT2 | Level Only | UART2 | UART2 Receive Buffer Interrupt |
| Bit 13 | UARTTXINT2 | Level Only | UART2 | UART2 Transmit Buffer Interrupt |
| Bit 14 | UARTRXINT3 | Level Only | UART3 | UART3 Receive Buffer Interrupt |
| Bit 15 | UARTTXINT3 | Level Only | UART3 | UART3 Transmit Buffer Interrupt |
| Bit 16 | INT_KEY | Level Only | KEY | Key Scan Controller Interrupt |
| Bit 17 | INT_TOUCH | Level Only | TOUCH | Touch Scan Controller Interrupt |
| Bit 18 | INT_GRA | Level Only | GRAPHICS | Graphics Controller Interrupt |
| Bit 19 | INT_CIA | Level Only | PCCARD | PCCard Interrupt Signal |
| Bit 20 | INT_VERT | Level Only | RASTER | Vertical Start of Frame Counters |
| Bits 28-21 | INT_DMA [7:0] | Level Only | DMA | DMA channel Interrupts |
| Bit 29 | INT_IRDA | Level Only | UART2 | IrDA combined Interrupt |
| Bit 30 | INT_USB | Level Only | USB | USB Host Controller Interrupt |
| Bit 31 | INT_MAC | Level Only | MAC | 10/100 EtherNet MAC Interrupt |
| Bit 35-32 | INT_1 [3:0] | Edge or Level | External | External Interrupts 3-0 |
| Bit 36 | INT_PROG | Edge or Level | RASTER | Programmable Interrupt within a Raster Frame |
| Bit 37 | CLK1HZ | Edge or Level | RTC | Real Time Clock Interrupt |
| Bit 38 | V_CSYNC | Edge or Level | RASTER | Vertical Sync Signal |
| Bit 39 | V_CSYNC | Edge or Level | RASTER | Vertical SYNC |
| Bit 40 | INT_AC97 | Level Only | AC97 | AC97 Port Interrupt |
| Bit 41 | INT_SSP0RX | Level Only | SP10 | SP1 Port 0 Receive Interrupt |
| Bit 42 | INT_SSP0TX | Level Only | SP10 | SPI Port 0 Transmit Interrupt |
| Bit 43 | INT_SSP1RX | Level Only | SP11 | SPI Port 1 Receive Interrupt |

TABLE 4-continued

| Interrupt | Name | Type | Source | Description |
|---|---|---|---|---|
| Bit 44 | INT_SSP1TX | Level Only | SP11 | SPI Port 1 Transmit Interrupt |
| Bit 45 | INT_GPIO | Level Only | GP10 | Combined GPIO Interrupt |
| Bit 46 | INT_CU | Level Only | CU | Customer Unit Exception Interrupt |
| Bit 47 | INT_MMC | Level Only | MMC | MMC Combined Interrupt |
| Bit 48 | INT_UART1 | Level Only | UART1 | UART1 Combined Interrupt |
| Bit 49 | INT_UART2 | Level Only | UART2 | UART2 Combined Interrupt |
| Bit 50 | INT_UART3 | Level Only | UART3 | UART3 Combined Interrupt |
| Bit 51 | INT_SP10 | Level Only | SP10 | SP1 Port 0 Combined Interrupt |
| Bit 52 | INT_SP11 | Level Only | SP11 | SPI Port 1 Combined Interrupt |
| Bit 53 | INT_I2C | Level Only | I2C | I2C Clock Input Interrupt |
| Bit 54-63 | Unused | Level Only | GND | Not assigned |

Figure 7:
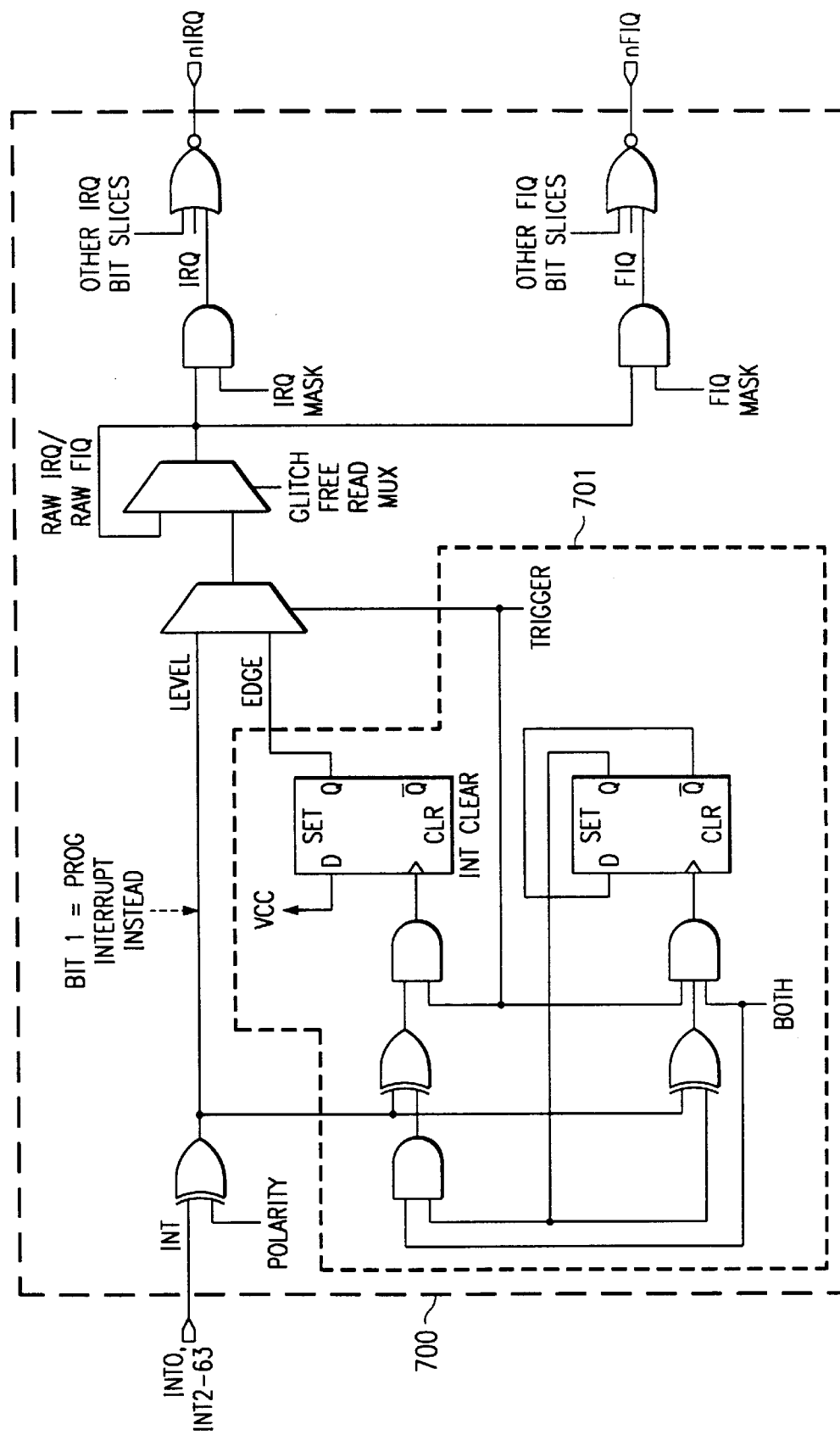
FIG. 7 illustrates one preferred bit slice circuit suitable for use in the Interrupt Controller.

Each Interrupt is associated with a bit slice circuit, such circuit 700 shown in FIG. 7. In this circuit, the POLARITY signal allows for the polarity of the active state of the received interrupt to be reversed. Edge detection circuitry 701 is included for the bit slice circuits corresponding the external interrupts as well as the interrupt issued at the vertical start of display frame. The FIQ and IRQ masking bits from the corresponding masking registers control the combination of bit slice outputs to generate the FIQs and IRQs to the microprocessor.

Figure 8A:
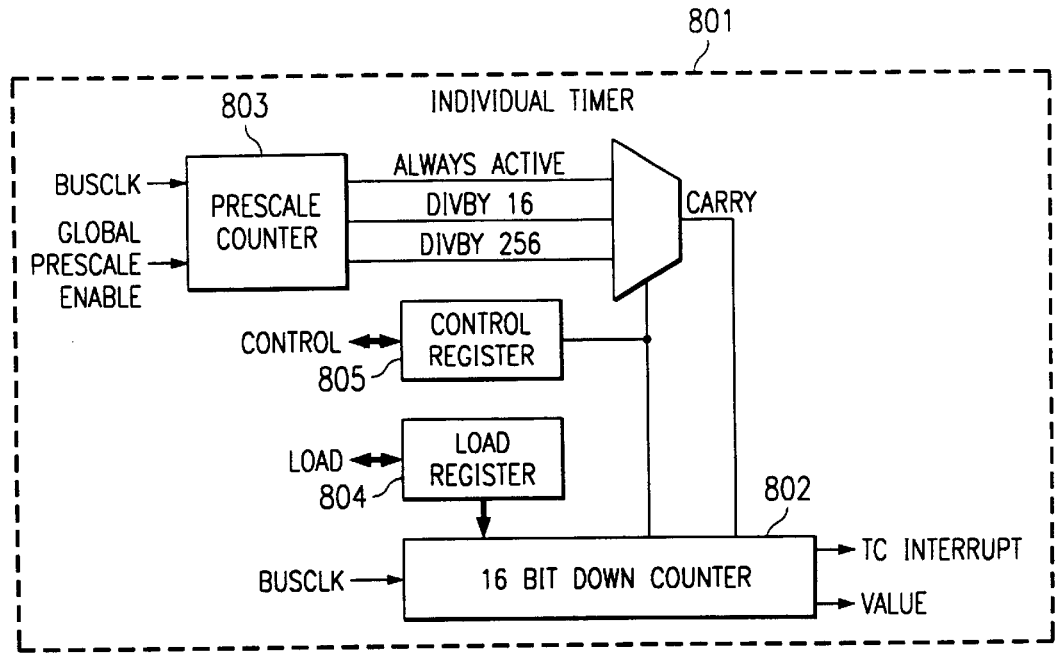
FIG. 8A depicts an exemplary 16-bit timer and found in the General Timer Block.

Block 117 includes four 16-bit and two 32-bit interval timers, and a 40-bit time stamp debug timer. An exemplary 16-bit timer 801 is shown in FIG. 8A and includes a 16-bit down counter 802 and a 8-bit prescaler 803. Additionally, a 5-bit global prescaler is provided for the entire circuit block. Load register 804 is set to the initial timer value and maintains the reload value during periodic operation. Fields in control register 805 are used for enablement, mode selection and prescale configuration.

Figure 8B:
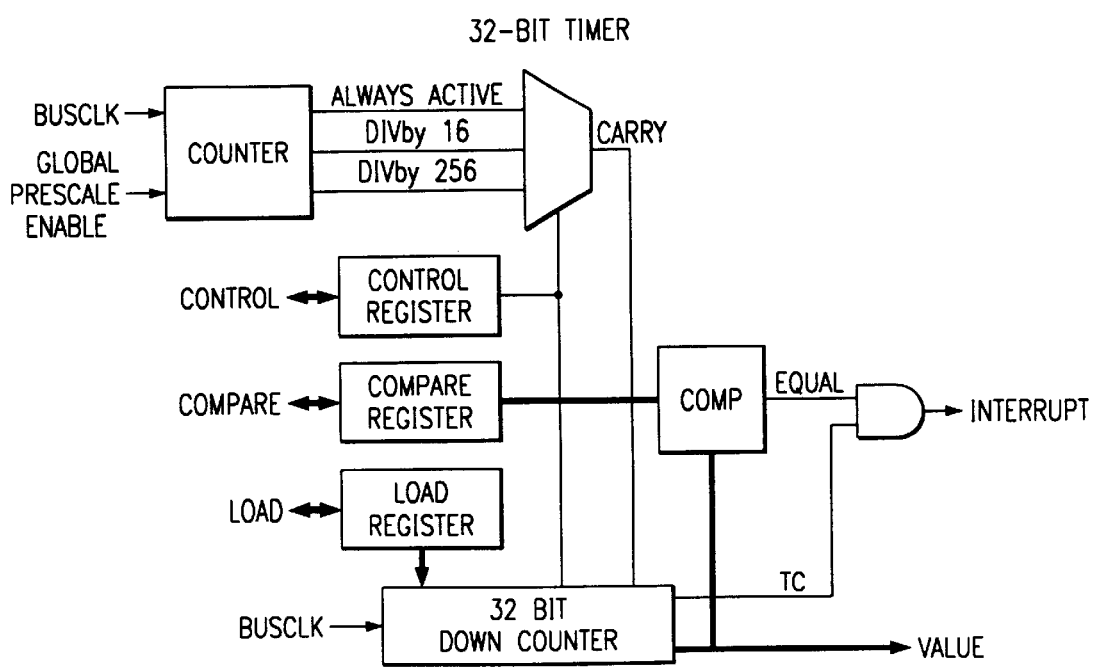
FIG. 8B depicts an exemplary 32-bit timer found in the General Timer Block.

FIG. 8B depicts one of the 32-bit timers 806. This timer is based on a 32-bit down counter 807 and an 8-bit prescaler 808. The 32-bit timers also share the 5-bit global prescaler. Load and control registers 809–810, similar to those described above, are also included. In addition, the 32-bit timers include a compare register 811 and a comparator 812. This comparator circuitry is available for triggering interrupts at preselected timer values.

The operation of interval timers of block 117 can be described in reference to the following table:

TABLE 5

| Address | Name | SW locked | Type | Size | Description |
|---|---|---|---|---|---|
| Required register locations | | | | | |
| Timer Base +0x00 | Timer/Load | No | Read/Write | 16 bits | Timer 1 Load Value Register |
| Timer Base +0x04 | TIMER/VALUE | No | Read Only | 16 bits | Timer 1 Counter Value |
| Timer Base +0x08 | TIMER/CONTROL | No | Read/Write | 8 bits | Timer 1 Control Register |
| Timer Base +0x0C | TIMER/CLEAR | No | Write Only | NA | Timer 1 Clear Command |
| Timer Base +0x10 | Reserved | | | | Reserved per |
| Timer Base +0x20 | TIMER2LOAD | No | Read/Write | 16 bits | Timer 2 Load Value Register |
| Timer Base +0x24 | TIMER2VALUE | No | Read Only | 16 bits | Timer 2 Counter Value |
| Timer Base +0x28 | TIMER2CONTROL | No | Read/write | 8 bits | Timer 2 Control Register |
| Timer Base +0x2C | TIMER2CLEAR | No | Write Only | NA | Timer 2 Clear Command |
| Timer Base +0X30 | Reserved | | | | Reserved per |
| Extended register locations | | | | | |
| Timer Base +0x14 | GLOBAL_PRESCALE | No | Read/Write | 5 bits | Global Pre-scale |
| Timer Base +0x18 | TIMER3LOAD | No | Read/Write | 16 bits | Timer 3 Load Value register |
| Timer Base +0x1C | TIMER3VALUE | No | Read Only | 16 bits | Timer 3 Counter Value |
| Timer Base +0x34 | TIMER3CONTROL | No | Read/write | 8 bits | Timer 3 control register |
| Timer Base +0x38 | TIMER3CLEAR | No | Write Only | NA | Timer 3 Clear Command |
| Timer Base +0x3C | TIMER5COMPARE | No | Read/Write | 32 bits | Timer 5 Interrupt on Compare Value Register |
| Timer Base +0x40 | TIMER4LOAD | No | Read/Write | 16 bits | Timer 4 Load Value Register |

TABLE 5-continued

| Address | Name | SW locked | Type | Size | Description |
|---|---|---|---|---|---|
| Timer Base +0x44 | TIMER4VALUE | No | Read Only | 16 bits | Timer 4 Counter Value |
| Timer Base +0x48 | TIMER4CONTROL | No | Read/Write | 8 bits | Timer 4 Control Register |
| Timer Base +0x4C | TIMER4CLEAR | No | Write Only | NA | Timer 4 Clear Command |
| Timer Base +0x50 | TIMER5LOAD | No | Read/Write | 16 bits | Timer 5 Load Value Register |
| Timer Base +0x54 | TIMER5VALUE | No | Read Only | 16 bits | Timer 5 Counter Value |
| Timer Base +0x58 | TIMER5CONTROL | No | Read/Write | 8 bits | Timer 5 Control Register |
| Timer base +0x5C | TIMER5CLEAR | No | Write Only | NA | Timer 5 Clear Command |
| Timer Base +0x60 | TIMESTAMP_LO | No | Read Only | 32 bits | Time Stamp Low Read Register |
| Timer Base +0x64 | TIMESTAMP_HI | No | Read 8 Write 1 | 32 bits | Time Stamp High Read Register |
| Timer Base +0x70 | TMR_TCR | No | Read/Write | 5 bits | Timer Test Control Register |
| Timer Base +0x74 | TMR_TISR | No | Read/Write | 7 bits | Timer Test Input Stimulus Register |
| Timer Base +0x78 | TMR_TOCR | No | Read Only | 6 bits | Timer Test Output Capture Register |
| Timer Base +0x80-0xBC | TMR_TCER | No | Read/Write | NA | Timer Test Clock Enable Register |

Eight-bit prescaling supports division by 1, 16, or 256, depending whether 0, 4, or 8 prescale stages are used. Moreover, the interval timers can each operate in either a free-running or periodic mode. In the free-running mode, the counters wrap around to their maximum value and continue counting down, after reaching zero. In the periodic mode, the counter reloads from the load register upon reaching zero and continues to decrement following reload, unless appropriate control bits are set, in which case the interrupt is continuously asserted until cleared.

The time stamp debug timer is 40-bit up counter clocked with a 1 MHz clock and is used only for long-term debugging.

Figure 8C:
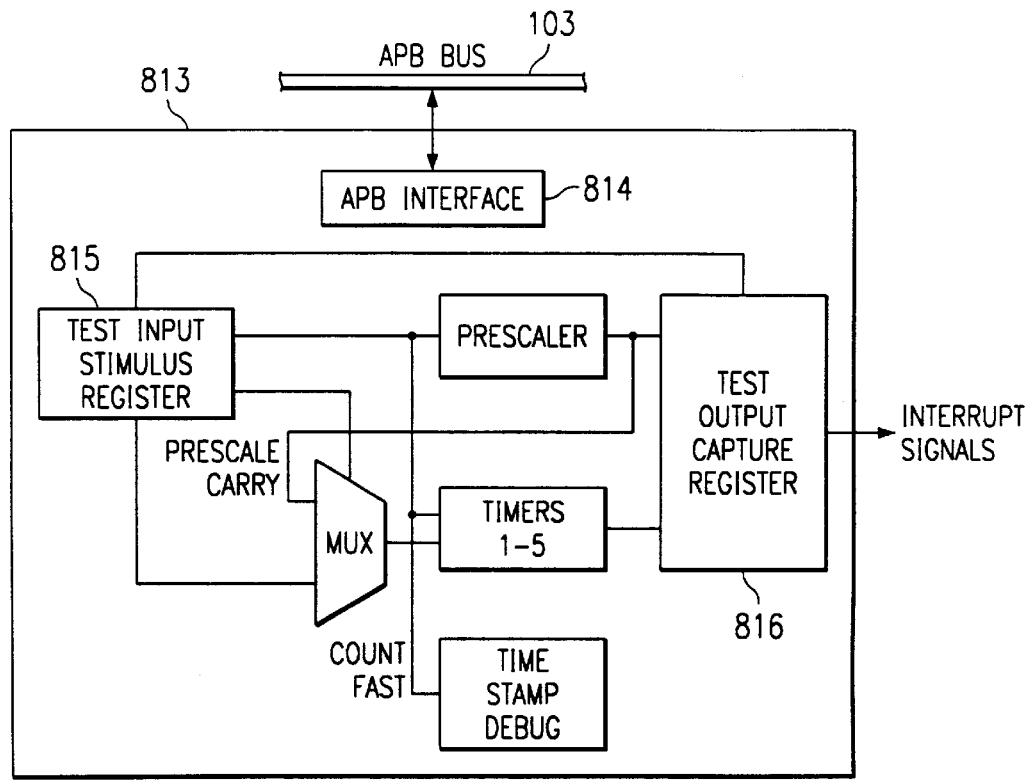
FIG. 8C is a functional block diagram of the timer block TIC harness connections.

FIG. 8C is a functional block diagram of the timer block TIC harness 813 which operates from APB bus 103 through register interface 814. The clock mode, reset status, input multiplexer configuration and clock enablement are effectuated through register interface 814. The test input stimulus register 815 is used to control counting and pre-scaler carry. The pre-scaler carry signal and interrupt values are observed in the test output capture register 816.

System 100 includes keyboard matrix scan circuitry 118 operating from peripheral bus 103. In the preferred embodiment, a key array of up to 64 keys in 8 rows and 8 columns is supported, with any one or two keys debounced and decoded at one time. FIG. 9A is a functional block diagram of this embodiment. An exemplary 8 row and 8 column keyboard is shown in FIG. 9B for discussion purposes.

Precounter 901, row and column counter 902 and row decoder 903 sequentially pull down the row the keyboard row lines in order from Row 7 to Row 0. At the same time, the column lines Col. 0 to Col. 7 are passively pulled-up. The output of the column lines, are passed through pipeline 904 and then decoded by column multiplexer 905 under the control of scan controls 906. Hence, when a key is depressed, the column line of the corresponding column is pulled low to the low voltage on the corresponding row line.

Mechanical switch bounce is accounted for using programmable debounce counter 907. This counter is set to a predetermined scan count corresponding to a preselected number of scans during which the same key or pair of keys must be detected. The count is determined as a function of the expected switch bounce and the typical length of each scan. For example, if the potential which bounce is 20 milliseconds and each complete scan of the keyboard takes 8 milliseconds, then the count is set to three which allows approximately 24 milliseconds for the switch to settle. If the same key or pair of keys are not detected on successive scans during the count down period, then the scan count is reset.

The contents of the row and column counter (i.e. the coordinates of the key or keys depressed) are passed through a pipeline 608, a set of temporary storage registers 609 and then set in the key register 610, where it can be read. When a key depression is detected, interrupt controller 611 generates the corresponding interrupt to processor 101. In the preferred embodiment, interrupts are also generated when keys are released. The interrupt bit is latched until key register 610 is read.

Three key reset detector 612 detects depression of keys 2, 4, and 7 in Row 0, the results of which is used by the watchdog subsystem to reset system 100.

Figure 9C:
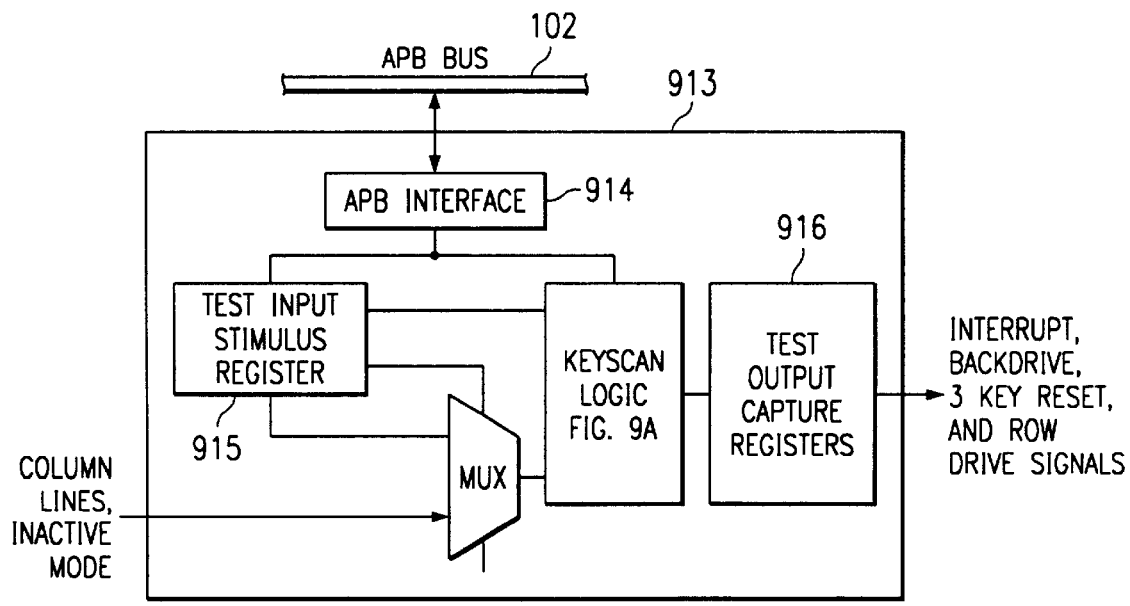
FIG. 9C is a functional block diagram of the keyboard scan block connections to the TIC harness.
Figure 9A:
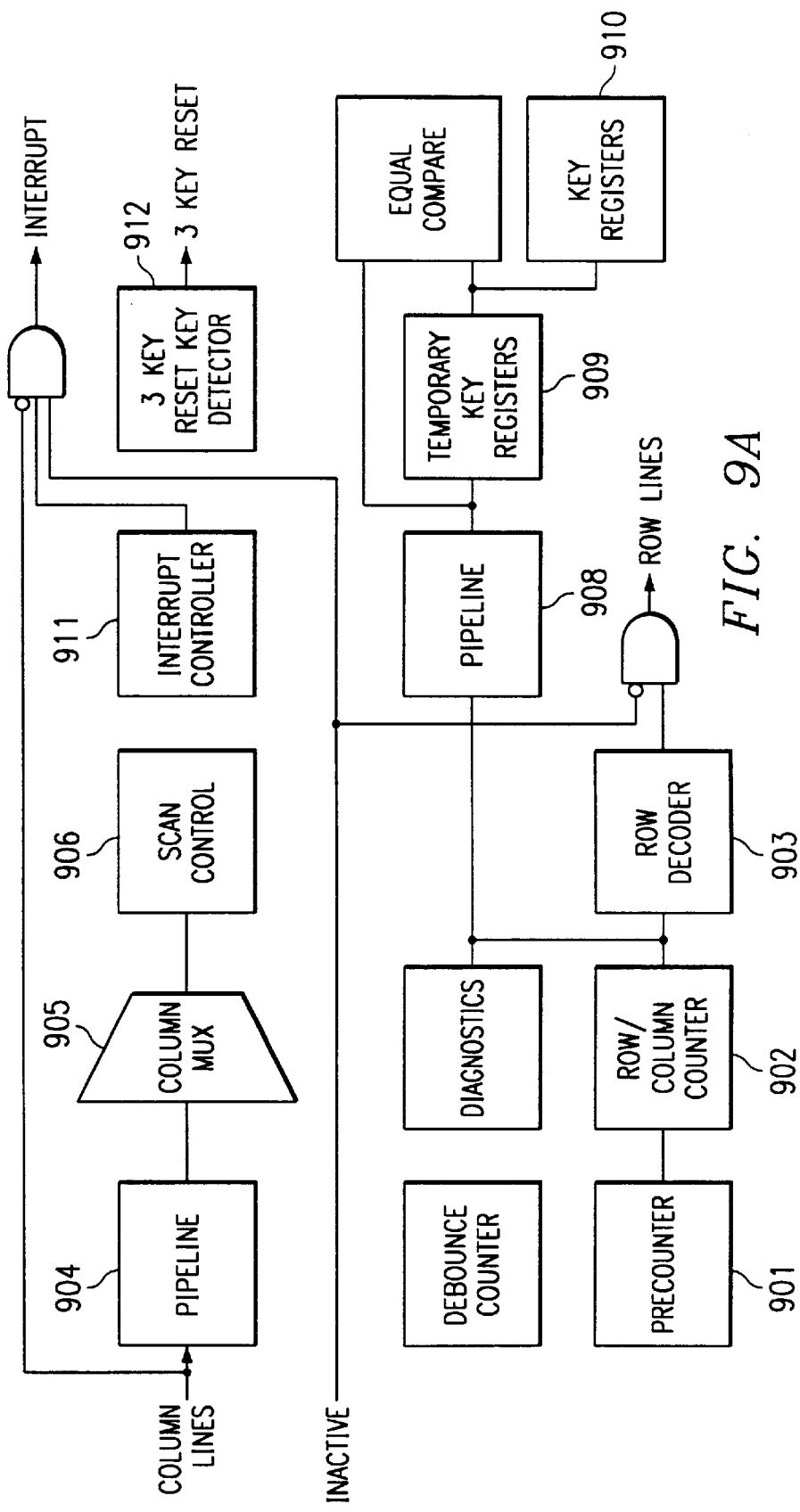
FIG. 9A is a functional block diagram of the keyboard scan circuitry.

FIG. 9C is a functional block diagram of the keyboard scan block TIC harness 913. Testing is conducted through registers 914 in the APB register interface. These registers are set to control the input multiplexers, reset status, clock mode and clock enables. Column line inputs, as well as the inactive mode, are controlled by test input stimulus registers 915. Row outputs, three key detect, back drive and the interrupt output are observed at the test output capture register 916.

Figure 10A:
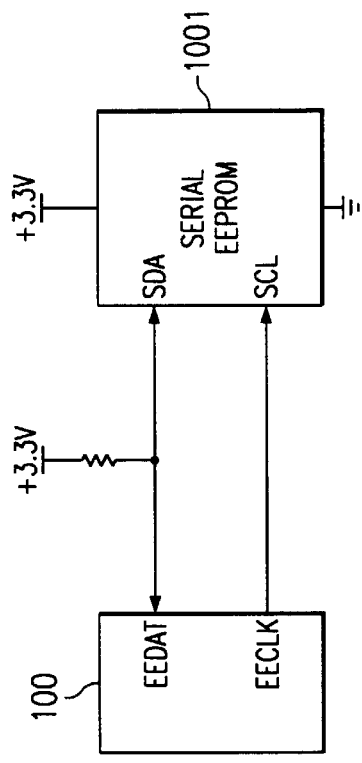
FIG. 10A depicts an exemplary connection of the system with an external EEPROM through the EEPROM/I$^2$C interface.

EEPROM/I2C 119 interface is shown in FIG. 10A. According to one embodiment of system 100, interface 119 supports a connection to an external EEPROM 1001 for inputting configuration information on system power-up. (An external serial EEPROM is not required for operation of system 100, although it may be required to meet specific operating system compatibility requirements). Alternatively, this interface can also be used as a generic $I^2C$ Port.

After a hardware reset, an on-chip state machine attempts to load the configuration data. If an EEPROM is present, the first 40 bytes returned are transferred to 10 configuration registers. The EEPROM device is then accessible to the host processor for reading/writing via a control register. If an EEPROM device is not present, or if the header portion of the first 40 bytes is invalid, the configuration registers remain in their existing state.

As shown in FIG. 10A, the EECLK port is used to provide the serial clock and the EEDAT port for serial data I/O. Initialization may be accomplished by a hardware reset. On a hardware reset, a hardware-based EEPROM controller: (1) enables the EEPROM interface (switches the mode of the EECLK pin); (2) send a dummy write to set the byte address to 0; (3) start a sequential read of bytes from EEPROM; (4) checks the signature header as loaded and aborts if an invalid signature is detected; and, (5) loads a fixed number of bytes, transferring data into destination configuration registers as loaded.

Figure 10B:
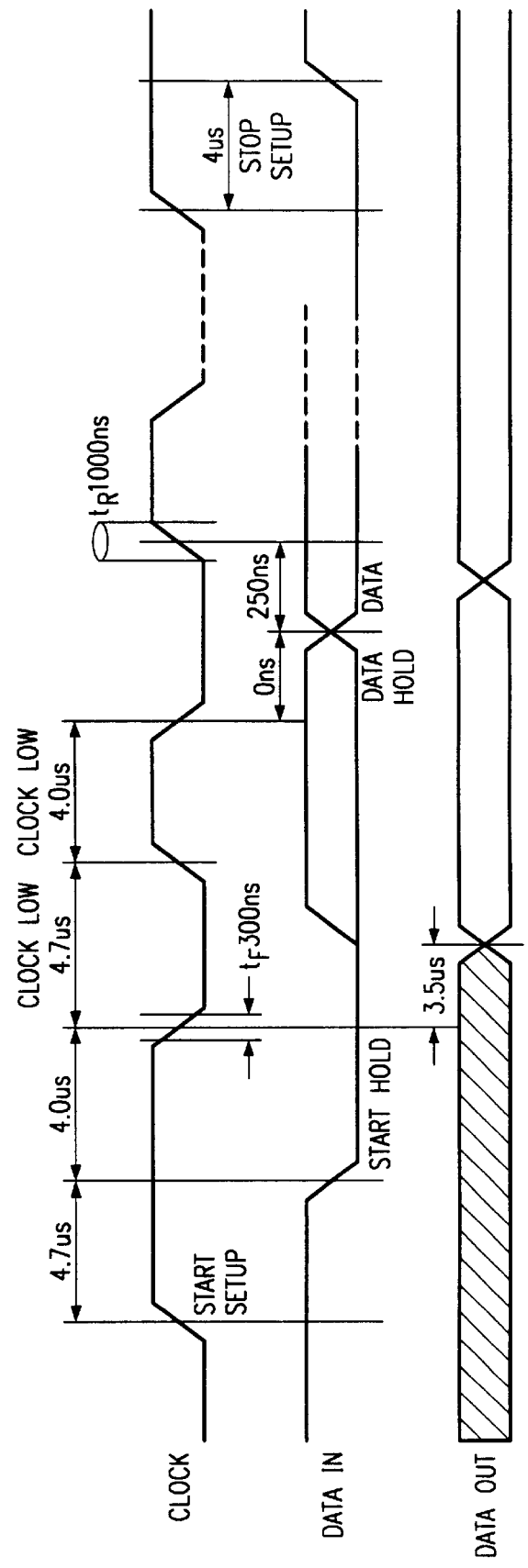
FIG. 10B illustrates the minimum timing relationship between the clock and data in the preferred EEPROM/I$^2$C interface.

The timing of the data and clock signals for the initialization load are generated by a hardware state machine. The minimum timing relationship between the clock and data in the preferred embodiment is shown in FIG. 10B. Preferably, the state of the data line can change only when the clock line is low. A state change of the data line during the time that the clock line is high is used to indicate start and stop conditions.

Writing to an external EEPROM requires support from processor 101 and is accomplished through a corresponding processor-accessible configuration interface register.

During a typical EEPROM read access sequence, a dummy write operation is first performed which generates a start condition. This is followed by the generation of slave device address (including a device identifier and banks select bits) and a byte address of zero. The system 100 begins the access at byte address zero and continues accessing one byte at a time, until a stop condition is detected.

EEPROM/I2C block 119 also includes two dedicated ports for Flash ROM programming voltage (FVPP) control, or alternatively, for use as general purpose input/output. Logically, the FVPP block circuitry and the LED block 128 are identical, but reside at different base addresses. LED interface 128 provides a dedicated control for driving 2 LED indicators. The LED pins can also be used as general purpose input/output pins if LEDs are not used.

An AC97/Inter—IC Sound (I²S) interface 120 is provided on peripheral bus 102 in the preferred embodiment of system 100. A on-chip multiplexer allows the user to select between a connection to an external AC97 codec or an external I²S bus.

In accordance with the AC97 specification, interface 120 includes a port for receiving the AC97 bit clock (ABITLCK) and serial data (ASD1, ASD12) from one or two external AC97 codecs, as well as port for transmitting a sync signal (ASYNC), serial data (ASDO) and a reset signal (ARSTn). Generally, the external codec generates the bit clock ABITCLK which is then divided down by interface 120 to generate the sync signal ASYNC. ASYNC signals the start of each audio frame, with data transmitted onto the AC97 link on the rising edges of the bit clock and sampled on the receiving end on the falling edges of the bit clock.

Figure 11A:
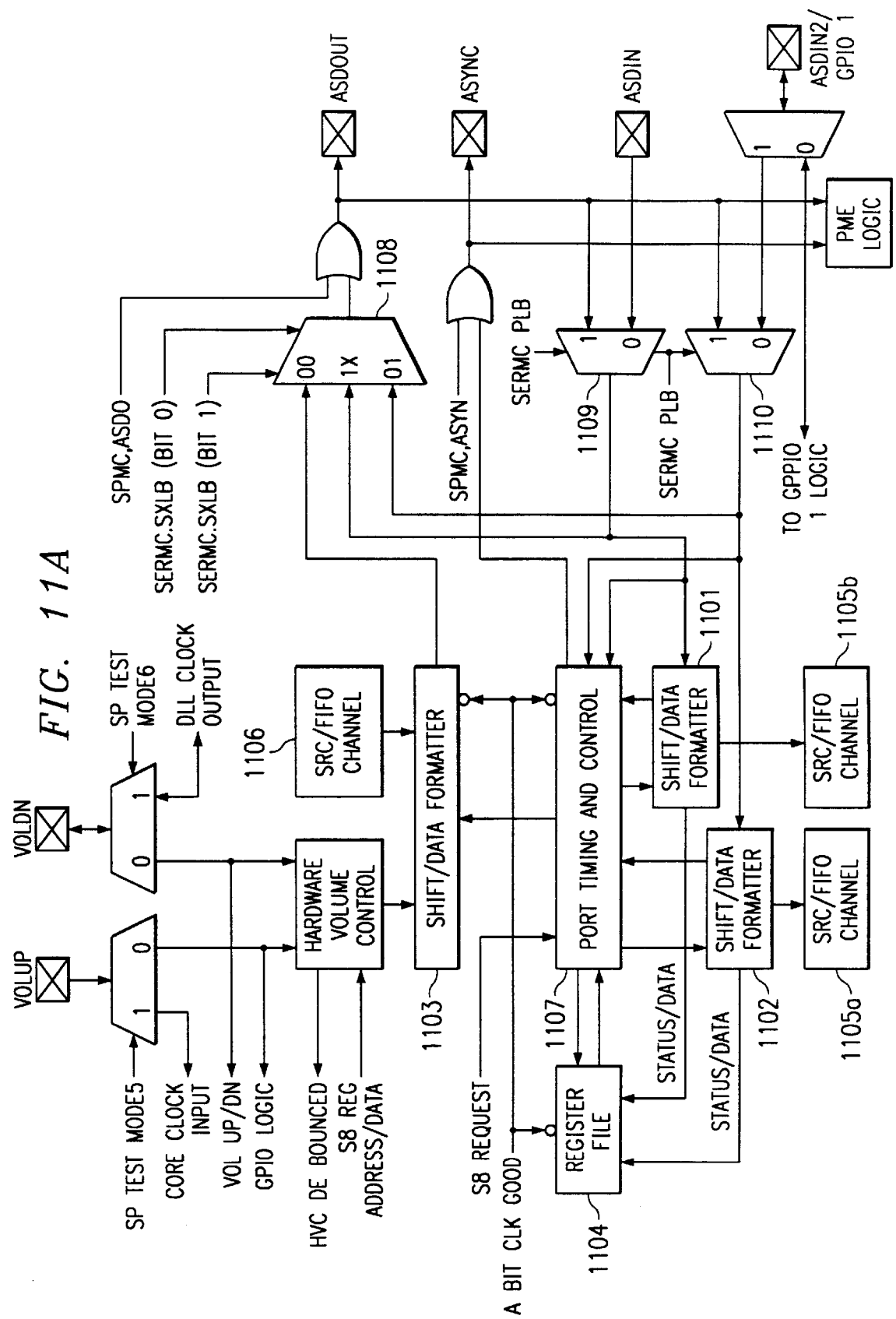
FIG. 11A depicts a preferred dual codec serial interface.

In the preferred embodiment, interface 120 supports a dual codec architecture in accordance with the AC97 specification, Revision 2.1. A preferred dual codec serial interface is shown in FIG. 11A. Serial data is input from the corresponding pair of codecs through input pins ASDI and ASDI2 and a corresponding set of shift/data formatters 1101 and 1102. (If only one codec is being used, the second pin may be used for extended GPIO functionality.) The two external codecs receive data through a single data output Port ASDO supported by shift/data formatter 1103.

The serial interface is controlled by a set of registers in register files 1104. Register file 1104 includes a set of common registers for generally setting up the AC-link as well as AC-link registers for setting up the configuration of each specific link to each of the two external codecs.

Interface 120 employs a double buffer mechanism for transferring data between AC97 link and system memory. This arrangement includes four 32-bit wide receive buffers 1105 and four 32-bit wide transmit buffers 1106, with the transmit buffers providing paths from system memory to the AC-link and the receive buffers providing paths from the AC-link to system memory. Each transmit and receive buffer is associated with a slot map register for controlling the exchange of data through the specified AC-link slots, as well as for defining the data format conversion to be used with the corresponding payload data. These exchanges are controlled either by host polling or through the DMA controller. In the case of polling, the host polls associated buffer status registers to determine whether the given buffers need to be filled or to be emptied through writes and reads. In the case of DMA operations, buffer status bits in register file 1104 are routed to DMA controller 105, which then handles any AC-link data requests, following initialization by system 100.

Shift/data formatters 1101–1103, under the control of port timing and control logic 1107 and registers 1104 allow interface 120 to support multiple data formats. For example, monaural data can be handled as either 16-bit or 20-bit samples, which are right justified in memory. For 16-bit samples, a four bit left shift is performed while routing to the AC-link slot, and for 20-bit samples, the 20 LSBs of each 32-bit word are passed to the AC-link slot. (In the preferred embodiment, data are stored in system memory as 32-bit words.) For stereo data, 16-bit left and right samples can be packed into a 32-bit word and processed as a single unit. These left and right samples are unpacked and then left-shifted to fill 20-bit AC-link slot data fields. Since 20-bit data can not be packed into 32-bit words, stereo 20-bit data is essentially processed as two separate data streams.

AC97 interface 120 in the preferred embodiment, operates across an AC-link running at a fixed frame rate of 48 KHz. When data is being received by interface 120, slot valid tag bits received in slot 0 indicate which of the following slots contain valid samples. Thereafter, only samples from slots with valid slot bits are accepted into the receive buffers. Therefore by dynamically changing the valid slot bits the sample frequency of the data input from the AC-link can be dynamically controlled. During data transfers to the external codecs, an on-demand scheme is typically employed. Generally, software running on processor core 101 sets output slot valid bits which indicate active slots and then, using a fixed sample rate, the serial port of interface 120 transfers samples from the transmit buffer to the valid slot on the link at the 48 KHz rate.

Figure 11B:
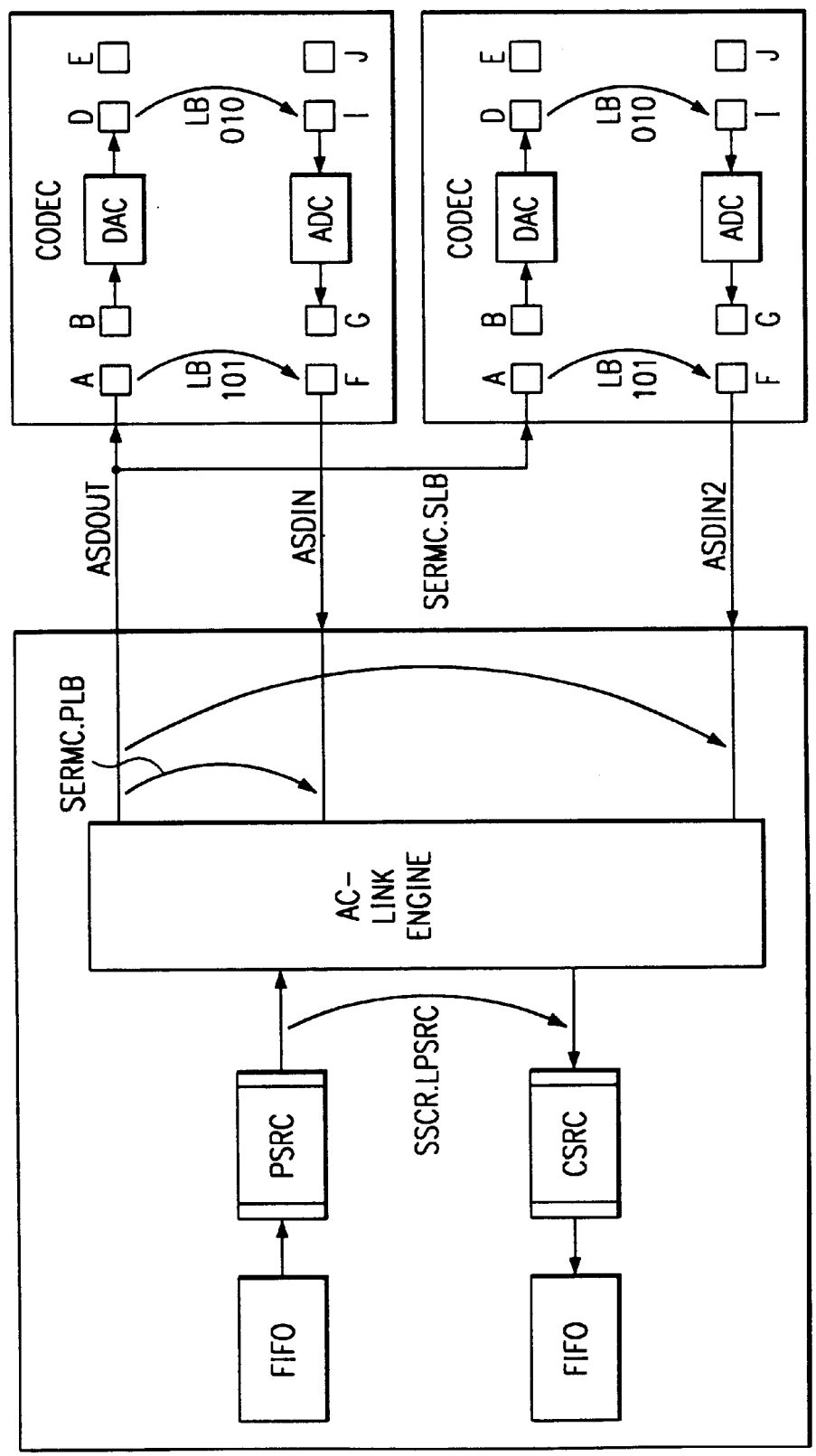
FIG. 11B illustrates the centric loop backs where the loop back begins at the transmit buffers and ends at the received buffers.
Figure 11C:
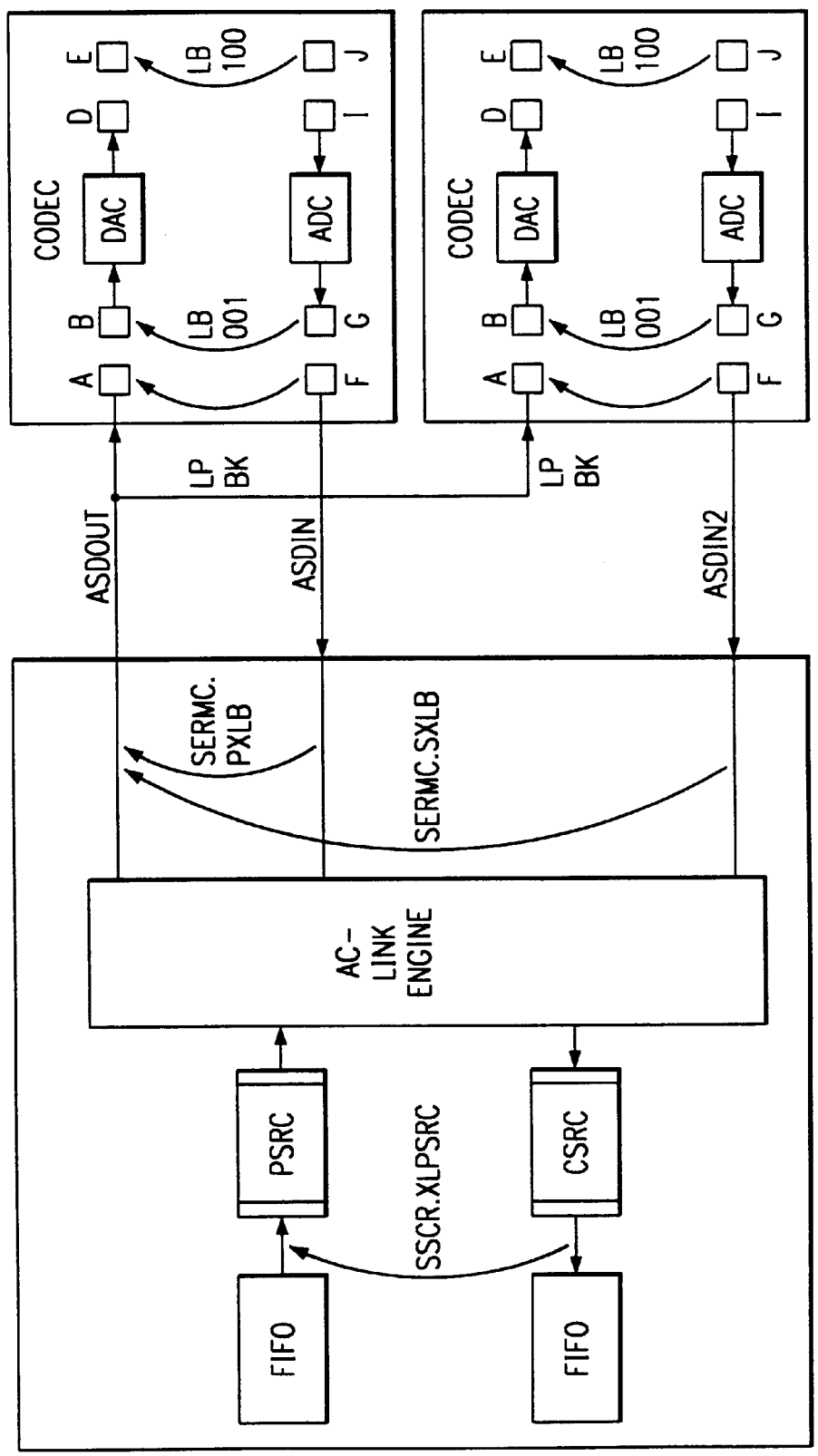
FIG. 11C illustrates an exemplary analogs-centric loops back where the loop back starts and ends in the analog domain.

Multiplexers 1108–1110 support and enhance the loop back modes available on AC97 compliant codecs. Bus-centric loop backs are illustrated in FIG. 11B where the loop back begins at the transmit buffers 1106 and ends at the received buffers 1105. Exemplary analog-centric loop backs are shown in FIG. 11C where the loop back starts and ends in the analog domain. Consequently, these loop backs generally require external analog test equipment such as an Audio Precision System 2.

In accordance with the I²S specification (Philips Semiconductors), the I²S interface of block 120 supports a digital audio link. This protocol operates on a 3-wire interface which includes a serial clock line, serial data line, and word select line. The system 100 I²S interface includes both a specification compliant transmitter and receiver. This interface can be configured as either the master or slave in the context of the I2S bus specification. When configures as the I1S master, the interface generates the serial clock and word select signal and outputs them on the ABITCLK and SYNC pins respectively. Additionally, when configured as the master, the ARSTn pin is driven with a master clock signal, typically 256 times the word select rate. When configured as the I2S slave, the serial clock and word select signal are received as inputs on the ABITCLK and ASYNC pins respectively. The master clock is not used in a slave configuration. For either master or slave configurations the serial data is treated the same. Output data is driven onto the ASD0 pin and input data is received on the ASD1 pint.

For I2S operation, the ABITCLK pin is used to output the serial clock SCLK, the ASYNC pin for the LRCLK, and the ARSTn pin for the master clock MCLK when interface 120 is operating as the I2S master (the MCLK is not used when interface 120 is operating as the I2S slave).

In embodiments employing an ARM920T processor core, a set of general purpose input/output ports 121 are provided. GPIO block 121 includes 16 individually programmable I/O pins arranged as two 8-bit bidirectional ports. For each of the two ports, a data direction register and a data register are provided. The data direction registers allow each individual pin to be configured as either an input or output. GPIO block further includes an interface to peripheral bus which generates read and write control signals necessary to access the data.

In addition to the standard GPIO functions, GPIO block 121 in system 100 includes enhanced capability. It particular, interrupts have been added to each of the GPIO pins, along with registers for enabling and masking the interrupts, status and test control registers.

SPI interface (Synchronous Serial Interface) 122 can be used to communicate with an external analog to digital converter and/or digitizer. In the illustrated embodiment two SPI controllers (SPI0 and SPI1) are provided which support the Motorola SPI format, the Texas Instruments SPI format, and National Semiconductor serial formats. The SPI0 Port can be multiplexed with the AC97 pins or with the key matrix row pins.

System 100 includes three of universal asynchronous receive-transmit (UART) interfaces 123–125. These asynchronous ports can be used, for example, to communicate with external RS-232 transceivers. Generally, UARTs 123–125 operate similar to that of industry standard 16C550 UART devices. UARTs 123–125 are preferably slaves off of peripheral bus 103 and operate at baud rates up to 115.2 Kbits/sec. In the preferred embodiment, UARTs 123–125 are based on ARM PrimeCall UART designs available from ARM Ltd., Cambridge, England.

In addition to conventional receive and transmit ports, UART 123 (UART1) can also receive the three modem control signals CTS (Clear to Send), DSR (Data Set Ready), and DCD (Data Carrier Detect) (external modem hardware generates the associated modem control signal RTSn, DTRn, and RI). Additionally, UART1 includes an HDLC transmitter which performs framing and bit stuffing in accordance with the HDLC protocol. An HDLC receiver in UART1 performs framing, address matching, code substitution, CRC checking, and optionally, transmission of a CRC sum at end of packet.

UART2 (124) additionally includes an IrDA (Infrared Data Association) SIR protocol processing stage for driving an infrared light emitting diode (LED) and receiving data from a photodiode.

UART3 (123) is similar to UART1 except the modem control port is hardwired to a passive state.

Real time clock (RTC) with Trim 126 allows software controlled digital compensation of a 32.768 KHz crystal oscillator. Advantageously, software controlled digital compensation allows the oscillator to be electronically calibrated by automatic test equipment during manufacture and then adjusted in the field. Specifically, an oscillator compensation value, including a counter preload value to act as an integer divider, and a value representing the number of 32.768 KHz clock periods to be deleted on a periodic interval, is determined in manufacturing by adjusting the frequency of the 1 Hz clock. The compensation value is then stored in flash memory When system 100 is first enabled in the field, the compensation value is retrieved from memory and used to control the oscillator frequency.

Watchdog timer circuitry 129 is based on a 7-bit counter, the most significant bit of which is used to trigger the generation of a Watchdog Reset signal. In the preferred embodiment, this signal is generated as follows: Time-out/Duration=64/Watchdog Clk frequency. For a 400 Hz CLK, time-out and reset pulse duration are 64/200=160 milliseconds To keep the reset pulse from occurring, software must "kick the dog" on a periodic basis by resetting the counter and preventing the MSB from activating. The counter is reset in the preferred embodiment by writing an Opcode into a corresponding watchdog control register. In the preferred embodiment, the watchdog must be "kicked" at least 2 clock periods faster than the time-out calculation would indicate to allow for clock synchronization and to account for handshaking delays.

Watchdog time 129 can be selectively enabled and disabled in software by writing the appropriate Opcode into the watchdog control register. Additionally, this block can be hardware disabled using an external pull down resistor at the CSn[1]. Moreover, the watchdog timer register can be read to determine the cause of a reset. In particular, the bits in this register indicate whether the reset condition was the result of a user reset, a three key reset, a power on reset, or a watchdog time-out.

Figure 12:
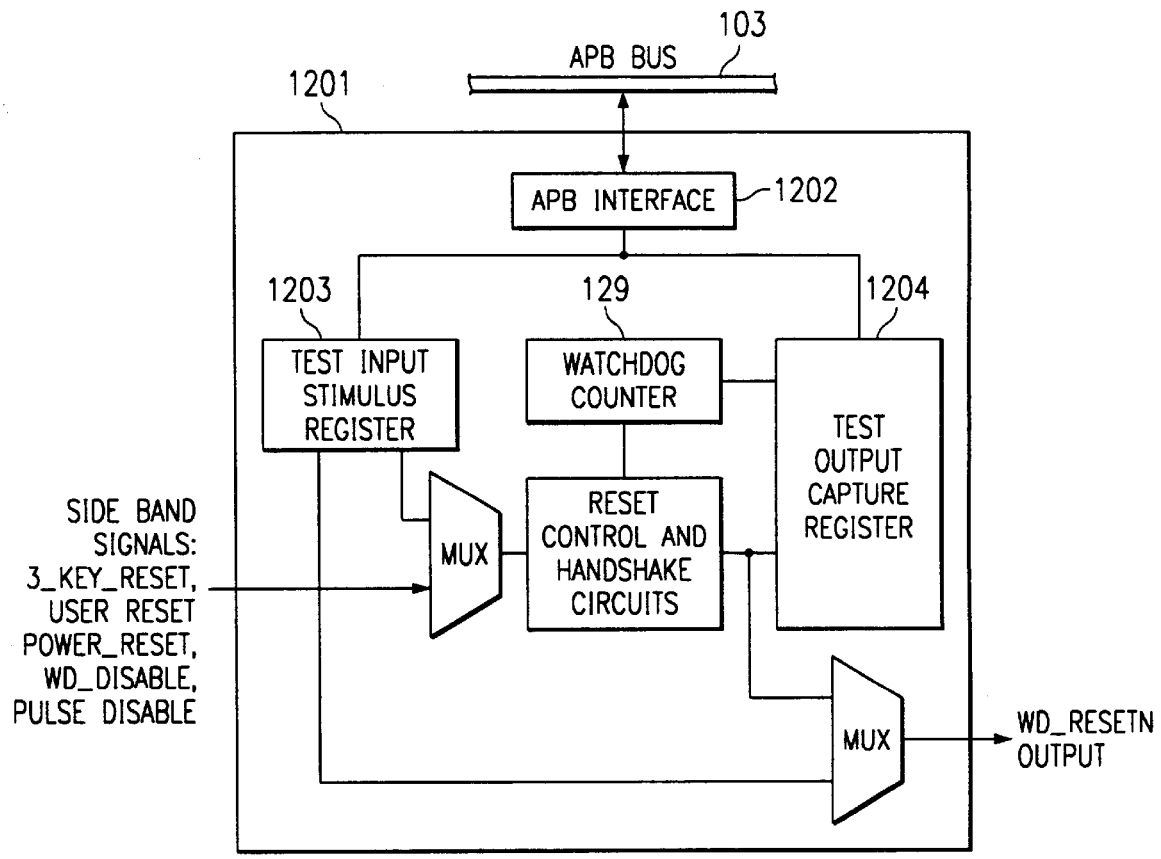
FIG. 12 illustrates the Test Interface Controller (TIC) harness emphasizing the connections to the watchdog timer.

Testing of the watchdog timer 129 is coordinated via the Test Interface Controller (TIC) harness 1201 shown in FIG. 12. Registers 1201 in the APB register interface communicate with the TIC via peripheral bus 103. Specifically, the watchdog control register is used to control the input multiplexer, reset status, and clock mode and the watchdog test clock enable register is used for generating clock enables in the register clocked test mode. Side band input signal values are controlled by the watchdog test input stimulus register 1203. The Watchdog Reset output signal and the watchdog counter value can be observed at the watchdog test output capture register 1204.

System control block 130 generally control such central functions as hardware test mode, clock control, power management and system configuration management.

In addition to the JTAG testing described above, hardware test modes are available to provide entry into an alternate system boot routine and support specialized testing by automatic test equipment. Among these specialized tests, are tests of the oscillator and PLLs, tests by test interface controller (TIC) of system internal functions through high speed bus 102, scan testing using Automatic Test Pattern Generation, observation testing which allows internal signals to be monitored through the Row and Column pins to keyboard interface 118, drive all float, drive all high and drive all low tests which cause all output capable pins to enter either a floating, logic high or logic low state, and a XOR tree test allowing all input capable pins to be connected to an XOR tree.

System 100 includes two phase-locked loops (PLLs) 131 which generate the clocks and similar timing signals necessary during device operation. PLLs 131 are configured with registers within system control clock 130. Among other things the multiply rate, the value which determines the number by which the reference clock is multiplied to produce the PLL output clock, is independently set for each PLL. Additionally, the output clock can be sent to an output pin for observation or a given PLL can be bypassed completely such that the output clock becomes the reference clock.

For a more complete description of the preferred clock generation circuitry used in system 100, reference is now made to copending, coassigned patent application Ser. No. 09/590,596.

IDE interface 132 operates from high speed bus 102 and supports ATAPI compliant connections to both external master and slave IDE devices, up to PIO Mode 4, Multiword DMA Mode 2 (MDMA), and the Ultra DMA (UDMA) mode 3. In the preferred embodiment, IDE interface 132 uses 16-bit transfers, even during non-data transfers in the PIO mode when only 8 bits are valid.

System 100 connects with an external ATAPI device through a 28-pin port, one or more of these pins shared with the General Purpose I/O port (GPIO). A brief description of the ATAPI port is provided in TABLE 6. Preferably, IDE Interface 132 operates asynchronously to the IDE, with all signals synchronized to the high speed bus clock (HCLK).

TABLE 6

| IDE Pin | No. Pins | Description |
| --- | --- | --- |
| CS0_n | 1 | chip select for registers with base address 1f0h |
| CS1_n | 1 | chip select for registers with base address 3f0h |
| DA[2:0] | 3 | 3-bit binary encoded address |
| DIOR_n/ HDMARDY_n/ HSTROBE | 1 | strobe signal to read device regs or data port/ flow control signal for Ultra DMA data-in burst/ flow control signal for Ultra DMA data-out burst |
| DIOW_n/ STOP | 1 | strobe signal to write device regs or data port/ terminates an Ultra DMA burst |
| DMAKC_n | 1 | DMA acknowledge to DMARQ to initiate DMA transfers |
| DASP_n | 1 | signal to indicate that a device is active, or that Device 1 is present |
| DMARQ | 1 | DMA request for DMA to and from the controller |
| INTRQ | 1 | device interrupt |
| IORDY/ DDMARDY_n/ DSTROBE | 1 | negate to extend the host transfer cycle of any host read or write access/ flow control signal for Ultra DMA data-out burst/ flow control for Ultra DMA data-in burst |
| IOCS16_n | 1 | device indicates it supports 16-bit I/O bus cycles |
| PDIAG_n/ CBLID_n | 1 | asserted by device 1 to indicate to device 0 that it has finished diagnostic/ cable assembly type identifier |
| DD[15:0] | 16 | 16-bit interface between controller and device |

In the PIO mode, a Pin Interface Unit handles all operations. An IDE host uses the PIO mode for non-data and data transfers in either direction.

For the DMA modes, data transfers are preferably made through one of the DMACRC controllers discussed above with respects to DMA engine 105. Moreover, both the MDMA and UDMA modes are set-up by the host using PIO operations. Generally, the DMACRC controller performs a DMA data transfer by: (i) requesting the AHE bus; (ii) reading the source data into a local buffer; and (iii) requests a write to the destination via high speed bus 102. For host read operation, the DMA controller attempts to keep the input read buffer empty, while for a host write, it attempts to keep the write buffer half full. Typical data transfers are made to system dynamic memory and therefore are effectuated through the SDRAM controller.

During MDMA operations, a pair of DataIn and DataOut buffers are used for the read and write operations, respectively. An MDMA state machine sets-up the necessary signalling, including sending the appropriate request to the DMA controller. In the preferred embodiment, all data transfers are 32 bits wide and are performed using two 16-bit wide IDE interface data transfers.

During an MDMA write, the DMACRC writes data to DataOut buffer and then the state machine toggles the write (DIOW) strobe and drives the data on to the data (DD) bus. During an MDMA read, the host fills the DATAIn buffer by latching data off the data bus with the read strobe (DIOR), and then state machine sends a request to the DMACRC controller. The read completes when the DMACRC controller reads data out of the DataIn buffer.

UDMA transfers are executed through a pair of 32-bit wide, 12-entry deep buffers, namely, an input read buffer and an output write buffer. In the preferred embodiment, these are circular buffers set-up in memory using head and tail pointers. A UDMA state machine controls the signalling, including the generation of requests to the DMA controller.

During a UDMA write, a DMA request is sent to fill 4 32-bit entries in the write buffer, when the number of write buffer entries falls below 4. The UDMA state machine controls the handshaking with the external host device. For flow control, IDE interface 132 temporarily de-asserts the control signal DDMARDY and the host controls the toggling of the strobe HSTROBE.

For a read, when the read buffer has 4 or more entries filled, a DMA request is made to the DMACRC. Flow control in this case is controlled by the host by temporarily deasserting DDMARDY and by Interface by controlling the toggling of the signal DSTROBE. The handshaking is again controlled by the UDMA state machine.

In the preferred embodiment, data transfers are performed using a "ping-pong" scheme, and a "grace" buffer area is provided to account for instances where the handshakes for pausing come at a rate lower than that at which data are transferred.

The UDMA state machine also handles transfer terminations, which can be initiated by either system 100 or the associated ATAPI device coupled to system 100. Whichever device terminates the transaction, the other device honors the termination request and stops the transfer. Additionally, for both reads and writes, a 16-bit CRC result is sent to the host for checking. The CRC registers are preloaded, as described above, with a value of 0×4ABA at the beginning of the transfer.

In the preferred embodiment, all blocks or subsystems 101–132 of system 100 are fabricated on a single integrated circuit chip. This can be accomplished for example using a 0.25 μm, four layer metal process, although other processes known in the art can also be used. In the illustrated embodiment, processor core 101 operates from a 2.5V nominal supply, although this may be reduced in alternate embodiments. The peripherals in the illustrated embodiment operate from a 3.3V supply. In this embodiment, the nominal clock speed for processor core 101 is 200 MHz.

Figure 13A:
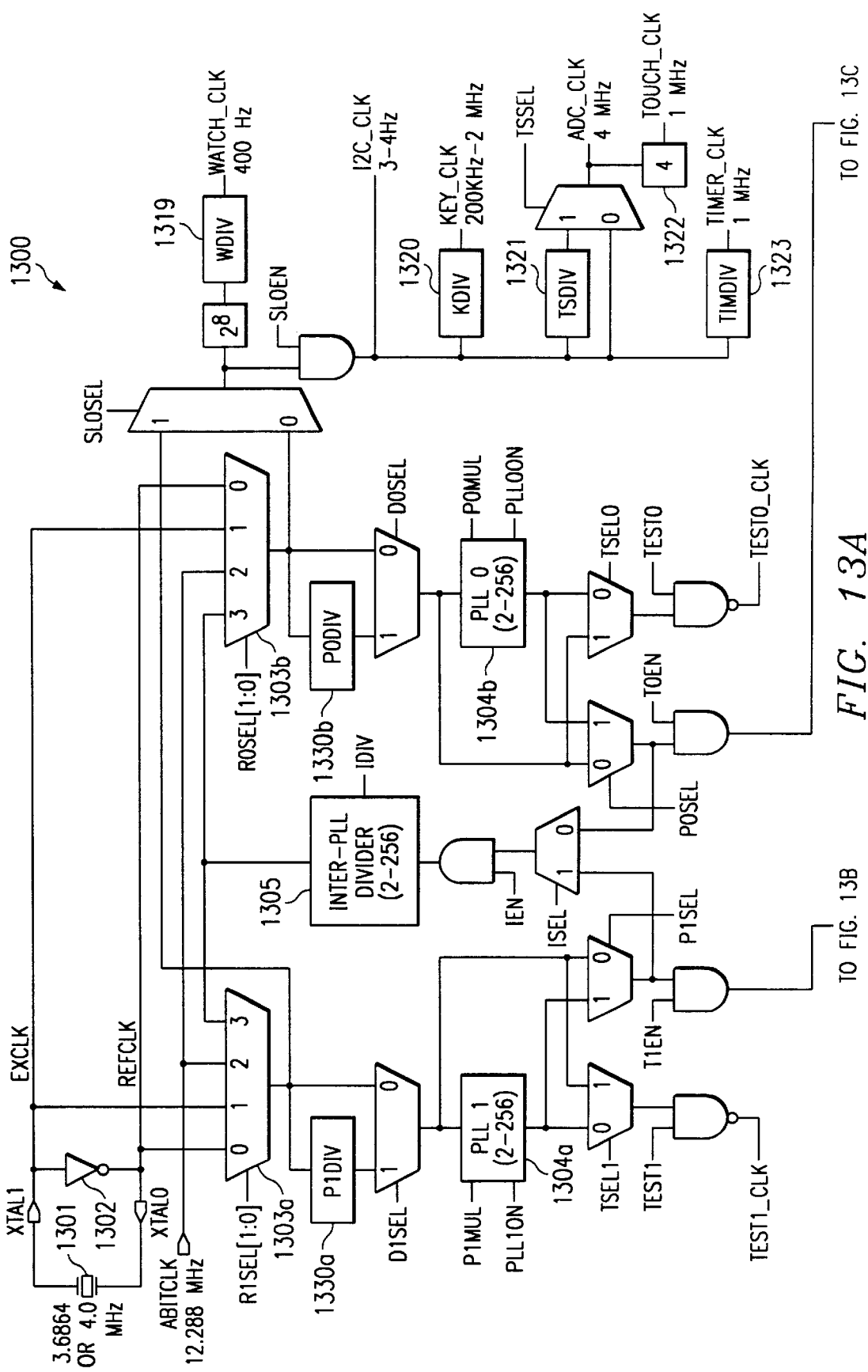
FIG. 13 is a functional block diagram of the clock generator preferably used to drive the system-on-a-chip from a single crystal.
Figure 13B:
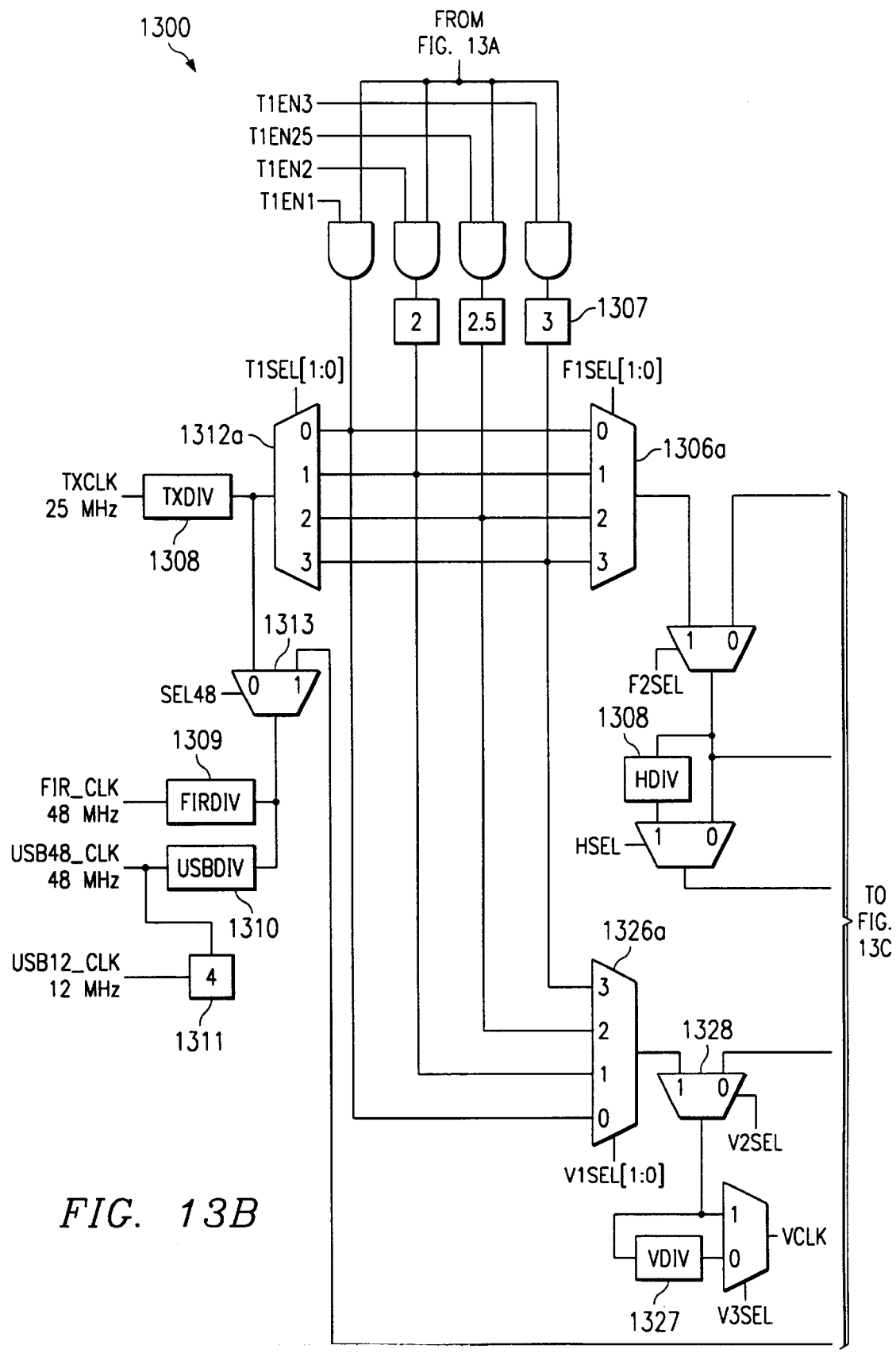
Figure 13C:
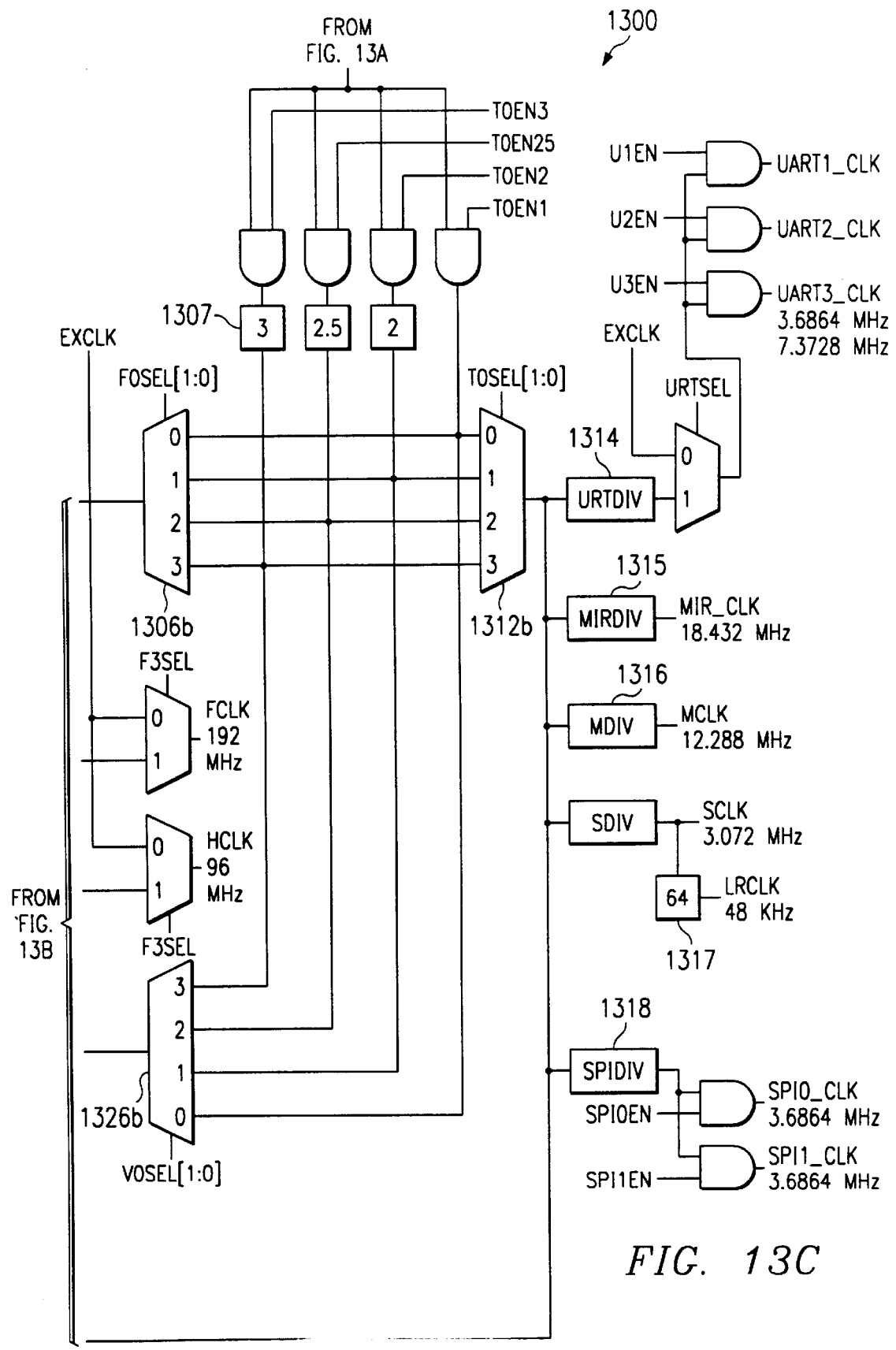

FIG. 13 is a functional block diagram of a preferred clock generator 1300 used in system 100. Advantageously, all of the clocks required for the operation of system 100 can be generated from a single, external crystal 1301. In the illustrated embodiment, crystal 1301 can be either a 3.6864 or 4.0 MHz crystal, although the principles of the present invention are not restricted to these particular crystals.

Crystal 1301 operates in conjunction with conventional on-chip oscillator circuitry 1302. The time varying signal generated by crystal 1301 and as oscillator circuitry 1302 is switched by multiplexers 1303a and 1303b to one of a pair of phase locked loops (PLL) 1304a or 1304b. Since the circuit being described here is symmetric, either of these phase locked loops can be selected as the first stage of the clock generation chain discussed below, although for clarity of this discussion, it will be assumed that PLL 1303b (PLL0) receives the signal generated by crystal oscillator 1301/1302. Also for discussion purposes, an embodiment using a 3.6864 MHz crystal will be considered first.

With a 3.6864 MHz crystal, PLL 1304b is programmed to multiply the input frequency of 3.6864 MHz by a factor of 100 to produce an output frequency of 368.64 MHz. This signal will be used, as discussed below, as a base frequency to generate the MIR_CLK, MCLK, SCLK, LRCLK and the SPI and UART clocks.

The 368.64 MHz clock is also switched to inter-PLL divider 1305 where, in the example, it is divided by a factor of 96 to generate a 3.84 MHz clock. The 3.84 MHz can be used as a base frequency to directly generate the "slow clocks" (WATCH_CLK, I2C_CLK, KEY_CLK, ADC_CLK, TOUCH_CLK and TIMER_CLK). In turn, the output of divider 1305 is switched by multiplexer 1303a to the second PLL (PLL1) 1304a. PLL 1304a multiplies the 3.84 MHz signal from divider 1305 by a factor of 100 to generate a 384 MHz base frequency. This 384 MHz signal is used to generate the microprocessor fast clock (FCLK) the bus clock HCLK, FIR_CLK and the 48 and 12 MHz Universal Serial Bus (USB) clocks.

In the illustrated embodiment of system 100, there are no frequency requirements imposed on the FCLK and HCLK clock signals. As a result, these two clocks can be generated by dividing either of the 384 or 368.64 MHz signals by 2, 2.5 or 3 using dividers 1307 or by taking the 384 and or 368.68 MHz signals directly without frequency division. Advantageously, the 8 possible FCLK frequencies available from the 368.64 and 384 MHz signals allow the performance of processor 101 to be optimized through FCLK frequency selection.

In the present example, an FCLK of 192 MHz is selected by multiplexer 1306a from the output of the corresponding divide-by-2 divider 1307a. A 96 MHz HCLK is then generated by dividing the FCLK by 2 in divider (HDIV) 1308. It should be noted that additional multiplexing is provided to allow the FCLK and HCLK signals to be selected from an external source (EXCLK).

TABLE 7

| CLOCK NAME | FREQ. | BASE FREQ. | DIVISOR |
|---|---|---|---|
| FCLK | 192 MHz | 384 MHz | 2 |
| HCLK | 96 MHz | 384 MHz | 4 |
| TXCLK | 25 MHz | 384 MHz | 15.5 |

TABLE 7-continued

| CLOCK NAME | FREQ. | BASE FREQ. | DIVISOR |
|---|---|---|---|
| FIR_CLK | 48 MHz | 384 MHZ | 8 |
| USB48_CLK | 48 MHz | 384 MHz | 8 |
| USB12_CLK | 12 MHz | 384 MHz | 32 |

To generate clocks TXCLK, FIR_CLK, USB48_CLK and USB12_CLK, are similarly generated from the 384 MHz clock using dividers 1307 and/or dividers 1308-13, as selected by multiplexers 1312a and 1312b and 1313. TABLE 7 describes a preferred set of frequencies for these clock signals as well as the divisor required to generate the indicated frequencies.

TABLE 8

| CLOCK NAME | FREQ. | BASE FREQ. | DIVISOR |
|---|---|---|---|
| MIR_CLK | 18.432 MHz | 368.64 MHz | 20 |
| MCLK | 12.288 MHz | 368.64 MHz | 30 |
| SCLK | 3.072 MHz | 368.64 MHz | 120 |
| LRCLK | 48 MHz | 368.64 MHz | SCLK/64 |
| SPI0_CLK | 3.6864 MHz | 368.64 MHz | 100 |
| SPI1_CLK | 3.6864 MHz | 368.64 MHz | 100 |
| UART1_CLK | 3.6864/ 7.3728 MHz | 368.64 MHz | 100/50 |
| UART2_CLK | 3.6864/ 7.3728 MHz | 368.64 MHz | 100/50 |
| UART3_CLK | 3.6864/ 7.3728 MHz | 368.64 MHz | 100/50 |

Clock signals MIR_CLK, MCLK, SCLK, LRCLK, SPIx_CLK and UARTX CLK are derived from the 3.6864 MHz base frequency output from the first PLL stage in the PLL-interPLL divider chain, in this case PLL0 1303b. In addition to frequency dividers 1307, a second set of frequency dividers 1314–1318 provided to derive the requisite clock frequencies. In the preferred embodiment, these frequency dividers are programmable, although in alternate embodiments, fixed dividers can be used. An exemplary set of clock frequencies and the divisor applied by the selected dividers 1306 and/or 1310 are provided in TABLE 8. Dividers 1314–1318 are fed from multiplexer 1312b.

Frequency divider circuits 1319–1323 are used to generate the "slow" clock signals WATCH_CLK, I2C_CLK, KEY_CLK, ADC_CLK, TOUCH_CLK and TIMER_CLK, from the output of inter-Pll divider 1305. Muliplexers 1324–1325 allow frequency dividers 1319a–1323e to be driven directly from crystal oscillator 1302 at the given crystal frequency of either 3.6864 or 4.0 MHz or from the output of inter-PLL divider at 3.84 MHz. Representative frequencies for these

TABLE 9

| CLOCK NAME | APPROX. FREQ. | BASE FREQ. | DIVISOR |
|---|---|---|---|
| WATCH_CLK | 400 Hz | 3.84 MHz | 256 and 37.5 |
| I2C_CLK | 3–4 MHz | 3.84 MHz | |
| KEY_CLK | 200 KHz– 2 MHz | 3.84 MHz | 19-2 |
| ADC_CLK | 4 MHz | 3.84 MHz | 1 |
| TOUCH_CLK | 1 MHz | 3.84 MHz | 4 |
| TIMER_CLK | 1 MHz | 3.84 MHz | 4 |

Multiplexers 1326a and 1326b and multiplexor 1328 are used to select video clock signal VCLK. A divider DVID 1327 is also provided for further dividing down the frequency at the selected signal.

It should be noted that in the normal running mode, a TXCLK signal of exactly 25 MHz cannot be generated without sacrificing the tolerance on one or more of the other clocks being generated. Notwithstanding, the design of clock generator 1300 is flexible enough to generate a 25 MHz TXCLK within its tolerance. In this case, the slow clocks are very flexible and therefore can tolerate variation from their nominal frequency values, although some accuracy is sacrificed in "Trunk0" clocks such as MIR_CLK, UART_CLK, LRCLK, MCLK and SCLK. In one such mode, one PLL 1303 is used to generate a base frequency which is a multiple of 12.5 MHz from a 4.0 MHz crystal frequency, for example 400 MHz, from which the 25 MHz TXCLK is derived. The other PLL 1303 is then used to generate a 384 MHz clock by multiplying the 4.0 MHz frequency by 96. The 384 MHz clock is used to derive the processor and USB clocks, as well as the Trunk0 clocks output from dividers 1314–1318 (i.e UARTx_CLK, MIR_CLK, MCLK, SCLK, LRCLK, amd SPIx_CLK).

When a 4.0 MHz crystal is used, the same base frequencies of 3.84, 384 and 368.64 MHz are still generated, only the multiplication factor used by PLLs 1304 and the divisor used by inter-PLL 1305 divider are reversed from the case of the 3.6864 MHz oscillator. Specifically, the two PLLs now perform a frequency multiplication by 96 and the inter-PLL performs a divide by 100. In this configuration, the output of the first PLL 1304 in the chain is still at 384 MHz, the output of the inter-PLL divider 1304 still at 3.84 MHz and the output of the second divider in the chain is still 368.64 MHz. This is made possible by the discovery that the ratio of 3.6864 MHz to 4.0 MHz is equal to the ratio of $24^2$ to $25^2$.

It should be recognized that the multiply/divide values used in PLLs 1304 and inter-PLL divider 1305 can be any multiple of 25/24, in the case of a 3.6864 MHz crystal, or 24/25, in the case of a 4.0 MHz crystal. In the examples set forth above, the multiply/divide ratios 100/96 and 96/100 were used, but many other values are possible as long as the maximum output frequency of PLLs 1304 is not exceeded (in the illustrate embodiment, approximately 450 MHz). Some exemplary multiply/divide values for the 4.0 MHz crystal include the sequence 24/25, 48/50, 72/75, 96/100, 120/125, 144/150, and so on, and for the 3.6864 MHz, 25/24, 50/48, 100/96, 125/120, 150/144, and so on.

By using higher values for multiply and divide, along with the use of predividers 1330, the PLL output frequencies can be kept below their maximum values while at the same time providing a very large number of frequency options for the FCLK and HCLK clocks. In particular, predividers 1303 are used to divide down the crystal frequency prior to input into the corresponding PLL 1304. Thereafter, the 24/25 or 25/24 multiply/divide ratio is applied as was described above.

As long as the multiply/divide ratio is a multiple of 25/24 or 24/25, the accuracy of the other clock frequencies can be maintained by compensation in the corresponding programmable dividers. This allows a large number of "trunk" clock frequencies other than 368.64 and 384 to be generated. So long as the trunk clocks are integer multiples of the system clocks being generated, accuracy can be maintained. For example, the Trunk0 clock from PLL0 simply needs to be a multiple of 18.432 MHz, the fastest clock being generated. The Trunk1 clock frequency from PLL1 must simply be a multiple of 48 MHz.

Finally, it should be recognized that the present principles are not limited to factors which are a multiple of 24/25 (25/24) and crystals with oscillating frequencies in the ration 242/252. In general, other integer multiply and divide factors, A and B, can be selected, along with crystals having an oscillating frequency ratio of $A^2/B^2$, to achieve substantially the same results.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A clock generator for generating a plurality of clock signals differing in frequency from a base signal having a predetermined frequency comprising:
   a first phase-locked loop (PLL) sequentially and changeably selected as a first PLL stage among a set of symmetrically selectable phase-locked loops for multiplying said frequency of said base signal by a first factor to generate a first signal having a first selected frequency;
   a divider selectively coupled to said first phase locked-loop for dividing said first frequency of said first signal by a second factor to generate a second signal having a second selected frequency;
   a second phase-locked loop sequentially and changeably selected as a second PLL stage among said set of symmetrically selectable phase-locked loops for multiplying said second frequency of said second signal by said first factor to generate a third signal having a third selected frequency; and
   a plurality of dividers for selectively dividing said first and third frequencies of said first and third signals to generate said plurality of clock signals.

2. The clock generator of claim 1 wherein said first factor is an integer value A and said second factor is an integer value B, and said base frequency proportional with a ratio of $A^2/B^2$.

3. The clock generator of claim 2 wherein said ratio is equivalent to the ratio $25^2/24^2$.

4. The clock generator of claim 1 wherein a selected one of said plurality of clock signals comprises a Universal Serial Bus clock.

5. The clock generator of claim 1 wherein at least one of said plurality of clock signals is selected from the group comprising UART and SPI clocks.

6. The clock generator of claim 1 wherein a third selected one of said plurality of clock signal generated by dividing said second frequency of said second signal is selected from the group comprising timer, keyboard, I2C and analog-to-digital converter clocks.

7. The clock generator of claim 1, wherein alternately said second PLL is sequentially selected as said first PLL stage and said first PLL is sequentially selected as said second PLL stage.

8. The clock generator of claim 7, wherein said first factor is an integer value A and said second factor is an integer value B, and said base frequency is proportional with a ratio of $B^2/A^2$.

9. Clock generation circuitry comprising:
multiplexer circuitry for selecting between ones of a set of symmetric multipliers operable to divide a frequency of a first signal;
a first frequency multiplier selected by the multiplexer circuitry from the set of symmetric multipliers as a first multiplier stage of a sequence of multipliers for selectively multiplying the frequency of the first signal by a predetermined factor to obtain a second signal having a frequency of a preselected multiple of a first set of clock signals;
a divider for selectively dividing a frequency of the second signal by a second factor to obtain a third signal of a selected frequency; and
a second frequency multiplier selected by the multiplexer circuitry from the set of symmetric multipliers as a second multiplier stage of a sequence of multipliers for selectively multiplying the frequency of the third signal by a third factor to obtain the fourth signal of a selected frequency, the second and third factors selected to produce a fourth signal having a frequency of a preselected multiple of a second set of clock signals.

10. The clock generation circuitry of claim 9 wherein said first and third factors are equal.

11. The clock generation circuitry of claim 9 wherein said first and second frequency multipliers comprise first and second phase locked-loops.

12. The circuitry of claim 9 wherein the frequency of the first signal is 3.6864 MHz and a ratio of said first and second factors is a selected multiple of 25/24.

13. The circuitry of claim 9 wherein the frequency of the first signal is 4.0 MHz and a ratio of said first and second factors is a selected multiple of 24/25.

14. The circuitry of claim 9 wherein said first signal has a frequency proportionate to a ratio of $25^2/24^2$.

15. The circuitry of claim 9 and further comprising a set dividers for generating said first set of clock signals from said second signal.

16. The circuitry of claim 9 and further comprising a set of dividers for generating said second set of clocks from said fourth signal.

17. A method of generating a plurality of clocks of different frequencies using a single base frequency comprising the steps of:
selecting a first phase-locked loop from a set of symmetrical phase-locked loops as a first phase-locked loop of a sequence of phase-locked loops;
multiplying the frequency of the base signal with a first phase-locked loop by first factor to generate a second signal of a selected frequency of a multiple of a frequency of a first one of the clocks;
selectively dividing the frequency of the second signal by a second factor to generate a third signal of a selected frequency;
selecting a second phase-locked loop from the set of symmetrical phase-locked loops as a second phase-locked loop of the sequence of phase-locked loops; and
multiplying the frequency of the third signal with a second phase-locked loop by a third factor to generate a fourth signal having a selected frequency of a multiple of a frequency of a second one of the clocks.

18. The method of claim 17 wherein the first and third factors are equal.

19. The method of claim 17 wherein the base signal has a frequency of 3.6864 MHz and the first and second factors are in a ratio which is a multiple of 25/24.

20. The method of claim 17 wherein the base signal has a frequency of 4.0 MHz and the first and second factors have a ratio which is a multiple of 24/25.

21. The method of claim 17, wherein alternatively the second phase-locked loop is selected as the first phase-locked loop of the sequence and the first phase-locked loop is selected as the second of the sequence.

22. The method of claim 17, wherein the first factor is an integer value A and the second factor is an integer value B, and the base frequency is proportional with a ratio of $B^2/A^2$.

23. The method of claim 17, wherein the first factor is an integer value A and the second factor is an integer value B, and the base frequency is proportional with a ratio of $A^2/B^2$.

24. A system on a chip comprising:
a processor operating in response to a first clock of a selected frequency;
a first communications port coupled to said processor by a bus and operating in response to a second clock of a selected frequency;
a second communications port coupled to said processor by a bus and operating in response to a third clock of a selected frequency; and
a clock generator for generating said first, second and third clocks from a single base frequency comprising:
an oscillator for generating a first signal at the base frequency;
a first phase-locked loop of a set of symmetric phase-locked loops for multiplying the base frequency of the first signal by a first factor to generate a second signal having a frequency of a multiple of said frequency of at least one of said first, second and third clocks;
a divider for selectively dividing the frequency of the second signal by a second factor to generate a third signal of a selected frequency; and
second phase-locked loop of the set of symmetric phase-locked loops for multiplying the frequency of the third signal by a third factor to generate a fourth signal having a frequency of a multiple of said frequency of at least one of said first, second and third clocks.

25. The system of claim 24 wherein said base frequency is 3.684 MHz and a ratio between a selected one of said first and third factors and said second factor is 25/24.

26. The system of claim 25 wherein said frequency of said second signal is a multiple of said third clock and said frequency of said fourth signal is a multiple of said first clock.

27. The system of claim 24 wherein said base frequency is 4.0 MHz and a ratio between a selected one of said first and third factors and said second factor is 24/25.

28. The system of claim 27 wherein said frequency of said second signal is a multiple of said first clock and said frequency of said fourth signal is a multiple of said third clock.

29. The system of claim 24 further comprising circuitry for generating a third clock from said second signal for driving a selected circuit block forming a part of said system on a chip.

30. The system of claim 29 wherein said selected circuit block is selected from the group comprising a watchdog timer, a keyboard interface, a touchscreen interface and an I2C interface.

* * * * *

UNITED STATES PATENT AND TRADEMARK OFFICE
CERTIFICATE OF CORRECTION

PATENT NO. : 6,779,125 B1
DATED : August 17, 2004
INVENTOR(S) : Scott Haban

It is certified that error appears in the above-identified patent and that said Letters Patent is hereby corrected as shown below:

<u>Title page,</u>
Item [57], ABSTRACT,
Line 14, after "second set of" insert -- clock signals --.

<u>Column 4,</u>
Line 47, "state" should be -- tri-state --.

<u>Column 5,</u>
Line 33, after "follows" insert a period.

<u>Column 10,</u>
Line 28, "K" should be -- k --.

<u>Column 12,</u>
Line 18, "RXDEQ" should be -- RxDEQ --.

<u>Column 16,</u>
Line 46, "PcCard" should be -- PCCard --.

<u>Column 21,</u>
Table, line 3, beginning with "Bit 45", "Level GP10" should be -- Level GPI0 --.

<u>Column 27,</u>
Line 17, "pint" should be -- pin --.

<u>Column 28,</u>
Line 16, after "memory" insert a period.

<u>Column 30,</u>
Line 6, "AHE" should be -- AHB --.

<u>Column 32,</u>
Line 32, "UARTX CLK" should be -- UARTx_CLK --.
Line 51, after "frequencies for these" insert -- clock signals and the corresponding divisors are provided in TABLE 9. --.

UNITED STATES PATENT AND TRADEMARK OFFICE
CERTIFICATE OF CORRECTION

PATENT NO. : 6,779,125 B1
DATED : August 17, 2004
INVENTOR(S) : Scott Haban

It is certified that error appears in the above-identified patent and that said Letters Patent is hereby corrected as shown below:

Column 33,
Line 67, "242/252" should be -- $24^2/25^2$ --.

Signed and Sealed this

Twenty-eighth Day of December, 2004

JON W. DUDAS
*Director of the United States Patent and Trademark Office*